(12) United States Patent
Tsai et al.

(10) Patent No.: US 11,164,754 B2
(45) Date of Patent: Nov. 2, 2021

(54) FAN-OUT PACKAGES AND METHODS OF FORMING THE SAME

(71) Applicant: Taiwan Semiconductor Manufacturing Company, Ltd., Hsinchu (TW)

(72) Inventors: Po-Hao Tsai, Zhongli (TW); Ming-Chih Yew, Hsinchu (TW); Chia-Kuei Hsu, Hsinchu (TW); Shin-Puu Jeng, Hsinchu (TW); Po-Yao Chuang, Hsinchu (TW); Meng-Liang Lin, Hsinchu (TW); Shih-Ting Hung, Sanchong (TW); Po-Yao Lin, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 10 days.

(21) Appl. No.: 16/371,917

(22) Filed: Apr. 1, 2019

(65) Prior Publication Data
US 2020/0105544 A1     Apr. 2, 2020

Related U.S. Application Data

(60) Provisional application No. 62/738,918, filed on Sep. 28, 2018.

(51) Int. Cl.
*H01L 21/48* (2006.01)
*H01L 23/00* (2006.01)
(Continued)

(52) U.S. Cl.
CPC ........ *H01L 21/4853* (2013.01); *H01L 21/565* (2013.01); *H01L 23/49822* (2013.01);
(Continued)

(58) Field of Classification Search
CPC ......... H01L 24/81; H01L 24/73; H01L 24/83; H01L 24/16; H01L 24/32; H01L 24/13;
(Continued)

(56) References Cited

U.S. PATENT DOCUMENTS 8,361,842 B2   1/2013   Yu et al.
8,680,647 B2   3/2014   Yu et al.
(Continued)

FOREIGN PATENT DOCUMENTS

CN     102386113 A    3/2012
CN     202423279 U    9/2012
(Continued)

*Primary Examiner* — Marcos D. Pizarro
*Assistant Examiner* — Antonio B Grite
(74) *Attorney, Agent, or Firm* — Slater Matsil, LLP

(57) ABSTRACT

Embodiments include forming an interposer having reinforcing structures disposed in a core layer of the interposer. The interposer may be attached to a package device by electrical connectors. The reinforcing structures provide rigidity and thermal dissipation for the package device. Some embodiments may include an interposer with an opening in an upper core layer of the interposer to a recessed bond pad. Some embodiments may also use connectors between the interposer and the package device where a solder material connected to the interposer surrounds a metal pillar connected to the package device.

20 Claims, 63 Drawing Sheets

(51) Int. Cl.
*H01L 21/56* (2006.01)
*H01L 23/498* (2006.01)
*H01L 23/522* (2006.01)
*H01L 25/10* (2006.01)
*H01L 23/538* (2006.01)
*H01L 23/367* (2006.01)
*H01L 23/13* (2006.01)
*H01L 23/31* (2006.01)
*H01L 23/482* (2006.01)
*H01L 23/488* (2006.01)

(52) U.S. Cl.
CPC .......... *H01L 23/5226* (2013.01); *H01L 24/17* (2013.01); *H01L 24/73* (2013.01); *H01L 24/81* (2013.01); *H01L 24/83* (2013.01); *H01L 2224/02379* (2013.01); *H01L 2224/73153* (2013.01); *H01L 2224/81815* (2013.01)

(58) Field of Classification Search
CPC ............... H01L 24/17; H01L 23/49822; H01L 23/5226; H01L 2224/73253; H01L 2224/73153; H01L 2224/83193; H01L 2224/92225; H01L 2224/02379; H01L 21/485; H01L 23/481; H01L 23/522
See application file for complete search history.

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,802,504 B1 | 8/2014 | Hou et al. |
| 8,803,292 B2 | 8/2014 | Chen et al. |
| 8,803,306 B1 | 8/2014 | Yu et al. |
| 8,803,316 B2 | 8/2014 | Lin et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,496,189 B2 | 3/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 2011/0074027 A1 | 3/2011 | Kwon |
| 2011/0291288 A1 | 12/2011 | Wu et al. |
| 2012/0056329 A1 | 3/2012 | Pagaila et al. |
| 2012/0074579 A1 | 3/2012 | Su et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0077364 A1* | 3/2014 | Marimuthu ............. H01L 24/02 257/737 |
| 2014/0124937 A1* | 5/2014 | Wu .......................... H01L 23/31 257/772 |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0084170 A1 | 3/2015 | Im et al. |
| 2015/0206812 A1* | 7/2015 | Kim .................... H01L 21/4846 257/622 |
| 2015/0342046 A1* | 11/2015 | Kim ...................... H05K 1/183 361/761 |
| 2017/0154878 A1 | 6/2017 | Kim et al. |
| 2017/0271283 A1 | 9/2017 | Lee et al. |
| 2017/0297903 A1 | 10/2017 | Lin et al. |
| 2018/0211944 A1 | 7/2018 | Kim |
| 2019/0273044 A1 | 9/2019 | Fu et al. |
| 2020/0083164 A1* | 3/2020 | Marin ................. H01L 23/5228 |

FOREIGN PATENT DOCUMENTS

| | | |
|---|---|---|
| CN | 103681368 A | 3/2014 |
| CN | 103681397 A | 3/2014 |
| CN | 103811448 A | 5/2014 |
| CN | 105101636 A | 11/2015 |
| CN | 105934822 A | 9/2016 |
| CN | 106558574 A | 4/2017 |
| CN | 107195618 A | 9/2017 |
| KR | 20100092428 A | 8/2010 |
| KR | 20130109117 A | 10/2013 |
| KR | 20150033133 A | 4/2015 |
| KR | 20170061468 A | 6/2017 |
| KR | 20180076995 A | 7/2018 |
| TW | 201214626 A1 | 4/2012 |
| TW | 201539590 A | 10/2015 |
| TW | 201733058 A | 9/2017 |
| TW | 201834191 A | 9/2018 |
| WO | 2009045371 A2 | 4/2009 |

* cited by examiner

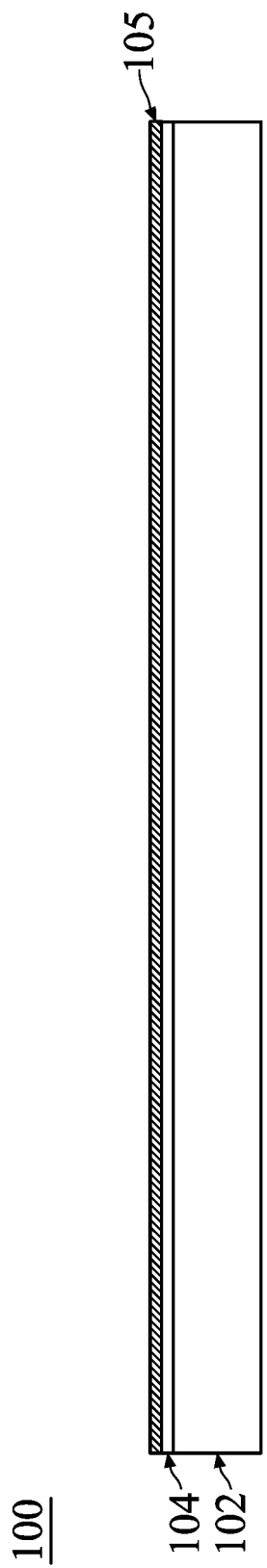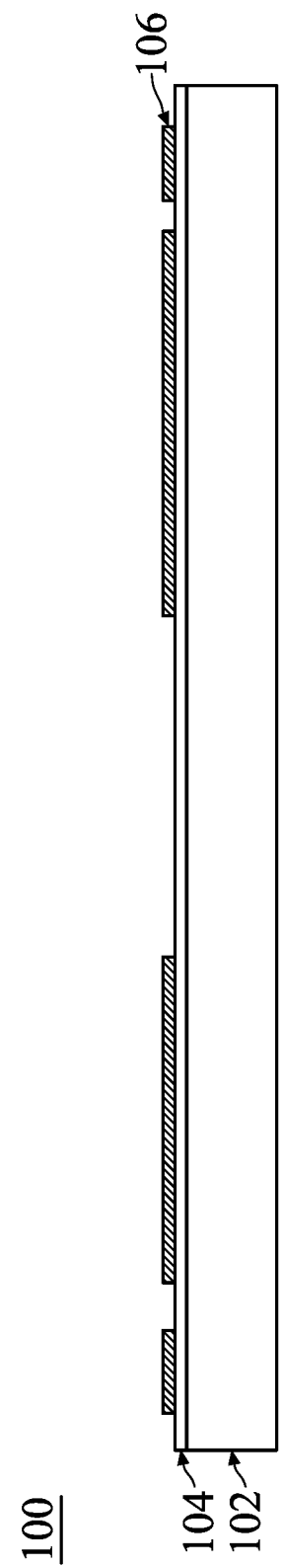

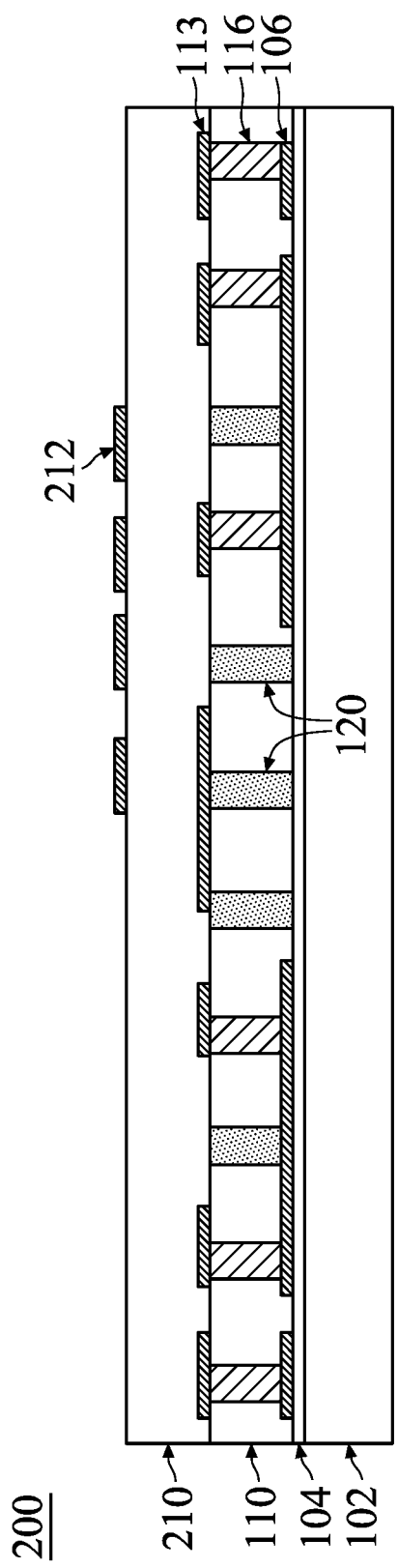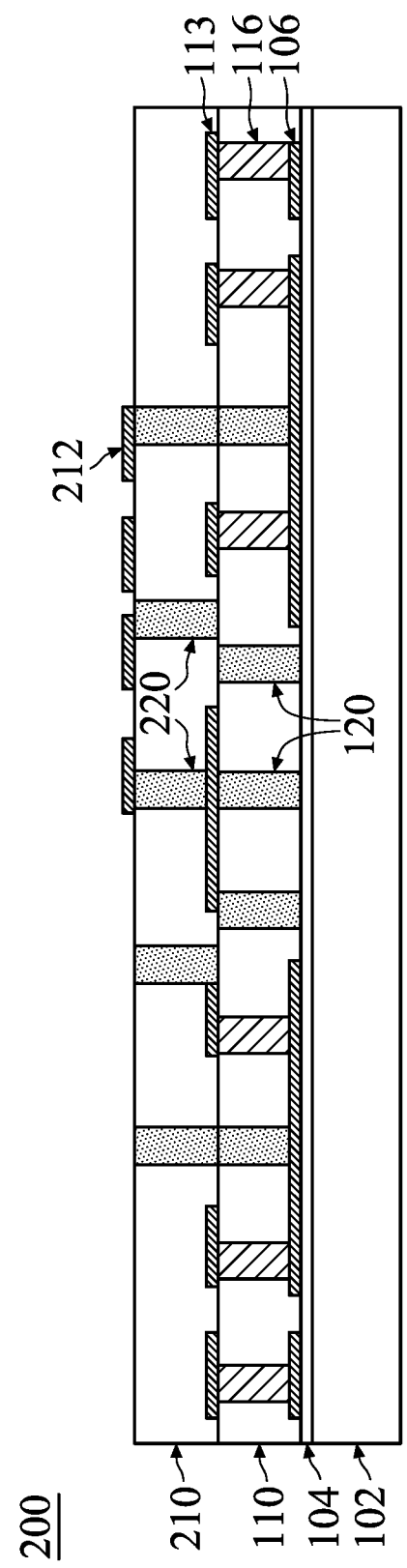

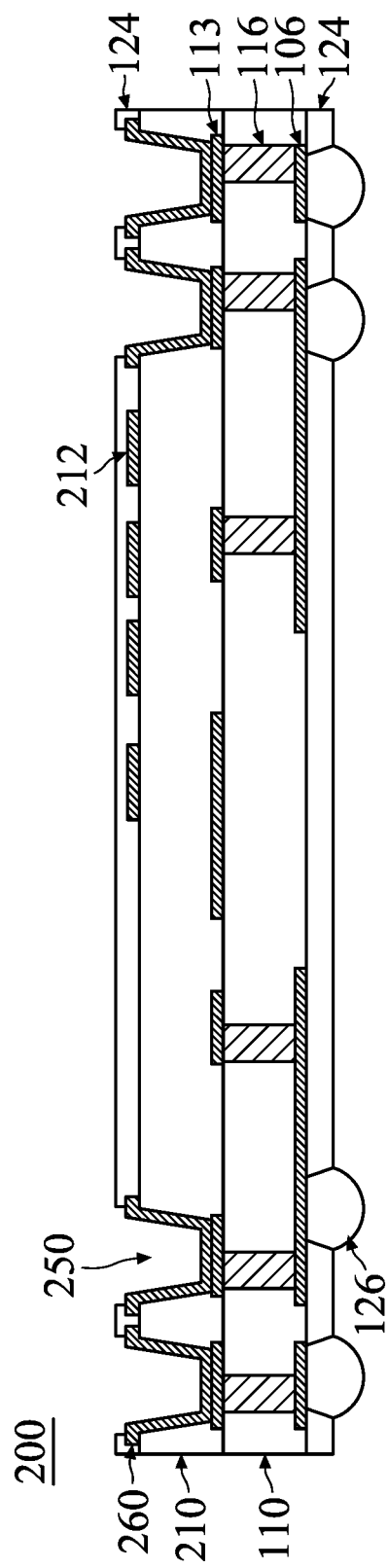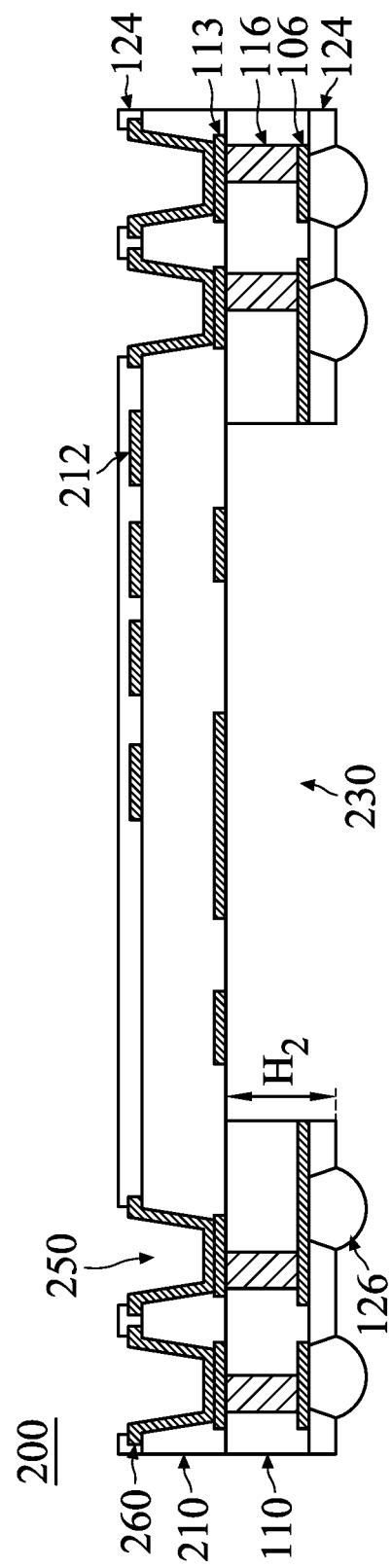

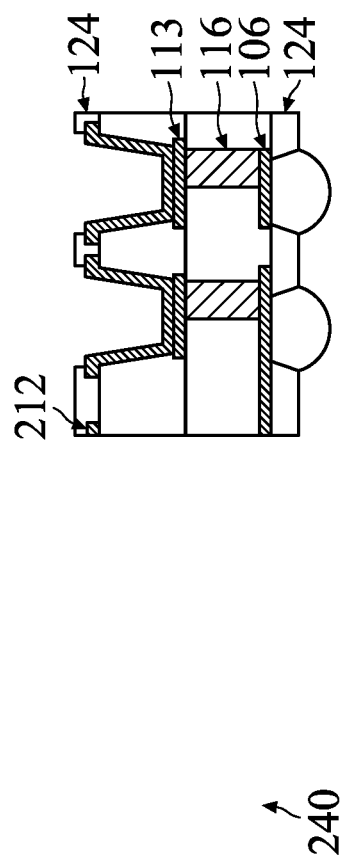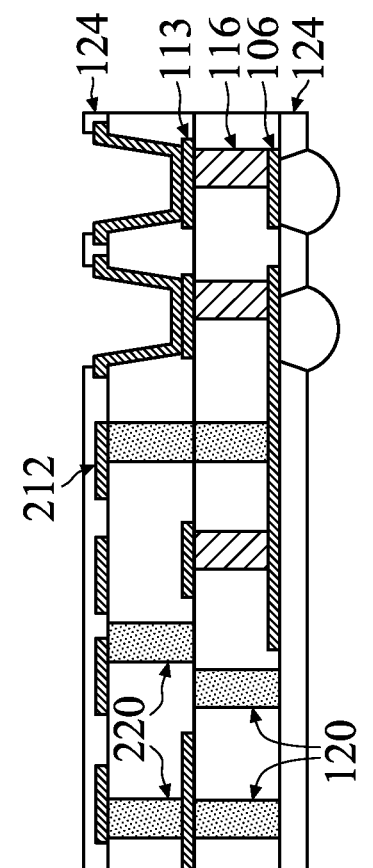
Figure 25
Figure 26

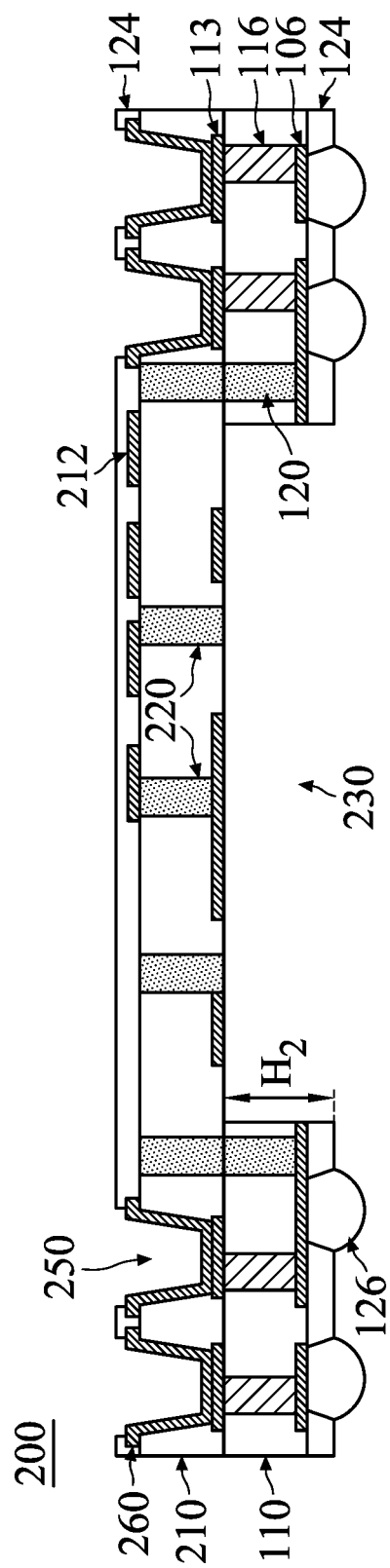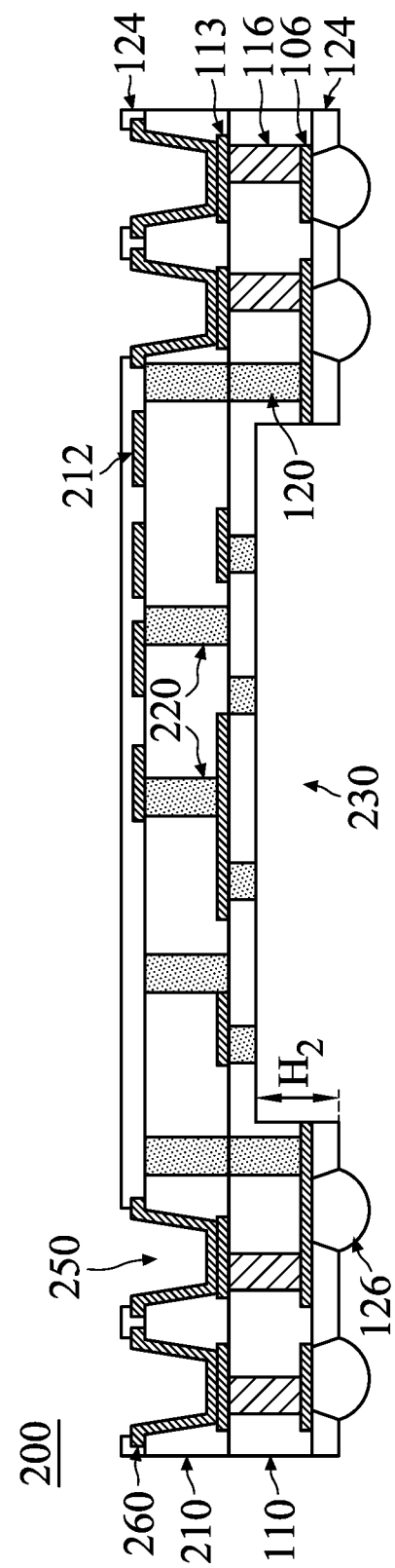

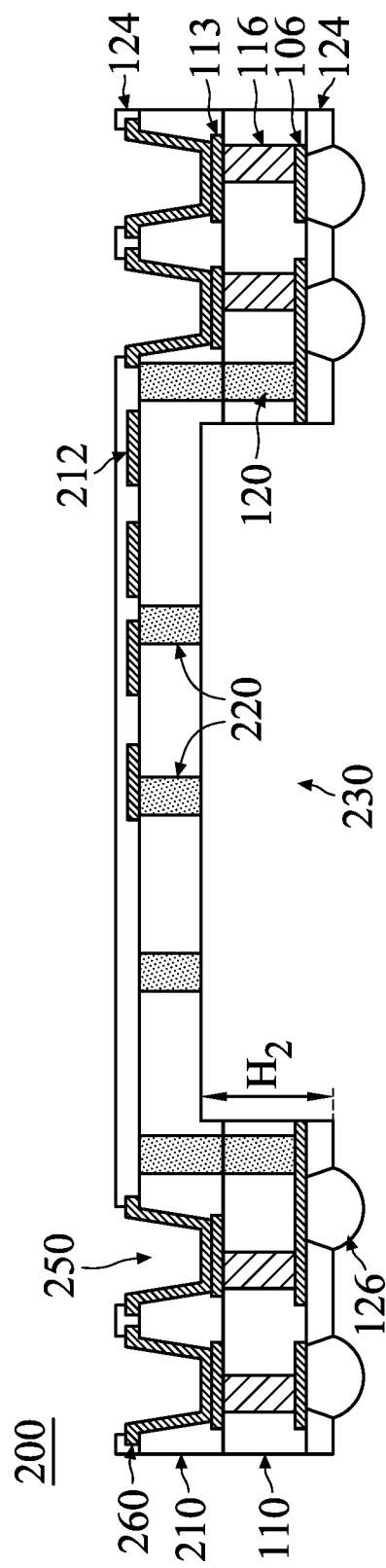
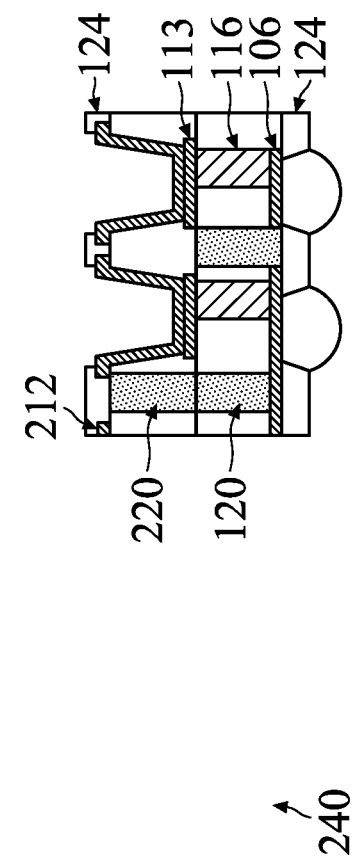
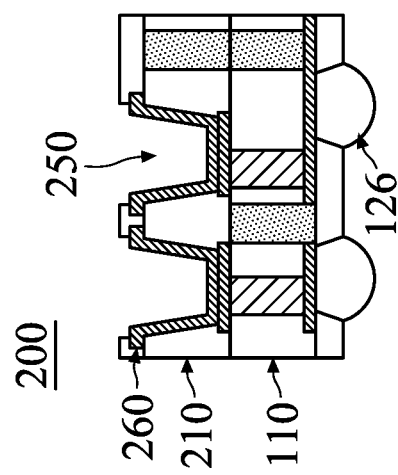
Figure 29
Figure 30

FAN-OUT PACKAGES AND METHODS OF FORMING THE SAME

PRIORITY CLAIM AND CROSS-REFERENCE

This application claims the benefit of U.S. Provisional Application No. 62/738,918, filed on Sep. 28, 2018, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 13 illustrate various intermediate steps in processes of forming an interposer, in accordance with some embodiments.

FIGS. 14 through 30 illustrate various intermediate steps in processes of forming an interposer, in accordance with some embodiments.

FIGS. 36 through 45 illustrate various intermediate steps in a process of forming a package structure including a fan-out bottom package and an interposer, in accordance with some embodiments.

DETAILED DESCRIPTION

Figure 3:
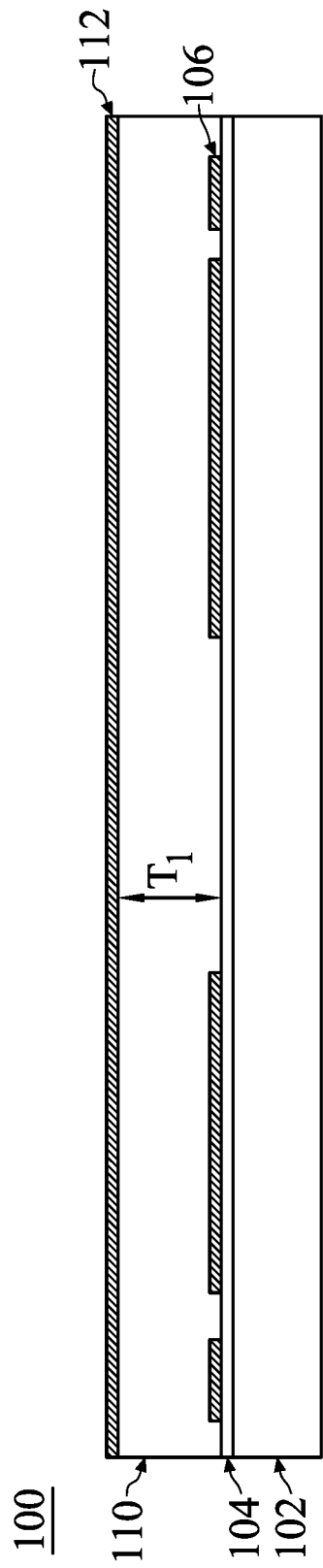

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments include a fan-out bottom package including a die and having an interposer attached thereto. The interposer may include reinforcing structures disposed through a core layer of the interposer. The reinforcing structures may help provide support, rigidity, and thermal dissipation. Package handling risks can be reduced due to the added rigidity of the interposer having reinforcing structures. Also, package warpage can be better controlled using the support provided by the interposer, providing a better Dynamic Random Access Memory (DRAM) or surface mount technology (SMT) joint window. In some embodiments, the interposer may have a cavity or through hole disposed therein, the cavity or through hole being aligned to the die of the fan-out bottom package with the die being at least partially disposed in the cavity or through hole to reduce an overall thickness of the package. In some embodiments, an adhesive may be used between the interposer and the die of the fan-out bottom package.

In some embodiments, the interposer may have a second core layer disposed over a first core layer, with recessed bond pads disposed between the first and second core layers. The recessed bond pads are exposed through the second core layer to provides a deep recess for a connector to an overlying device or package, thereby reducing the overall package height. The recessed bond pads also provide for good alignment to the overlying device. In some embodiments, the interposer may have a second core layer and reinforcing structures disposed in one or both of the core layers. In some embodiments, the interposer may have a cavity or through hole disposed therein aligned to the die of the fan-out bottom package with the die being at least partially disposed within the cavity or through hole.

In some embodiments, a stepped bond pad may be used between the fan-out bottom package and an overlying top package, such as an interposer or second device. The stepped bond pad provides enhanced and robust joint reliability which may otherwise suffer cracking due to warpage of the overlying top package. The stepped bond pad also supports fine pitch processes for reduced pitch between connectors. The stepped bond pad also provides a controlled joint standoff between the fan-out bottom package and the overlying top package. The stepped bond pad also provides good self-alignment for bonding the overlying top package. The stepped bond pad may be used with any of the other embodiments described herein, including any of the interposers discussed herein. The stepped bond pad may be used in embodiments not containing an interposer, but which the overlying package is a device package bonded to the fan-out bottom package.

These embodiments will be discussed in detail with the description of the accompanying figures. However, it should be understood that the features of each of the embodiments discussed in detail herein may be combined in any suitable fashion, even in cases where such combinations are not explicitly disclosed.

FIGS. 1 through 30 illustrate cross-sectional views of intermediate steps of a process for forming an interposer substrate 100 (FIGS. 1 through 13) or an interposer substrate 200 (FIGS. 14 through 30), in accordance with some embodiments. Interposer substrate 100 includes one core layer as further described below and interposer substrate 200 includes more than one core layer as further described below. Although the formation of one interposer substrate 100 is shown, for example in FIGS. 1 through 13, and the formation of one interposer substrate 200 is shown, for example in FIGS. 14 through 30, it should be appreciated that multiple interposer substrates 100 or multiple interposer substrates 200 may be simultaneously formed using a same wafer or substrate, and may be subsequently singulated to form individual interposer substrates 100 or interposer substrates 200.

FIGS. 1 through 13 illustrate cross-sectional views of intermediate steps of a process for forming interposer substrate 100. In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled.

A conductive layer 105 may be formed over the release layer 104. The conductive layer 105 may be one or more layers of copper, titanium, nickel, aluminum, compositions thereof, or the like, and may be formed using any appropriate process, such as by metal foil lamination, chemical vapor deposition (CVD), physical vapor deposition (PVD), and so forth.

Referring now to FIG. 2, the conductive layer 105 may be patterned using acceptable photolithography techniques to form a conductive pattern of conductive lines 106. For example, a photoresist may be deposited over the conductive layer 105, the photoresist developed to expose a negative of the conductive pattern, and the exposed portions of the conductive layer 105 removed by an acceptable etching technique. The conductive pattern of conductive lines 106 may route signals, power, and/or ground lines over the surface of a subsequently formed interposer core layer, for example, from one via through the core layer to another via in the core layer.

In some embodiments the process of forming the conductive pattern of conductive lines 106 may be repeated a number of times to form a redistribution structure, such as redistribution structure 306 which is discussed below with respect to FIG. 32. In such embodiments, dielectric layers may be used to separate the different layers of conductive lines 106, as discussed below with respect to redistribution structure 306.

Referring to FIG. 3, one or more substrate cores are formed over the conductive lines 106. For ease of reference, these will be referred to collectively as substrate core 110. The substrate core 110 may be formed from a pre-impregnated composite fiber ("prepreg"), an insulating film or build-up film, paper, glass fiber, non-woven glass fabric, silicon, or the like. In some embodiments, the substrate core 110 is formed from a prepreg including glass fiber and a resin. In some embodiments, the substrate core 110 may be a copper-clad epoxy-impregnated glass-cloth laminate, a copper-clad polyimide-impregnated glass-cloth laminate, or the like. Substrate core 110 may have a thickness $T_1$ between 20 μm and about 200 μm, such as about 100 μm, though other thicknesses are contemplated and may be used. Substrate core 110 may be made of several distinct layers.

A conductive layer 112 may be formed over the substrate core 110. The conductive layer 112 may be one or more layers of copper, titanium, nickel, aluminum, compositions thereof, or the like, and may be formed using any appropriate process, such as by metal foil lamination, chemical vapor deposition (CVD), physical vapor deposition (PVD), and so forth. In some embodiments, the conductive layer 112 may be a foil which is thermally laminated to the substrate core 110.

Figure 4:
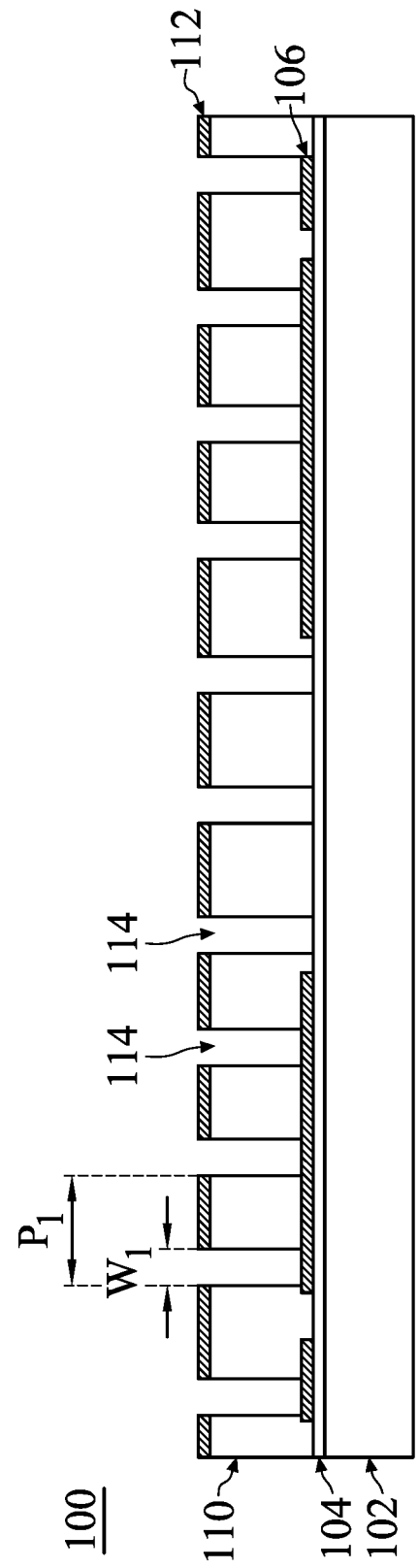
Figure 9:
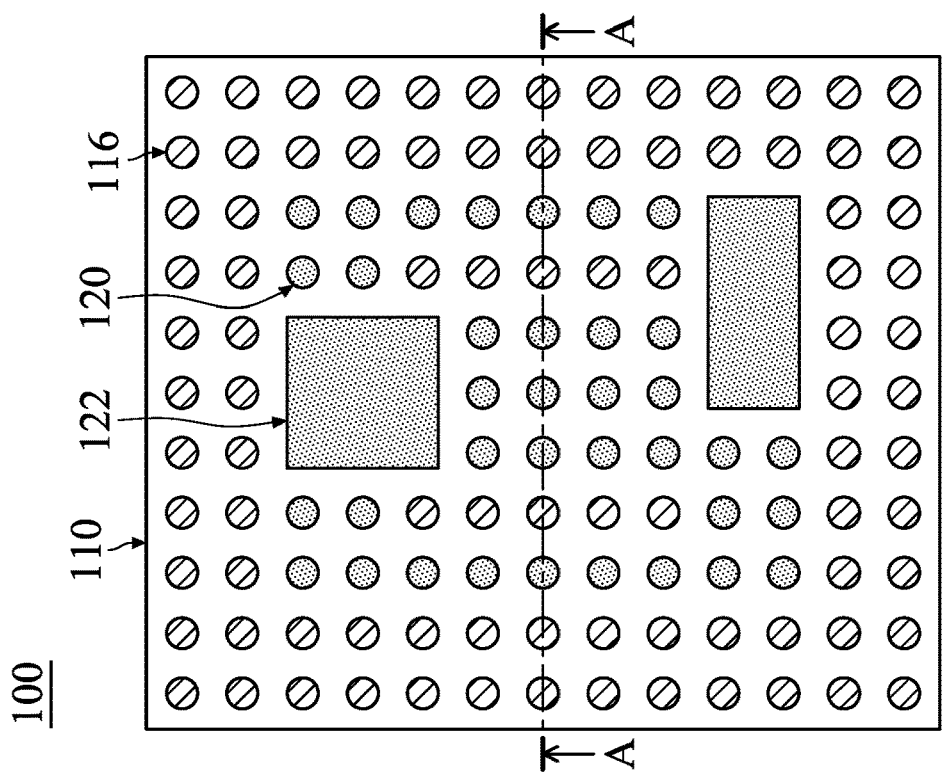

In FIG. 4, openings 114 are formed through the conductive layer 112 into the substrate core 110. In some embodiments, the openings 114 are formed by laser drilling. Other processes, such as mechanical drilling with a drill bit, may also be used to form the openings 114. Any other suitable process may be used for forming the openings 114. The openings 114 may have any top-view shape, such as a polygon, a circle, or the like. A cleaning process may then be performed to clean areas near the openings 114 which may have been smeared with removed material of the substrate core 110. Openings 114 may have a width $W_1$ between about 50 μm and about 250 μm, such as about 100 μm, though other values are contemplated and may be used. In some embodiments, openings 114 may be formed in a regular pattern, having a pitch $P_1$ between 100 μm and about 300 μm, such as about 230 μm, though other values are contemplated and may be used. In some embodiments, widths $W_1$ of the openings 114 may be different in different parts of the substrate core 110. For example, FIG. 9 illustrates irregular reinforcing structures 122 resulting from corresponding irregular openings 114. In some embodiments, the pattern of openings 114 may be different for subsequently formed reinforcing structures versus conductive vias. In some embodiments, openings 114 may be random for subsequently formed reinforcing structures versus conductive vias.

Figure 5:
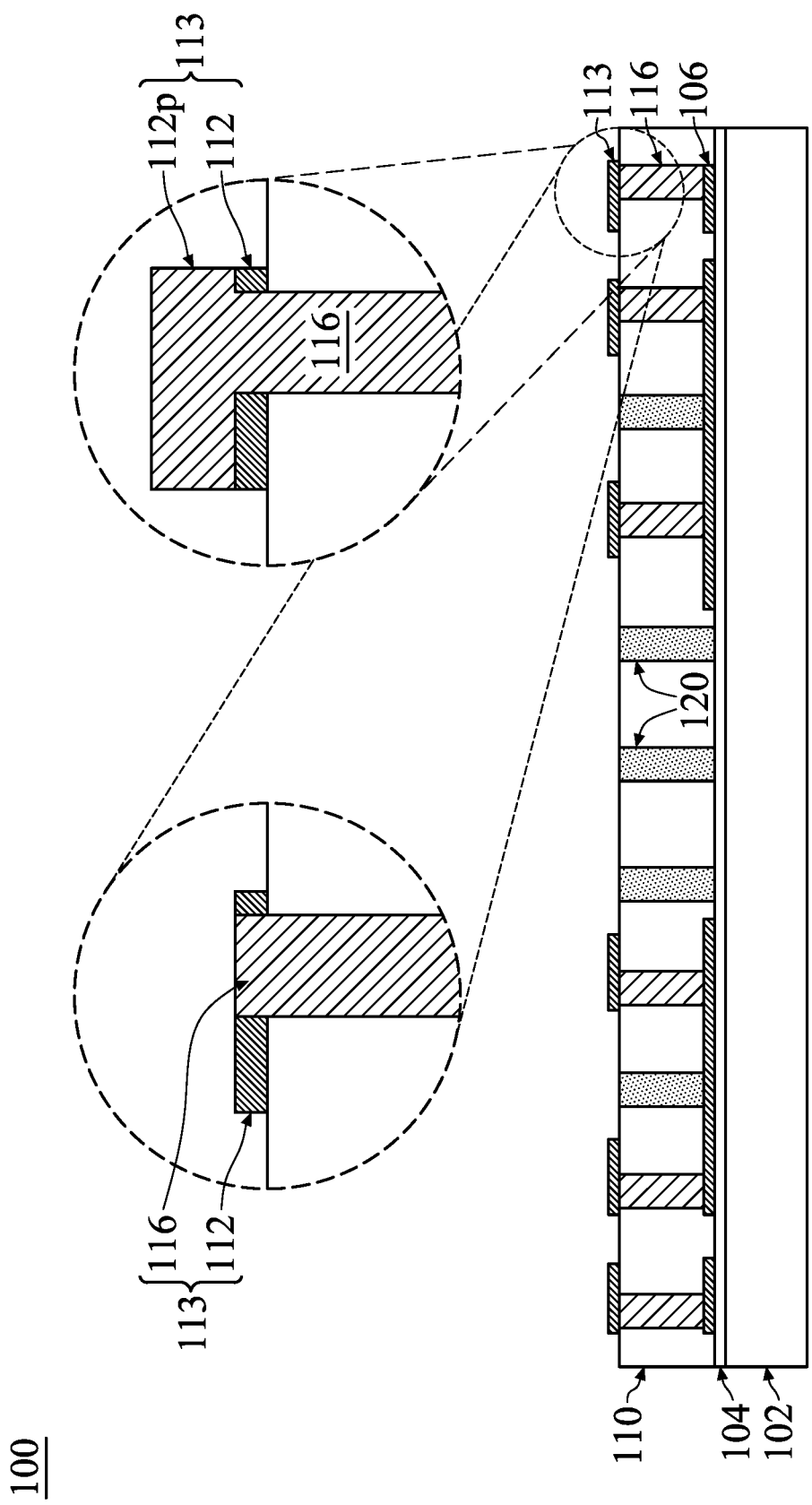

In FIG. 5, conductive vias 116 are formed in some of openings 114 and reinforcing structures 120 are formed in the remaining openings 114. Also, the conductive layer 112 is used to form conductive lines 113 on the substrate core 110.

With regard to the conductive vias 116 and conductive lines 113, the conductive vias 116 may be formed from a conductive material such as copper, titanium, tungsten, aluminum, or the like. In some embodiments, the conductive vias 116 and conductive lines 113 may be formed from the same material or different materials, and may be formed by a same process or different processes. In other embodiments, the conductive vias 116 are formed with a first process and the conductive lines 113 are formed with a second process.

With regard to the reinforcing structures 120, in some embodiments, the reinforcing structures 120 may be formed in the same or different process as the conductive vias 116. In embodiments where the reinforcing structures 120 are formed in the same process as the conductive vias 116, the reinforcing structures 120 and conductive vias 116 may be formed of a same conductive material, however, the conductive material of the reinforcing structures 120 is uncoupled and electrically floats. In embodiments where the reinforcing structures 120 are formed in a different process as the conductive vias 116, the reinforcing structures 120 may be formed using the same or different materials than the conductive vias 116. In such embodiments, either of the conductive vias 116 or reinforcing structures 120 may be formed first.

Referring to the formation of the conductive vias 116 and conductive lines 113, the conductive vias 116 and conductive lines 113 may be formed by any suitable process. For example, in some embodiments, openings 114 which will subsequently become reinforcing structures 120 are masked, while the openings 114 which will become conductive vias 116 are exposed.

In a process where conductive vias 116 and conductive lines 113 are separately formed, seed layers (not shown) may be formed in the exposed openings 114. A plating process, such as electro plating or electroless plating, may be used to deposit a conductive material in the openings 114, thereby forming the conductive vias 116. To form the conductive lines 113, a photoresist may be formed over the conductive layer 112 and patterned with an inverse image of the conductive lines 113 to expose portions of conductive layer 112 which are not included in the pattern of the conductive lines 113. The exposed portions of the conductive layer 112 may then be removed, for example, by a suitable etching process, such as by wet or dry etching, to form conductive lines 113. The photoresist may be removed by an acceptable ashing or stripping process, such as using an oxygen plasma or the like. Conductive lines 113 may be formed before or after the formation of conductive vias 116. An example structure resulting from this process is shown enlarged (left enlargement) in FIG. 5.

In a process where conductive vias 116 and conductive lines 113 are formed in the same process, the seed layers (not shown) which are formed in the exposed openings 114 may also extend over portions of the conductive layer 112 which will become conductive lines 113. A photoresist may be formed over the conductive layer 112 and seed layer and patterned with an image of the conductive lines 113 to expose portions of the seed layer which are included in the pattern of the conductive lines 113. A plating process may be used to deposit a conductive material on the seed layer which is in the openings 114 to form conductive vias 116 and which is exposed through the photoresist to form conductive material 112p. Following the plating, the photoresist may be removed by an acceptable ashing or stripping process, such as using an oxygen plasma or the like. Then, the exposed portions of the seed layer may be removed, followed by the exposed portions of the conductive layer 112. Removal of the seed layer and portions of the conductive layer 112 may be by an acceptable etching process, such as by wet or dry etching. An example structure resulting from this process is shown enlarged (right enlargement) in FIG. 5.

The photoresist used above may be formed by spin coating or the like and may be exposed to light for patterning. The pattern of the photoresist corresponds to a conductive pattern of conductive lines 113 or an inverse of the conductive pattern of conductive lines 113, depending on the process used, such as described above.

In some embodiments the process of forming the conductive lines 113 may be repeated any number of times to form a redistribution structure, such as redistribution structure 306 which is discussed below with respect to FIG. 32. In such embodiments, dielectric layers may be used to separate the different layers of conductive lines 113, as discussed below with respect to redistribution structure 306.

Referring now to the reinforcing structures 120, reinforcing structures 120 are formed in some of the openings 114. In some embodiments, reinforcing structures 120 may be formed of a material having a high thermal conductivity, for example between about 10 W/m·K and 475 W/m·K, such as about 400 W/m·K, though other values are contemplated and may be used. In some embodiments, reinforcing structures 120 may be formed of a material having a high rigidity (Young's modulus), for example between about 10 GPa and about 380 GPa, such as about 120 GPa, though other values are contemplated and may be used. In some embodiments, reinforcing structures 120 may be formed of a material having a coefficient of thermal expansion (CTE) which is similar to the substrate core 110, for example between about 20 parts per million per degree Celsius (PPM/° C.) to about 100 PPM/° C., such as about 30 PPM/° C., though other values are contemplated and may be used. Reinforcing structures 120 may be selected to have one or more of a high thermal conductivity, high rigidity, and a particular CTE.

In some embodiments, the material of reinforcing structures 120 may be a metal material, such as copper, titanium, tungsten, aluminum, or the like. In some embodiments, reinforcing structures 120 may be formed of a ceramic, such as aluminum oxide, zirconia, or the like. In other embodiments, reinforcing structures 120 may be formed of polymer materials, graphite materials, silicon materials, or a metal or non-metal conductive film. In some embodiments, reinforcing structures 120 may be formed of composites or combinations of any of the above.

Reinforcing structures 120 improves thermal dissipation and reduces warpage at the same time. The reinforcing structures 120 having a larger Young's modulus can enhance the strength of the substrate core 110. In general, the larger the density of the reinforcing structures 120 in the substrate core 110, the less warpage occurs in subsequent thermal processes. When the reinforcing structures 120 have both a larger Young's modulus and higher thermal conductivity, heat is dispersed away from heat generating components through the reinforcing structures 120 which are less subject to stress than the surrounding substrate core 110 material.

Reinforcing structures 120 may be electrically floating, not being electrically coupled to any other connector. Reinforcing structures 120 may have different shapes and sizes in top view (see, e.g., FIG. 9 illustrating reinforcing structures 122) and may be laid out in a pattern or randomly.

In other embodiments, the conductive vias 116 are formed with different processes. Reinforcing structures 120 may be formed using any suitable process, depending on the material of reinforcing structures 120. For example, a metal may be formed in a manner similar to that described above with respect to conductive vias 116. Other materials may be formed by using photolithography to mask the other openings 114 or conductive vias 116, and exposing the openings 114 for forming corresponding reinforcing structures 120. A photo resist may be formed, for example, by spin coating or laminating and then patterned by exposure to a suitable light source to expose the openings 114 which will be used for reinforcing structures 120. After exposing the openings 114, the reinforcing structures 120 may be formed by electroplating or electro-less plating for metal materials and so forth. After forming reinforcing structures 120, the photo resist may be removed by a wet and/or dry process, such as by an ashing technique. In another example, where reinforcing structures 120 are formed of a ceramic, the ceramic may be deposited using a CVD process. In yet another example, where reinforcing structures 120 are formed of a polymer, the polymer may be deposited using a spin on or dispensing technique and cured. Other deposition methods are contemplated and may be used.

In some embodiments, a removal process, such as a planarization process, may be used to remove portions of the material of the reinforcing structures 120, for example, to level the top of the reinforcing structures 120 with another layer of the interposer substrate 100. In embodiments where the reinforcing structures 120 are formed prior to the formation of conductive layer 112, a top of the reinforcing structures 120 may be leveled with a top of the substrate core 110. In other embodiments, the top of the reinforcing structures may be leveled with a top of the conductive lines 113 or with a top of the conductive vias 116. In some embodiments, the same removal process or a separate removal process, such as a planarization process, may be used to level a top of the conductive lines 113 with a top of the conductive vias 116.

Figure 6:
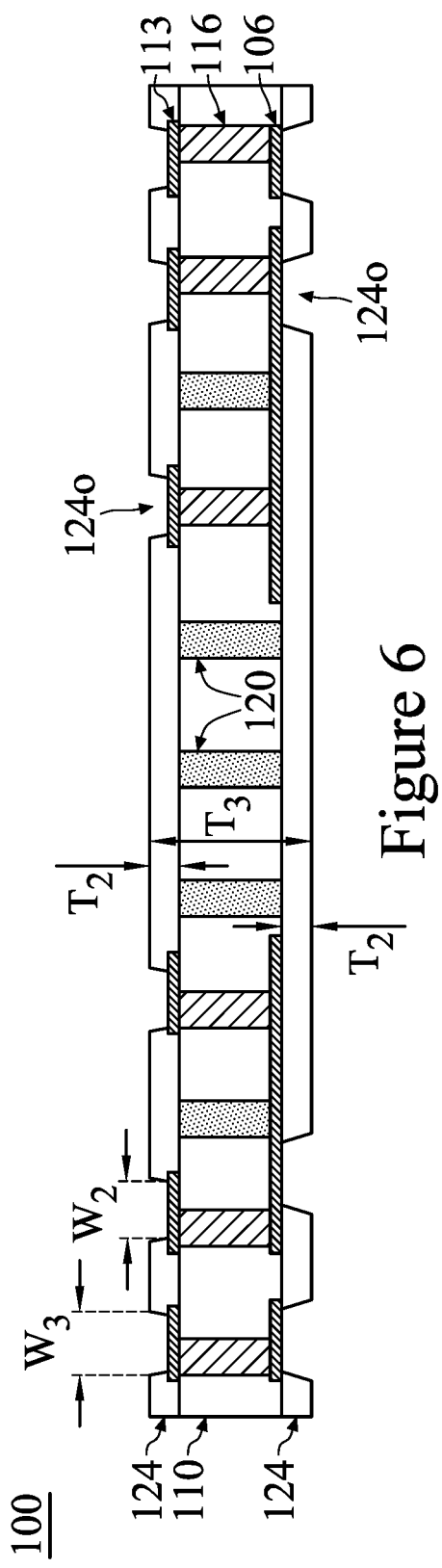

In FIG. 6, the carrier substrate 102 is removed. The carrier substrate 102 may be detached (or "de-bonded") from the substrate core 110. In some embodiments, the de-bonding includes projecting a light such as a laser light or an UV light on the release layer 104 so that the release layer 104 decomposes under the heat of the light and the carrier substrate 102 can be removed.

Solder resist layers 124 are formed over opposing sides of the substrate core 110, on the conductive lines 106 and conductive lines 113. The solder resist layers 124 protect areas of the substrate core 110 from external damage. In some embodiments, the solder resist layers 124 are formed by depositing a photosensitive dielectric layer, exposing the photosensitive material with an optical pattern, and developing the exposed layer to form openings 124o. In some embodiments, the solder resist layers 124 are formed by depositing a non-photosensitive dielectric layer (e.g., silicon oxide, or silicon nitride, or the like), and patterning the dielectric layer with acceptable photolithography and etching techniques to form the openings 124o. The openings 124o expose underlying portions of the conductive lines 113 and conductive lines 106 that may be used as connector pads or underbump metallizations in subsequent processes. The openings 124o may be tapered, having a smaller width $W_2$ at the deepest portion of the opening 124o versus a larger width $W_3$ at the shallowest portion of the opening 124o. The width $W_2$ may be between about 55 μm and about 320 μm, such as about 180 μm, though other dimensions are contemplated and may be used. The width $W_3$ may be between about 70 μm and about 350 μm, such as about 210 μm, though other dimensions are contemplated and may be used. The thickness $T_2$ of each solder resist layer may be between about 5 μm and about 50 μm, such as about 25 μm, though other thicknesses are contemplated. The overall thickness $T_3$ of interposer substrate 100 may be between about 50 μm and about 300 μm, such as about 100 μm, though other thicknesses are contemplated.

Figure 7:
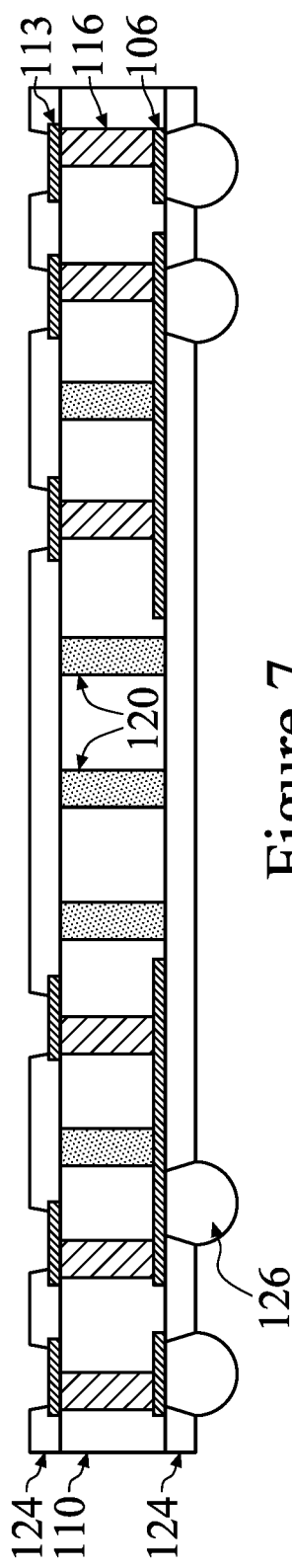

In FIG. 7, conductive connectors 126 are formed in the openings 124o (see FIG. 6). The conductive connectors 126 may contact exposed portions of the conductive lines 106. The conductive connectors 126 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 126 may include a conductive material such as solder, copper, aluminum, gold, nickel, silver, palladium, tin, the like, or a combination thereof. In some embodiments, the conductive connectors 126 are eutectic connectors that are formed by initially forming a layer of a eutectic material such as solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 126 comprise metal pillars (such as a copper pillar) formed by a printing, electro plating, electroless plating, chemical vapor deposition (CVD), physical vapor deposition (PVD), and so forth. The metal pillars may be solder free and have substantially vertical sidewalls.

Figure 8:
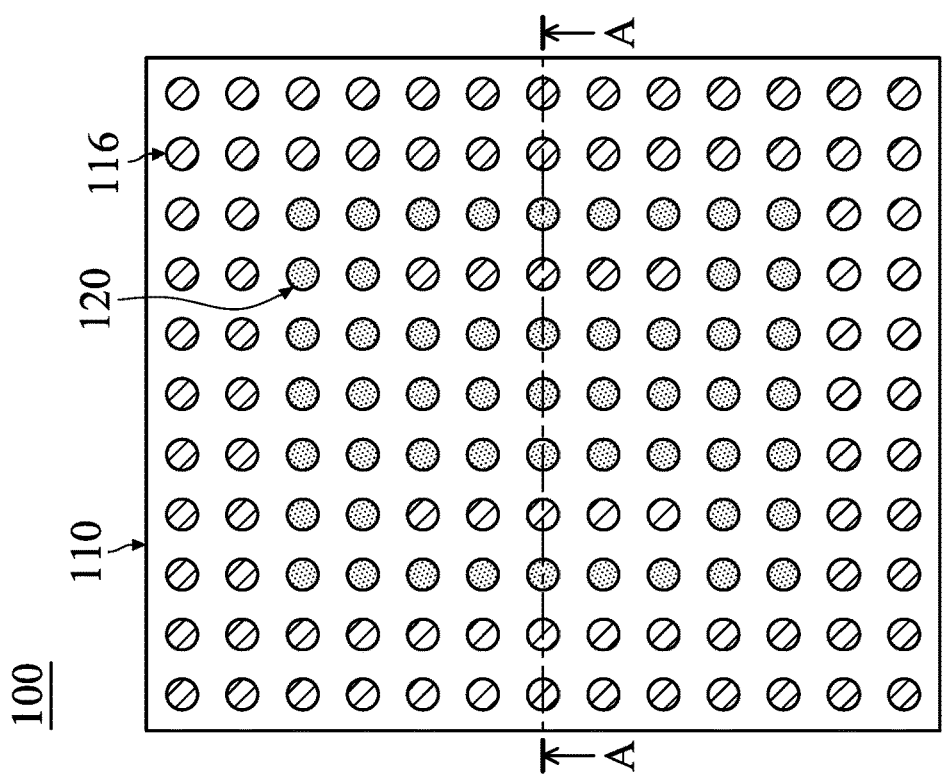

FIGS. 8 and 9 are horizontal cross-sectional views through the substrate core 110 of interposer substrate 100, in accordance with various embodiments. In the embodiment of interposer substrate 100 illustrated in FIG. 8, the reinforcing structures 120 are formed at various positions throughout the interposer substrate 100. The reinforcing structures 120 may have about the same size or different sizes than the conductive vias 116. The reinforcing structures 120 may be formed in the same pattern or in a different pattern than the pattern of the conductive vias 116. In some embodiments, the reinforcing structures 120 may be distributed randomly. The embodiment of interposer substrate 100 illustrated in FIG. 9 illustrates reinforcing structures 122 which have irregular shapes and which include an area which is between about 2 times and 100 times the area of others of the reinforcing structures 120, though the area may be less than 2 times or more than 100 times the area of the reinforcing structures 120. The reinforcing structures 122 may be located and designed to correspond to a particular device or hot spot in an attached package and may help to dissipate heat from the attached package.

Both FIGS. 8 and 9 illustrate a line A-A which demonstrates a cross-section taken for FIG. 7. In the views illustrated in FIGS. 8 and 9, the total area of all the reinforcing structures 120 and reinforcing structures 122 may be between about 5% and about 80% of the total area of the interposer substrate 100 in top view. The total volume of all the reinforcing structures 120 and reinforcing structures 122 may be between about 5% and about 80% of the volume of the substrate core 110 of interposer substrate 100.

Figure 10:
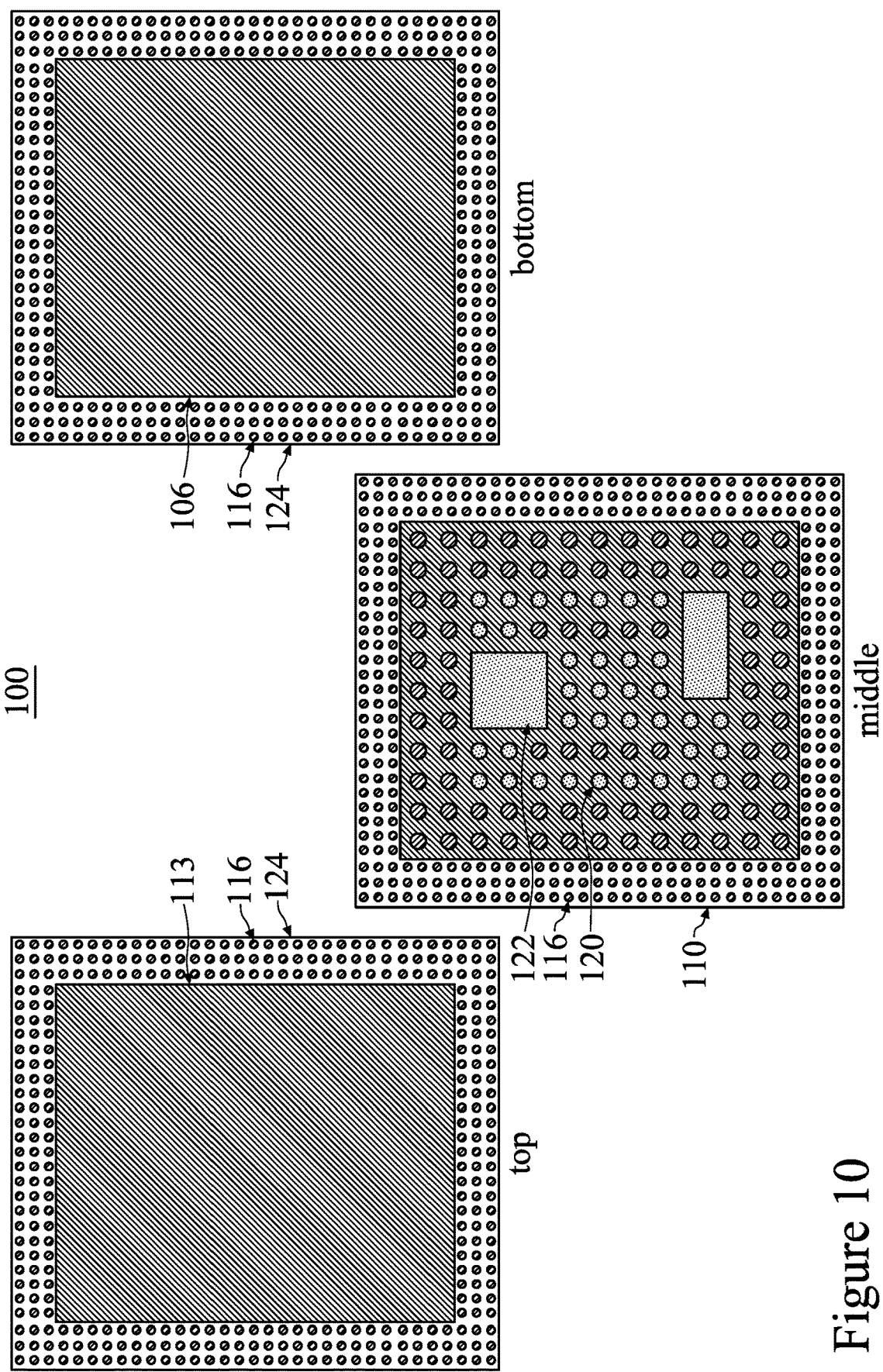

FIG. 10 illustrates top, middle, and bottom views of interposer substrate 100. As illustrated in FIG. 10, conductive vias 116 may be located in a peripheral area of interposer substrate 100 and conductive lines 113 may provide routing from one conductive via 116 to another conductive via 116. Reinforcing structures 120 and/or 122 may be formed through the middle of substrate core 110.

Figure 11:
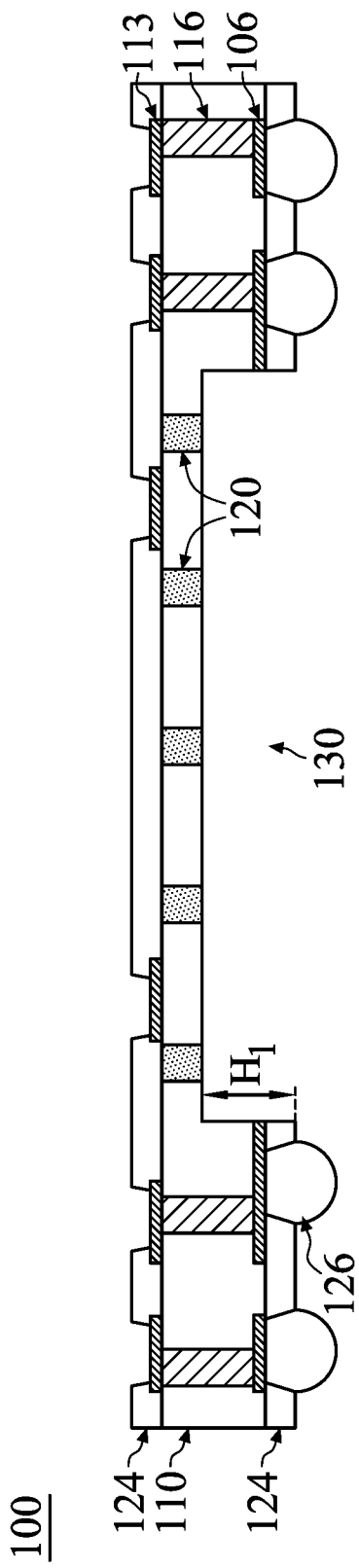

FIG. 11 illustrates an interposer substrate 100 which has a cavity 130 disposed therein, in accordance with some embodiments. Cavity 130 may be formed by removing portions of the substrate core 110 and solder resist layers 124 prior to or after forming the conductive connectors 126. Removal of material to form the cavity 130 may be accomplished by a mechanical drilling process with computer numeric control (CNC). In such embodiments, material is removed by a mechanical drill, with the position of the drill being controlled by a computer or controller. Removal may also be accomplished by other processes, such as a laser cutting process, a laser drilling process, or the like. Remaining portions of the material form interposer substrate 100. Cavity 130 may have a height $H_1$ between about 20 μm and about 270 μm, such as about 50 μm, although other heights are contemplated and may be used. In such embodiments, reinforcing structures 120 and/or 122 may be disposed in the thin portion of the interposer substrate 100 and/or in the peripheral portions of the interposer substrate 100. Accordingly, some of such reinforcing structures 120 and/or 122 may likewise be thinned when cavity 130 is formed. The cavity 130 may be formed in a location of the interposer substrate 100 so that it aligns with a mounted device of a bottom fan out package (discussed in further detail below), to reduce the overall thickness of the package which is formed when the interposer substrate 100 is attached to the bottom fan out package.

Figure 12:
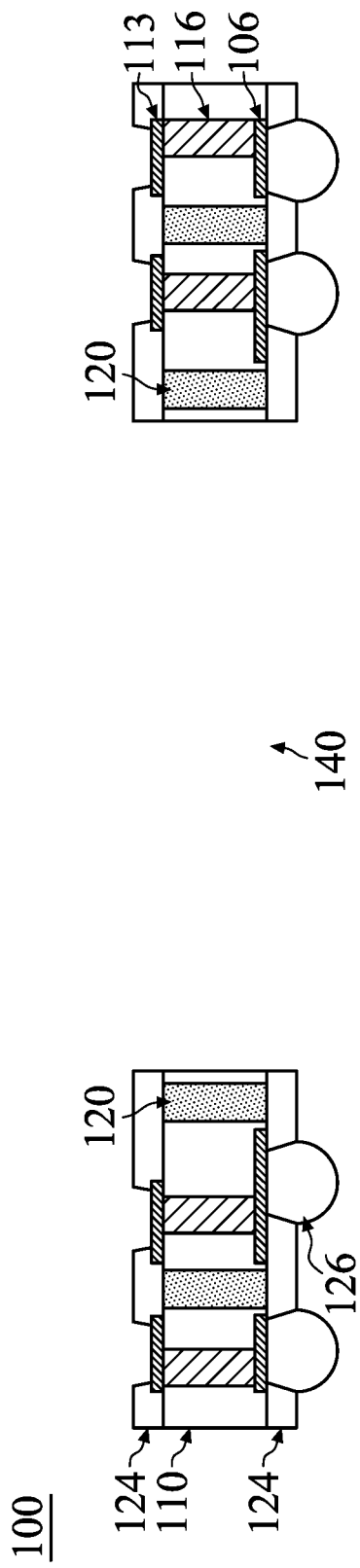

FIG. 12 illustrates an interposer substrate 100 which has a through hole 140 disposed therein, providing a ring shape, in accordance with some embodiments. In some embodiments, the cavity 130 may be formed completely through the substrate core 110 and solder resist layers 124 to form the through hole 140. In such embodiments, reinforcement structures 120 and/or 122 may be disposed in the peripheral portions of the interposer substrate 100. The through hole 140 may be formed in a location of the interposer substrate 100 so that it aligns with a mounted device of a bottom fan out package (discussed in further detail below), to reduce the overall thickness of the package which is formed when the interposer substrate 100 is attached to the bottom fan out package.

Figure 13:
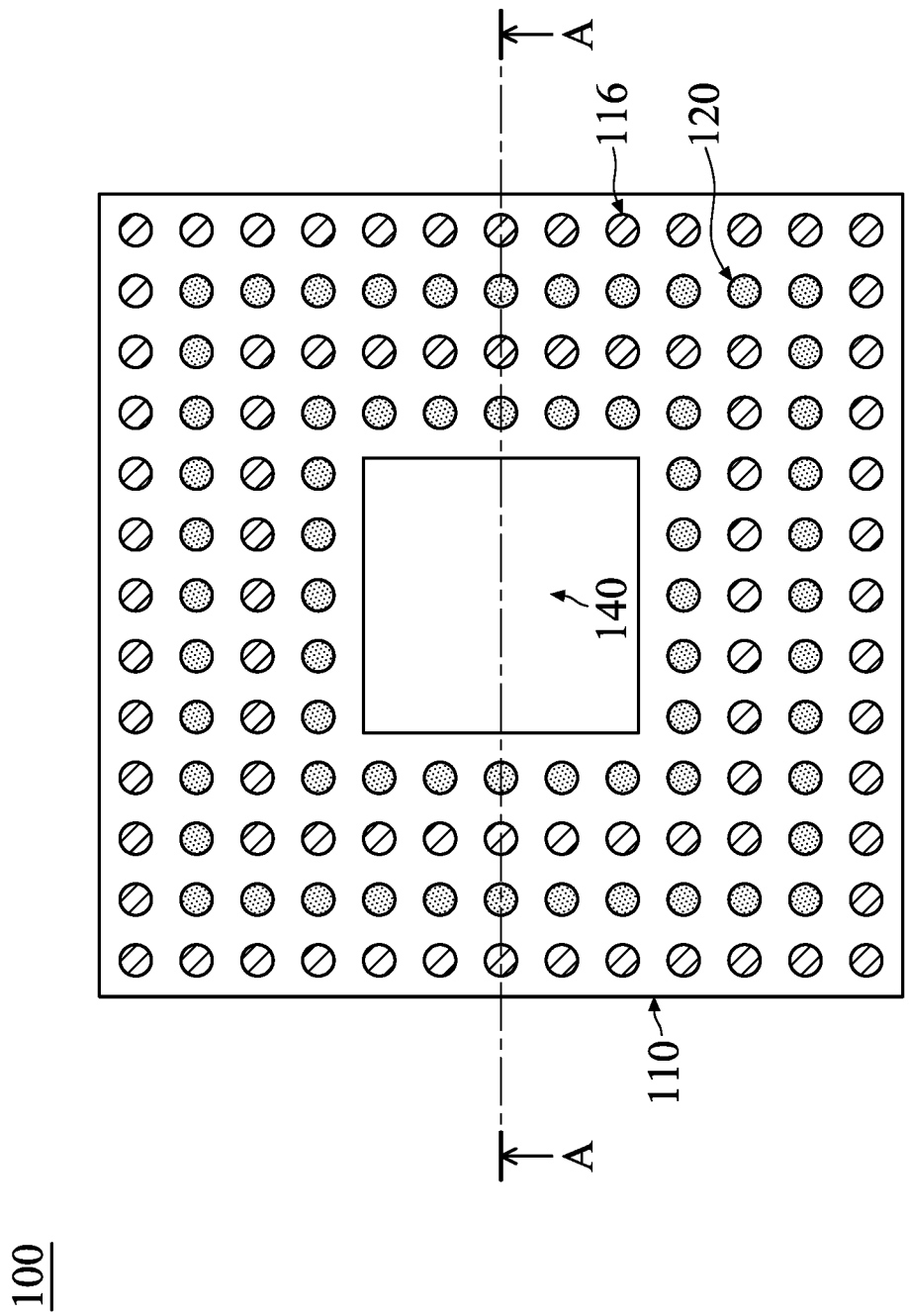

FIG. 13 illustrates a horizontal cross-sectional view through the substrate core 110 of ring shape interposer substrate 100 as illustrated in FIG. 12, in accordance with some embodiments. Line A-A demonstrates a cross-section taken for FIG. 12. The reinforcing structures 120 are formed at various positions throughout the interposer substrate 100. The reinforcing structures 120 may have about the same size or different sizes than the conductive vias 116. The reinforcing structures 120 may be formed in the same pattern or in a different pattern than the pattern of the conductive vias 116. In some embodiments, the reinforcing structures 120 may be distributed randomly. Although not shown in this view, reinforcing structures 122 (see FIG. 9) may be included. The total area of all the reinforcing structures 120 and/or reinforcing structures 122 may be between about 5% and about 80% of the total area of the interposer substrate 100. The total volume of all the reinforcing structures 120 and reinforcing structures 122 may be between about 5% and about 80% of the volume of the substrate core 110 of interposer substrate 100.

Figure 14:
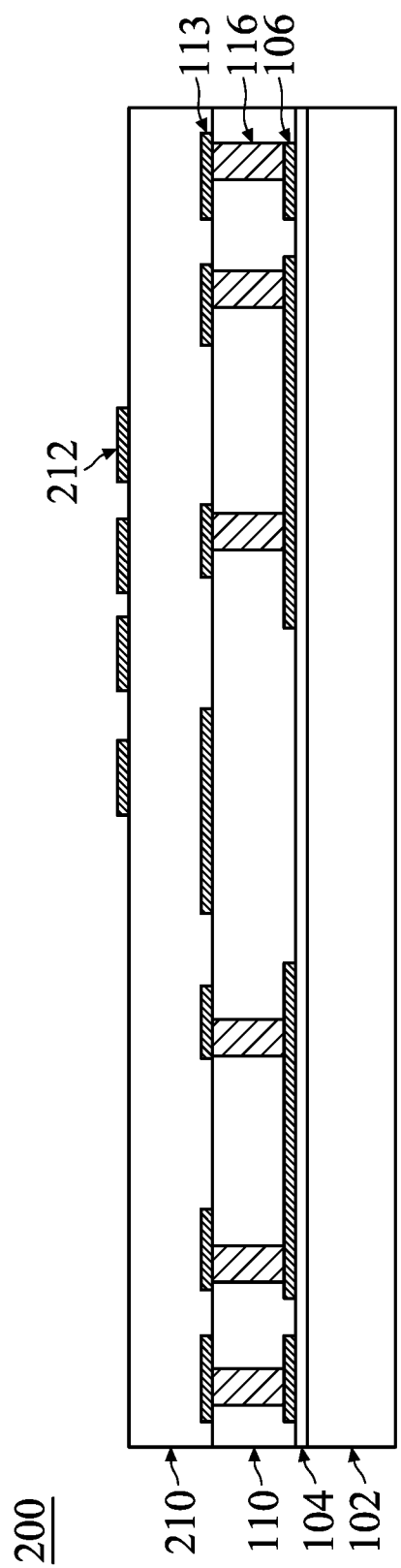

FIGS. 14 through 30 illustrate various embodiments of an interposer substrate 200 which includes one or more additional substrate core 210 layers. FIG. 14 illustrates a second substrate core 210 which is formed over the substrate core 110 and conductive lines 113, in accordance with some embodiments. Following the forming of conductive vias 116 and conductive lines 113 of FIG. 5, the second substrate core 210 may be laminated to the first substrate core 110 and conductive lines 113. The second substrate core 210 may be formed using materials and processes similar to those discussed above with respect to substrate core 110 and are not repeated. Conductive lines 212 may be formed over the second substrate core 210. Conductive lines 212 may be formed by first forming a conductive layer using processes and materials similar to those discussed above with respect to conductive layer 112 and then patterning the conductive layer to produce conductive lines 212 using processes and materials similar to those discussed above in the patterning of conductive lines 113, which are not repeated. As illustrated in FIG. 14, in some embodiments, neither the substrate core 110 nor the substrate core 210 may have reinforcing structures disposed therein. In some embodiments the process of forming the conductive lines 212 may be repeated any number of times to form a redistribution structure, such as redistribution structure 306 which is discussed below with respect to FIG. 32. In such embodiments, dielectric layers may be used to separate the different layers of conductive lines 212, as discussed below with respect to redistribution structure 306.

FIG. 15 illustrates a second substrate core 210 which is formed over the substrate core 110 and conductive lines 113, in accordance with some embodiments. Following the forming of conductive vias 116, conductive lines 113, and reinforcing structures 120 of FIG. 5, the second substrate core 210 may be laminated to the first substrate core 110 and conductive lines 113. The second substrate core 210 and conductive lines 212 may be formed in a manner similar to that discussed with respect to the second substrate core 210 of FIG. 14. As illustrated in FIG. 15, in some embodiments, the substrate core 210 may be formed over the substrate core 110 after the reinforcing structures 120 have been placed in the substrate core 110, but be free from reinforcing structures.

FIG. 16 illustrates a second substrate core 210 which is formed over the substrate core 110 and conductive lines 113, in accordance with some embodiments. Following the forming of conductive vias 116, conductive lines 113, and the reinforcing structures 120 of FIG. 5, the second substrate core 210 may be laminated to the first substrate core 110 and conductive lines 113. In some embodiments, the reinforcing structures 220 may be formed within the second substrate core 210. In some embodiments, some or all of the reinforcing structures 220 may be aligned with respective reinforcing structures 120, while in other embodiments, none of the reinforcing structures 220 are aligned with reinforcing structures 120. In some embodiments, the reinforcing structures 220 may include irregularly shaped reinforcing structures similar to the reinforcing structures 122, discussed above. The reinforcing structures 220 may be formed using processes and materials similar to those discussed above in the formation of the reinforcing structures 120 and/or 122, which are not repeated.

FIGS. 17 through 21 illustrate various intermediate processes in completing the interposer substrate 200. Although FIGS. 17 through 21 are illustrated based on the interposer substrate 200 as depicted in FIG. 14, it should be understood that these processes may be applied to embodiments of the interposer substrate 200 which are consistent with those depicted in FIGS. 15 and 16 as well.

Figure 17:
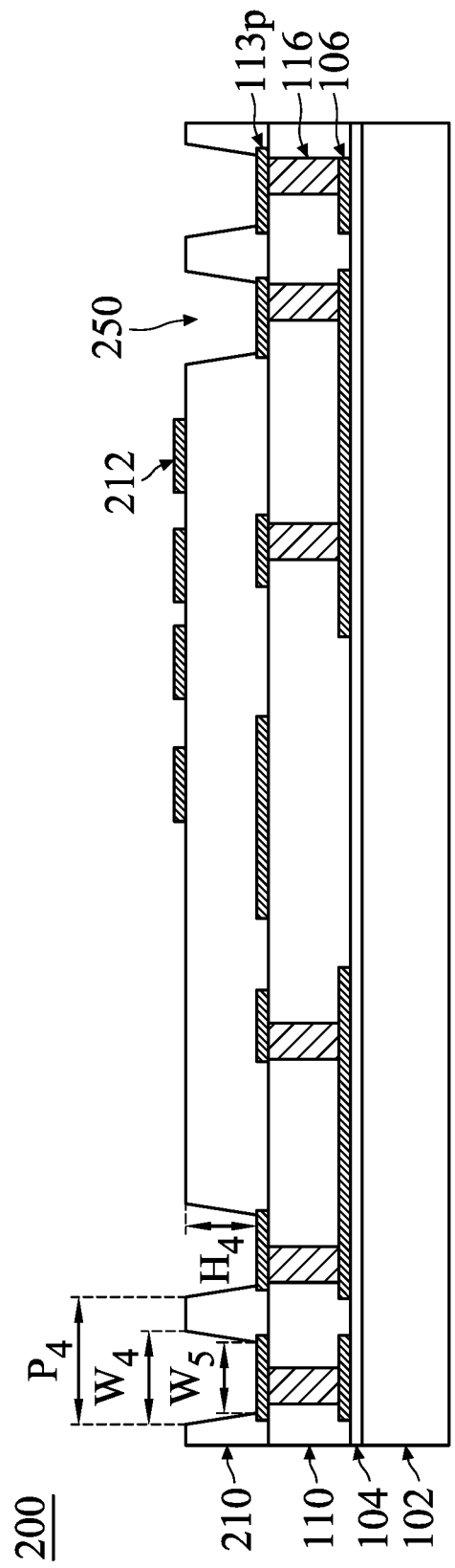

FIG. 17 illustrates the interposer substrate of FIG. 14 after recesses 250 have been formed in the second substrate core 210 to expose a recessed bond pad 113$p$ which corresponds to a portion of the conductive lines 113. In some embodiments, the recesses 250 are formed by laser drilling. Other processes, such as mechanical drilling with a drill bit, may also be used to form the recesses 250. Any other suitable process may be used for forming the recesses 250. The recess 250 may have any top-view shape, such as a polygon, a circle, or the like. A cleaning process may then be performed to clean areas near the recesses 250 which may have been smeared with removed material of the substrate core 210. Recesses 250 may have a width $W_4$ between about 70 μm and about 350 μm, such as about 210 μm, though other values are contemplated and may be used. In some embodiments, recesses 250 may be formed in a regular pattern, having a pitch $P_4$ between 70 μm and about 400 μm, such as about 260 μm, though other values are contemplated and may be used. In some embodiments, the width $W_4$ at the top of the recesses 250 may be wider than the width $W_5$ at the bottom of the recesses 250, the recesses 250 having a tapered shape. The width $W_5$ may be between about 55 μm and about 320 μm, such as about 180 μm. Recesses 250 may have a height $H_4$ between about 20 μm and about 300 μm, such as about 30 μm, though other values are contemplated and may be used.

Figure 18:
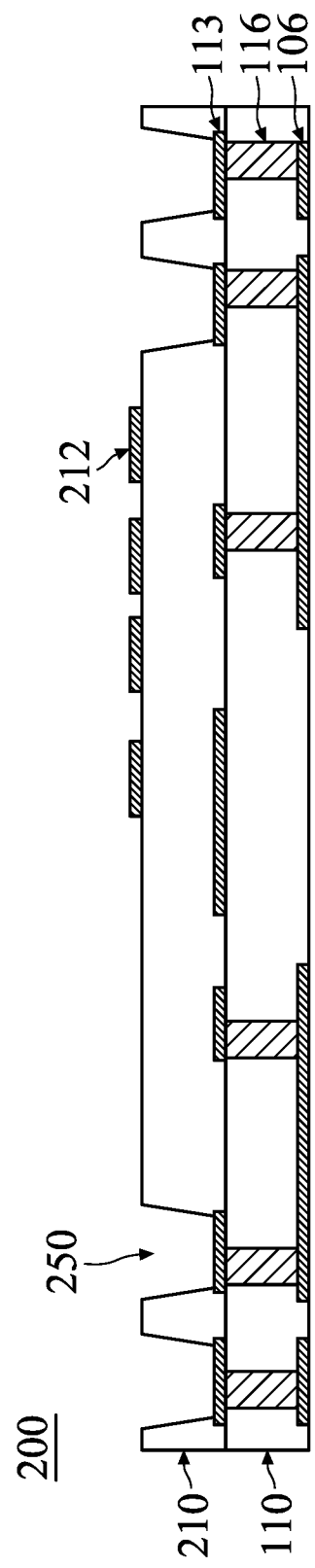

In FIG. 18, the carrier substrate 102 is removed. The carrier substrate 102 may be detached (or "de-bonded") from the substrate core 110. In some embodiments, the de-bonding includes projecting a light such as a laser light or an UV light on the release layer 104 so that the release layer 104 decomposes under the heat of the light and the carrier substrate 102 can be removed. In some embodiments, additional substrate core layers may be added in a manner similar to that discussed above with respect to substrate core 210, with conductive lines, vias, and reinforcing structures disposed therein in a manner consistent with that discussed above, and with the topmost substrate core having the recesses 250 formed therein.

Figure 19:
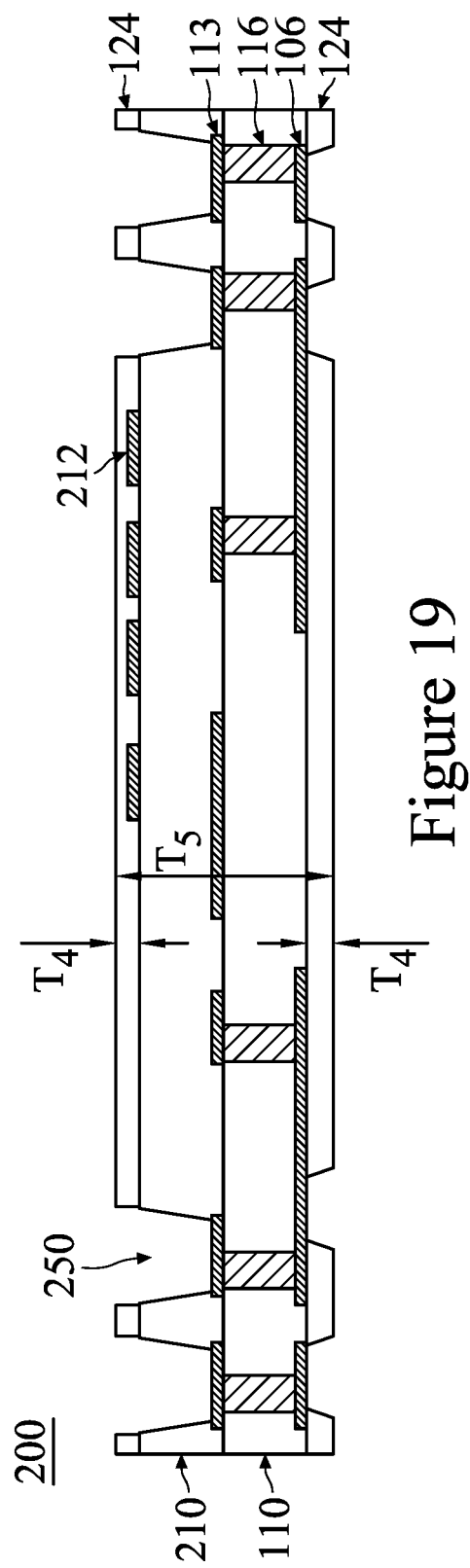

In FIG. 19, solder resist layers 124 are formed over opposing sides of the substrate core 110 and substrate core 210, on the conductive lines 106 and conductive lines 212. The solder resist layers 124 protect areas of the substrate core 110 and substrate core 210 from external damage. Solder resist layers 124 may be formed using processes and materials similar to those discussed above with respect to FIG. 6 and are not repeated. Openings may be made in the solder resist layers 124 in a likewise similar manner to that discussed above. The thickness $T_4$ of each solder resist layer may be between about 5 μm and about 50 μm, such as about 25 μm, though other thicknesses are contemplated. The overall thickness $T_5$ of interposer substrate 200 may be between about 30 μm and about 1500 μm, such as about 200 μm, though other thicknesses are contemplated.

Figure 20:
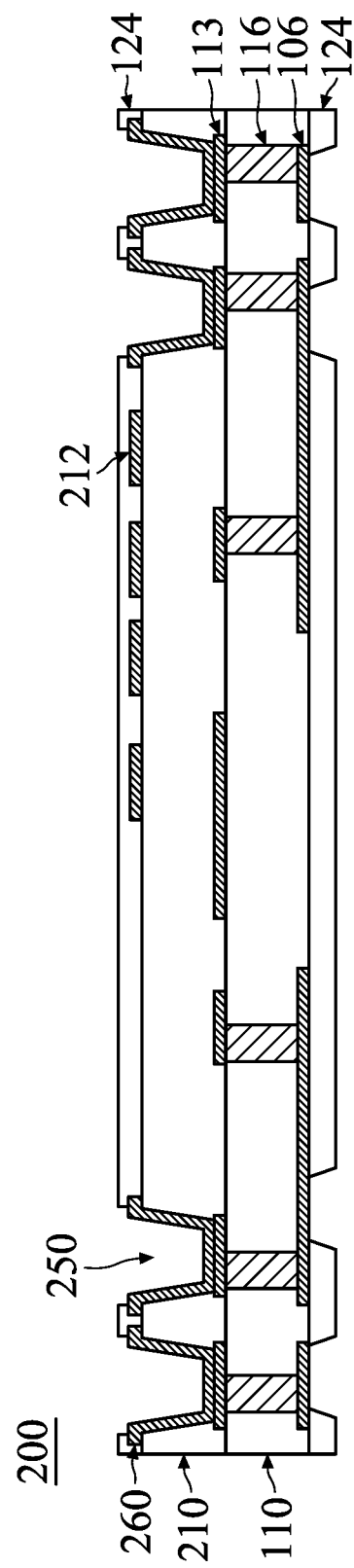

In FIG. 20, an optional metal liner 260 may be formed, where metal liner 260 lines the recesses 250 of the second substrate core 210 to provide an underbump metallization.

In some embodiments, metal liner 260 may be formed while the carrier substrate 102 is still attached and prior to the formation of solder resist layers 124, for example, after the formation of recesses 250 in FIG. 17. In other embodiments, metal liner 260 may be formed after the formation of the solder resist layers 124. Metal liner 260 may be one or more layers of copper, titanium, nickel, aluminum, compositions thereof, or the like, and may be formed using any appropriate process, such as by metal foil lamination, chemical vapor deposition (CVD), physical vapor deposition (PVD), and so forth. It should be understood that the metal liner 260 is optional, even if it is depicted in the Figures discussed below which include interposer substrate 200.

In some embodiments, to form metal liner 260 a seed layer (not shown) may be formed first over the substrate core 210. Next, a photoresist (not shown) is formed over the seed layer and patterned to expose the recesses 250. Then, the metal liner 260 may be formed in the recesses 250. Following the formation of the metal liner 260, the photoresist may be removed, such as by ashing, and the now exposed portions of the seed layer may be removed, such as by wet or dry etching.

In other embodiments, to form metal liner 260, a metal layer may be formed over the substrate core 210, and a photoresist (not shown) deposited over the metal layer. The photoresist may be patterned to expose the portions of the metal layer which are not to be kept and those portions may be removed, such as by wet or dry etching. The photoresist may be removed, such as by ashing, and the remaining portions of the metal layer may become the metal liner 260.

In FIG. 21, conductive connectors 126 are formed in the openings in the solder resist layers 124. The conductive connectors 126 may be formed using processes and material similar to any of those discussed above with respect to the conductive connectors 126 of FIG. 7.

Figure 23:
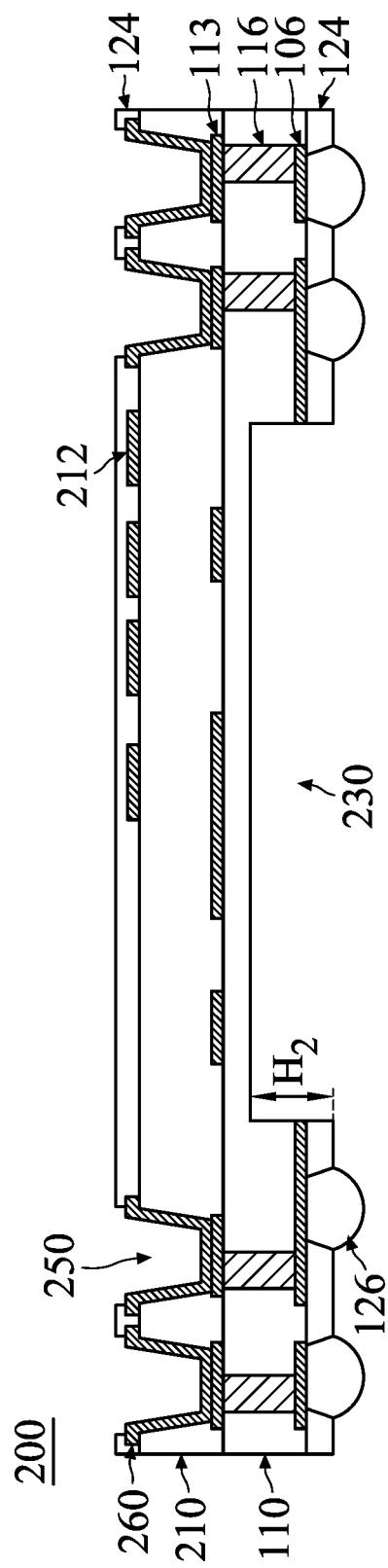
Figure 24:
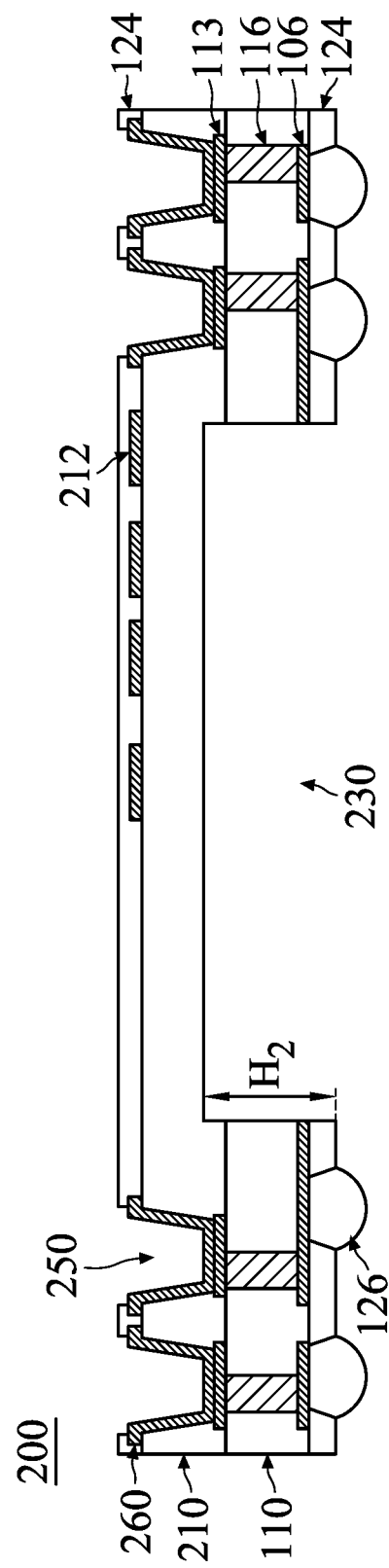

FIGS. 22 through 25 illustrate the interposer substrate 200 having a cavity 230 (FIGS. 22 through 24) or through hole 240 (FIG. 25) disposed therein, in accordance with some embodiments. Cavity 230 or through hole 240 may be formed using any of the processes discussed above with respect to cavity 130 and through hole 140, and are not repeated. Cavity 230 may have a height $H_2$ between about 20 μm and about 1470 μm, although other heights are contemplated and may be used. FIG. 22 illustrates an embodiment where cavity 230 is formed such that the height $H_2$ of the portion removed corresponds to the thickness of the substrate core 110. FIG. 23 illustrates an embodiment where cavity 230 is formed such that the height $H_2$ of the portion removed is less than the thickness of the substrate core 110. FIG. 24 illustrates an embodiment where cavity 230 is formed such that the height $H_2$ of the portion removed is greater than the thickness of the substrate core 110 and extends into, but not all the way through, the second substrate core 210. FIG. 25 illustrates an embodiment where through hole 240 extends completely through the substrate core 110 and the second substrate core 210.

FIG. 26 illustrates the interposer substrate 200 having reinforcing structures 120 and reinforcing structures 220 disposed therein, which may follow, for example, from the intermediate process illustrated in FIG. 16. It should be understood that reinforcing structures 220 are optional, such as discussed above.

FIGS. 27 through 30 illustrate the interposer substrate 200 having a cavity 230 (FIGS. 27 through 29) or through hole 240 (FIG. 30) disposed therein, in accordance with some embodiments. Cavity 230 or through hole 240 may be formed using any of the processes discussed above with respect to cavity 130 and through hole 140, and are not repeated. The embodiments illustrated in FIGS. 27 through 30 have reinforcing structures 120 (and/or reinforcing structures 122) and/or reinforcing structures 220 disposed with within their respective substrate cores.

FIG. 27 illustrates an embodiment where cavity 230 is formed such that the height $H_2$ of the portion removed corresponds to the thickness of the substrate core 110. Reinforcing structures 120 may be disposed in a peripheral portion of the substrate core 110 and reinforcing structures 220 may be disposed in a portion of the second substrate core 210 which is aligned with cavity 230 and/or be disposed in a peripheral portion of the second substrate core 210 around the cavity 230.

FIG. 28 illustrates an embodiment where cavity 230 is formed such that the height $H_2$ of the portion removed is less than the thickness of the substrate core 110. Reinforcing structures 120 may be disposed in a peripheral portion of the substrate core 110 and/or in a portion of the substrate core 110 aligned with cavity 230 and thinned by the process of forming cavity 230. Reinforcing structures 220 may be disposed in a portion of the second substrate core 210 which is aligned with cavity 230 and/or be disposed in a peripheral portion of the second substrate core 210 around the cavity 230.

FIG. 29 illustrates an embodiment where cavity 230 is formed such that the height $H_2$ of the portion removed is greater than the thickness of the substrate core 110 and extends into, but not all the way through, the second substrate core 210. Reinforcing structures 120 may be disposed in a peripheral portion of the substrate core 110. Reinforcing structures 220 may be disposed in a peripheral portion of the second substrate core 210 surrounding the cavity 230 and/or may be disposed in a portion of the second substrate core which is aligned with cavity 230 and may thinned by the process of forming cavity 230.

FIG. 30 illustrates an embodiment where through hole 240 extends completely through the substrate core 110 and the second substrate core 210. Reinforcing structures 120 may be disposed in a peripheral portion of the substrate core 110 and reinforcing structures 220 may be disposed in a peripheral portion of the second substrate core 210.

FIGS. 31 through 79 illustrate cross-sectional views of intermediate steps of a process for packaging the interposer substrate 100 or interposer substrate 200 with other devices to form various package components, in accordance with some embodiments. The package components may include multiple regions, and one interposer substrate 100 or interposer substrate 200 is packaged in each region. One region of the package components is illustrated.

Figure 31:
FIGS. 31 through 36 illustrate various intermediate steps in a process of forming a fan-out bottom package, in accordance with some embodiments.

FIGS. 31 through 42 illustrate cross-sectional views of intermediate steps of a process for forming a bottom fan-out package 300, in accordance with some embodiments. The formation of the bottom fan-out package 300 may be used in any of the embodiments discussed below. In FIG. 31 a carrier substrate 302 is provided, and a release layer 304 is formed on the carrier substrate 302. The carrier substrate 302 may be similar to any of the candidates for the carrier substrate 102 and release layer 304 may be similar to any of the candidates for the release layer 104, each discussed above with respect to FIG. 1. The top surface of the release layer 304 may be leveled and may have a high degree of coplanarity.

Figure 32:
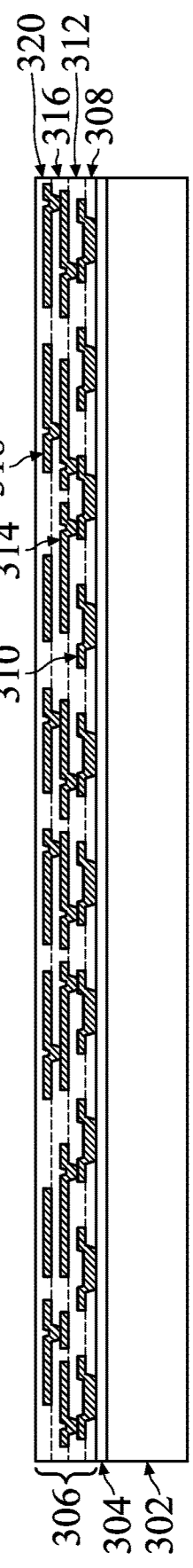

In FIG. 32, a first redistribution structure 306 is formed on the release layer 304. The first redistribution structure 306 includes dielectric layers 308, 312, 316, and 320; and metallization patterns 310, 314, and 318. The metallization patterns may also be referred to as redistribution layers or redistribution lines. The first redistribution structure 306 is shown as an example. More or fewer dielectric layers and metallization patterns may be formed in the first redistribution structure 306. If fewer dielectric layers and metallization patterns are to be formed, steps and process discussed below may be omitted. If more dielectric layers and metallization patterns are to be formed, steps and processes discussed below may be repeated.

As an example to form the first redistribution structure 306, the dielectric layer 308 is deposited on the release layer 304. In some embodiments, the dielectric layer 308 is formed of a photo-sensitive material such as polybenzoxazole (PBO), polyimide, benzocyclobutene (BCB), or the like, which may be patterned using a lithography mask. The dielectric layer 308 may be formed by spin coating, lamination, CVD, the like, or a combination thereof. The dielectric layer 308 is then patterned. The patterning forms openings exposing portions of the release layer 304. The patterning may be by an acceptable process, such as by exposing the dielectric layer 308 to light when the dielectric layer 308 is a photo-sensitive material or by etching using, for example, an anisotropic etch. If the dielectric layer 308 is a photo-sensitive material, the dielectric layer 308 can be developed after the exposure.

The metallization pattern 310 is then formed. The metallization pattern 310 includes conductive lines on and extending along the major surface of the dielectric layer 308. The metallization pattern 310 further includes conductive vias extending through the dielectric layer 308. To form the metallization pattern 310, a seed layer is formed over the dielectric layer 308 and in the openings extending through the dielectric layer 308. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A photo resist is then formed and patterned on the seed layer. The photo resist may be formed by spin coating or the like and may be exposed to light for patterning. The pattern of the photo resist corresponds to the metallization pattern 310. The patterning forms openings through the photo resist to expose the seed layer. A conductive material is then formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 310. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching.

The dielectric layer 312 is deposited on the metallization pattern 310 and dielectric layer 308. The dielectric layer 312 may be formed in a manner similar to the dielectric layer 308, and may be formed of the same material as the dielectric layer 308.

The metallization pattern 314 is then formed. The metallization pattern 314 includes conductive lines on and extending along the major surface of the dielectric layer 312. The metallization pattern 314 further includes conductive vias extending through the dielectric layer 312 to be physically and electrically connected to the metallization pattern 310. The metallization pattern 314 may be formed in a manner similar to the metallization pattern 310, and may be formed of the same material as the metallization pattern 310. The conductive vias of the metallization pattern 314 have smaller width than the conductive vias of the metallization pattern 310. As such, when patterning the dielectric layer 312 for the metallization pattern 314, the width of the openings in the dielectric layer 312 are smaller than the width of the openings in the dielectric layer 308.

The dielectric layer 316 is deposited on the metallization pattern 314 and dielectric layer 312. The dielectric layer 316 may be formed in a manner similar to the dielectric layer 308, and may be formed of the same material as the dielectric layer 308.

The metallization pattern 318 is then formed. The metallization pattern 318 includes conductive lines on and extending along the major surface of the dielectric layer 316. The metallization pattern 318 further includes conductive vias extending through the dielectric layer 316 to be physically and electrically connected to the metallization pattern 314. The metallization pattern 318 may be formed in a manner similar to the metallization pattern 310, and may be formed of the same material as the metallization pattern 310. The conductive vias of the metallization pattern 318 have smaller width than the conductive vias of the metallization pattern 310. As such, when patterning the dielectric layer 316 for the metallization pattern 318, the width of the openings in the dielectric layer 316 are smaller than the width of the openings in the dielectric layer 308.

The dielectric layer 320 is deposited on the metallization pattern 318 and dielectric layer 316. The dielectric layer 320 may be formed in a manner similar to the dielectric layer 308, and may be formed of the same material as the dielectric layer 308.

Figure 33:
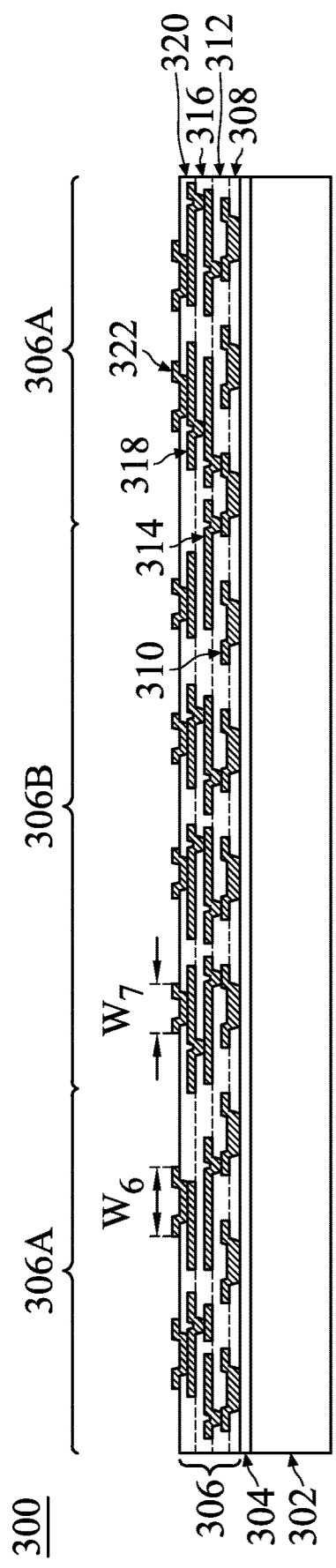

In FIG. 33, the UBMs 322 are formed on and extend through the dielectric layer 320. As an example to form the UBMs 322, the dielectric layer 320 may be patterned to form openings exposing portions of the metallization pattern 318. The patterning may be by an acceptable process, such as by exposing the dielectric layer 320 to light when the dielectric layer 320 is a photo-sensitive material or by etching using, for example, an anisotropic etch. If the dielectric layer 320 is a photo-sensitive material, the dielectric layer 320 can be developed after the exposure. In some embodiments, the openings for the UBMs 322 may be wider than the openings for the conductive via portions of the metallization patterns 310, 314, and 318. In some embodiments, the openings of the UBMs 322 may be narrower than or about the same width as the openings for the conductive via portions of the metallization patterns 310, 314, and 318. A seed layer is formed over the dielectric layer 320 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 322. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, nickel, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBMs 322. In embodiments where the UBMs 322 are formed differently, more photoresist and patterning steps may be utilized.

The UBMs 322 may not all have the same width. In some embodiments, a first subset of the UBMs 322 in a first region 306A of the first redistribution structure 306 have a first width $W_6$, and a second subset of the UBMs 322 in a second region 306B of the first redistribution structure 306 have a second width $W_7$. The first width $W_6$ may be different from the second width $W_7$, and in some embodiments the first width $W_6$ is greater than the second width $W_7$. Width $W_6$ may be between about 100 µm and about 250 µm, such as about 170 µm, though other values are contemplated and may be used. Width $W_7$ may be between about 30 µm and about 70 µm, such as about 48 µm, though other values are contemplated and may be used.

Figure 34:
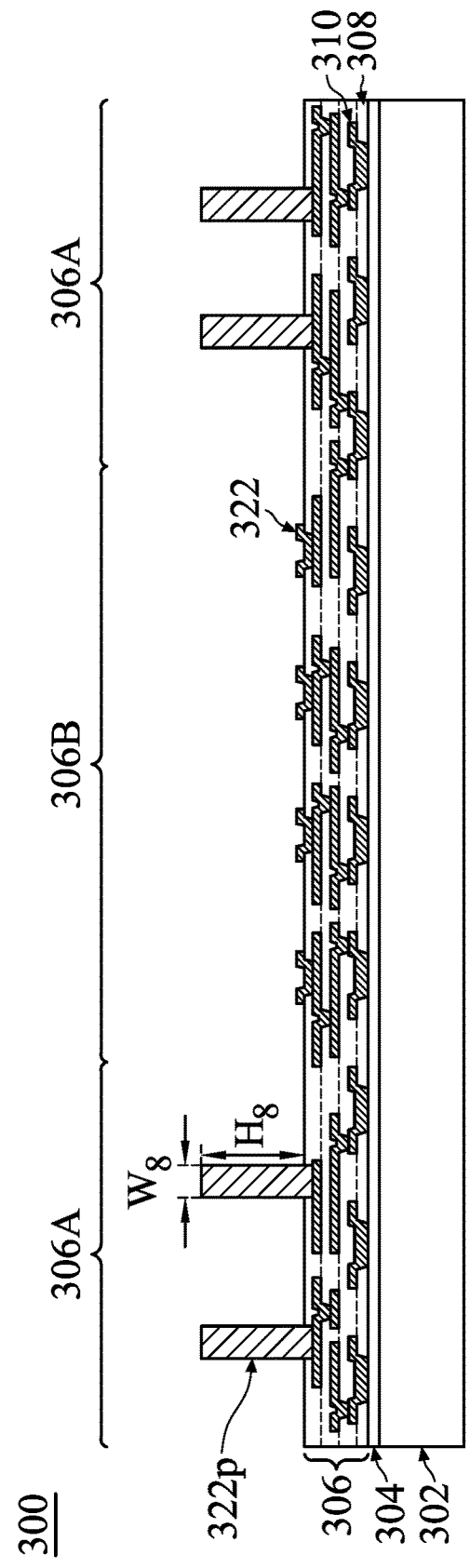

In FIG. 34, some or all of the UBMs 322 of the first region 306A may instead be formed into conductive pillars 322p, in accordance with some embodiments. Conductive pillars 322p may be formed by continuing plating UBMs 322 of the first region 306A through the photoresist until conductive pillars 322p reach a desired height $H_8$, such as between about 10 µm and about 150 µm, such as about 60 µm, though other values are contemplated and may be used. In some embodiments, the width $W_8$ of the conductive pillars may correspond to the openings in the dielectric layer 320 which was patterned to expose portions of the metallization pattern 318. In some embodiments, the width $W_8$ may be wider or narrower than the openings in the dielectric layer 320. Width $W_8$ may be between about 80 µm and about 230 µm, such as about 150 µm, though other values are contemplated and may be used.

Figure 35:
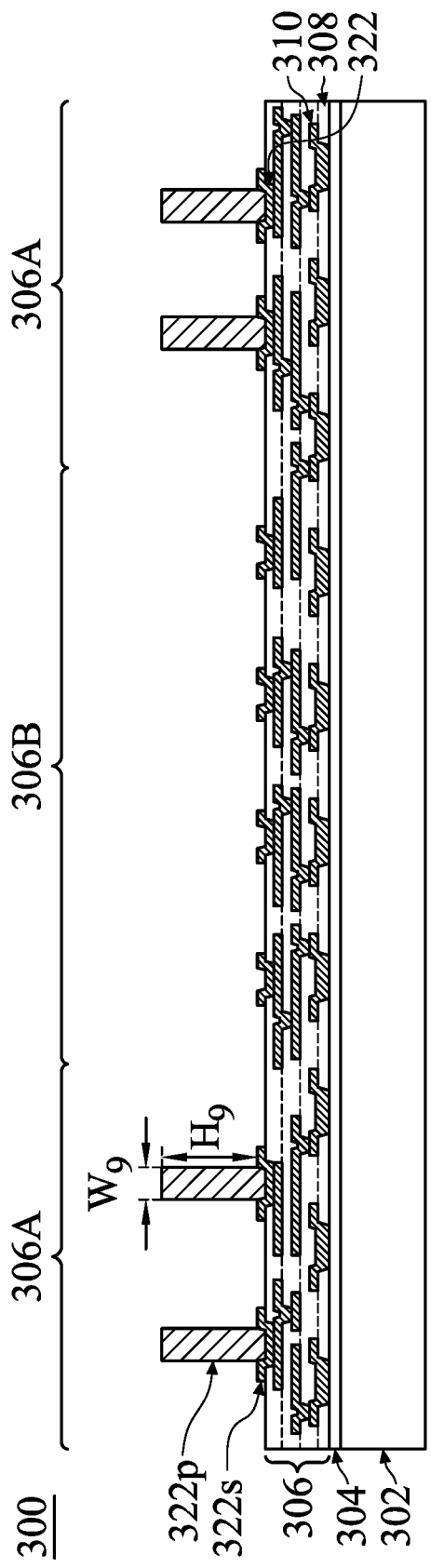

In FIG. 35, some or all of the UBMs 322 of the first region 306A may have conductive pillars 322p disposed thereon, in accordance with some embodiments. After forming the UBMs 322, another photoresist may be formed by spin coating or the like and exposed to light for patterning. The pattern of the photoresist corresponds to the pattern for the conductive pillars 322p. The patterning forms openings in the photoresist to expose the UBMs 322. The conductive material of conductive pillars 322p may be formed by plating, such as electroplating or electroless plating, or the like, until conductive pillars 322p reach a desired height $H_9$, such as between about 10 µm and about 150 µm, such as about 60 µm, though other values are contemplated and may be used. The width $W_9$ of the conductive pillars corresponds to the width of the openings of the pattern of the photoresist. Width $W_9$ may be between about 80 µm and about 230 µm, such as about 150 µm, though other values are contemplated and may be used. The conductive material may comprise a metal, like copper, titanium, tungsten, aluminum, or the like. Then, the photoresist is removed. The photoresist may be removed by an acceptable ashing or stripping process, such as using an oxygen plasma or the like. The resulting structure may have a shoulder 322s of the UBMs 322 surrounding the base of the conductive pillars 322p.

Although the remaining Figures illustrate conductive pillars 322p which are configured as described with respect to FIG. 35, it should be understood that conductive pillars 322p which are configured as described with respect to FIG. 34 (i.e., without UBM 322) may be substituted as appropriate unless otherwise noted.

Figure 36:
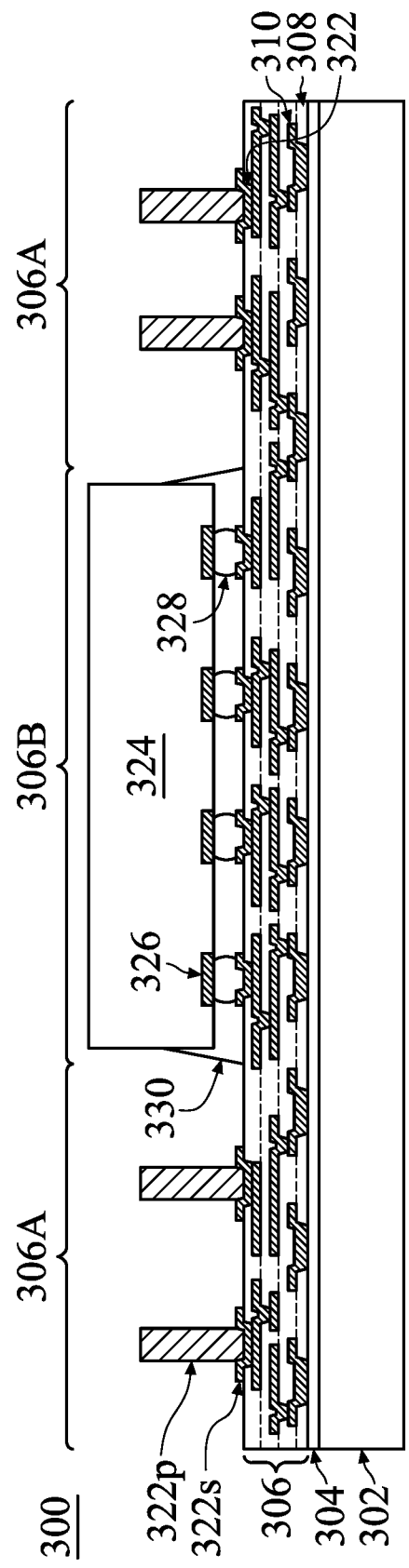

FIGS. 36 through 45 illustrate various intermediate steps in a process of forming a package structure including a fan-out bottom package and an interposer, in accordance with some embodiments. In FIG. 36, an integrated circuit die 324 is placed over the first redistribution structure 306. The integrated circuit die 324 may be a logic die (e.g., central processing unit, microcontroller, etc.), memory die (e.g., dynamic random access memory (DRAM) die, static random access memory (SRAM) die, etc.), power management die (e.g., power management integrated circuit (PMIC) die), radio frequency (RF) die, sensor die, micro-electro-mechanical-system (MEMS) die, signal processing die (e.g., digital signal processing (DSP) die), front-end die (e.g., analog front-end (AFE) die), the like, or a combination thereof (e.g., a system-on-chip (SoC)).

The integrated circuit die 324 includes a semiconductor substrate, with devices such as transistors, diodes, capacitors, resistors, etc., formed in and/or on the semiconductor substrate. The devices may be interconnected by interconnect structures formed by, for example, metallization patterns in one or more dielectric layers on the semiconductor substrate to form an integrated circuit. The integrated circuit die 324 further comprises pads 326, such as aluminum pads, to which external connections are made. The pads 326 are on what may be referred to as respective active sides of the integrated circuit die 324, and may be in uppermost layers of the interconnect structures. Because the active side of the integrated circuit die 324 faces toward the first redistribution structure 306, the first redistribution structure 306 may also be referred to as a front-side redistribution structure. And because the active side of the integrated circuit die 324 faces downward toward the first redistribution structure 306, the resulting package may be referred to as a bottom fan-out package. Conductive connectors 328 may be formed on the pads 326. The conductive connectors 328 may be formed from a conductive material such as solder, copper, aluminum, gold, nickel, silver, palladium, tin, the like, or a combination thereof. In some embodiments, the conductive connectors 328 are solder connectors.

The integrated circuit die 324 may be aligned and placed using, e.g., a pick-and-place tool. The integrated circuit die 324 is placed on the redistribution structure 306 such that the conductive connectors 328 are aligned with the UBMs 322 in the second region 306B. After the integrated circuit die 324 is placed, the conductive connectors 328 are reflowed to form joints between corresponding UBMs 322 and pads 326, physically and electrically connecting the integrated circuit die 324 to the first redistribution structure 306.

An underfill 330 may be formed between the integrated circuit die 324 and first redistribution structure 306, surrounding the conductive connectors 328. As such, the conductive connectors 328 may be protected from mechanical forces. The underfill 330 may be formed by a capillary flow process after the integrated circuit die 324 is attached, or may be formed by a suitable deposition method before the integrated circuit die 324 is attached.

Figure 37:
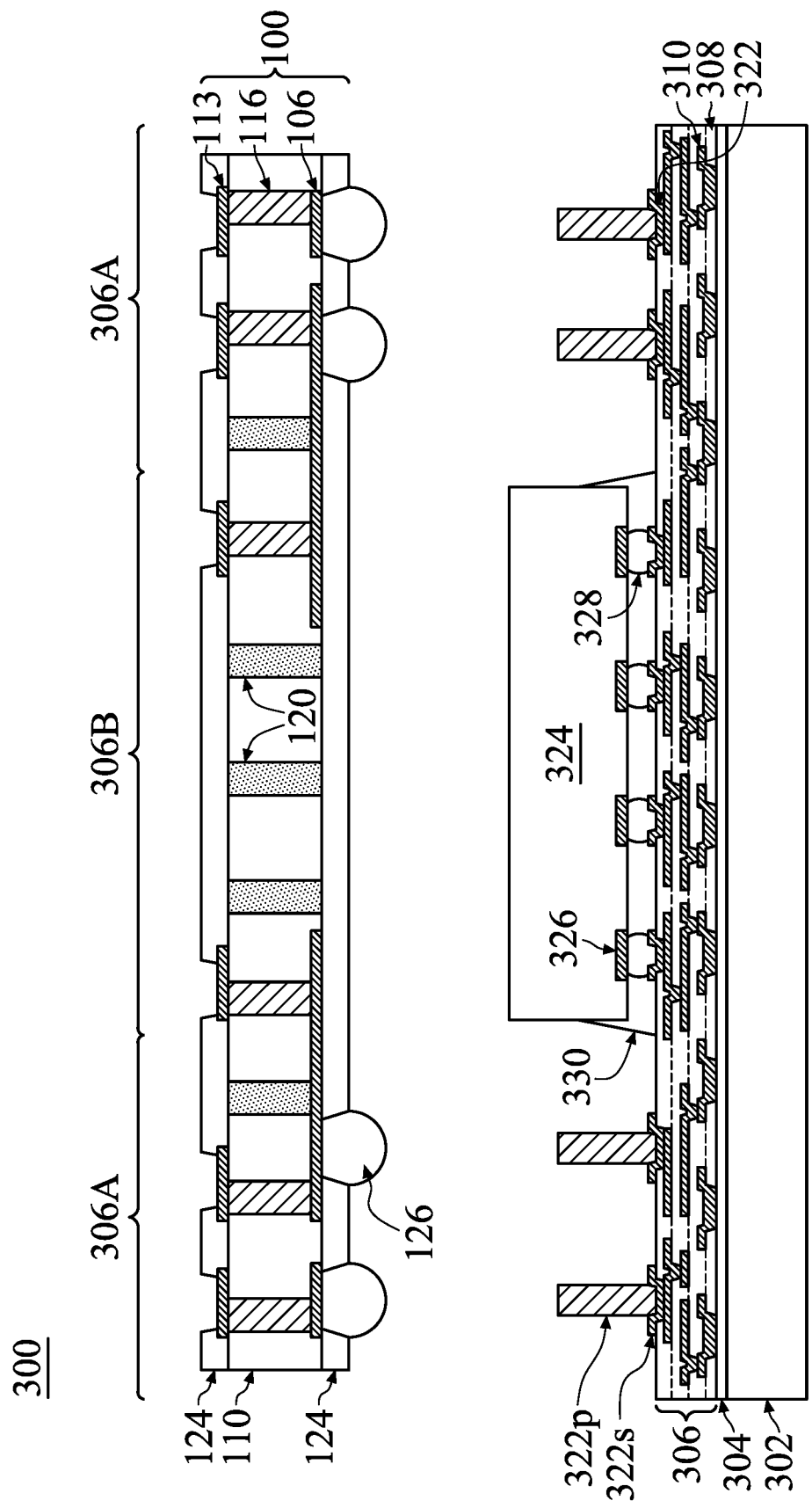

In FIG. 37, the interposer substrate 100 (see, e.g., FIG. 7) is aligned to the conductive pillars 322p to couple the conductive connectors 126 to respective ones of the conductive pillars 322p, in accordance with some embodiments. The interposer substrate 100 may be aligned and placed using, e.g., a pick-and-place tool. The interposer substrate 100 is placed on the redistribution structure 306 such that the conductive connectors 126 are aligned with the UBMs 322 and/or conductive pillars 322p in the first region 306A.

Figure 38:
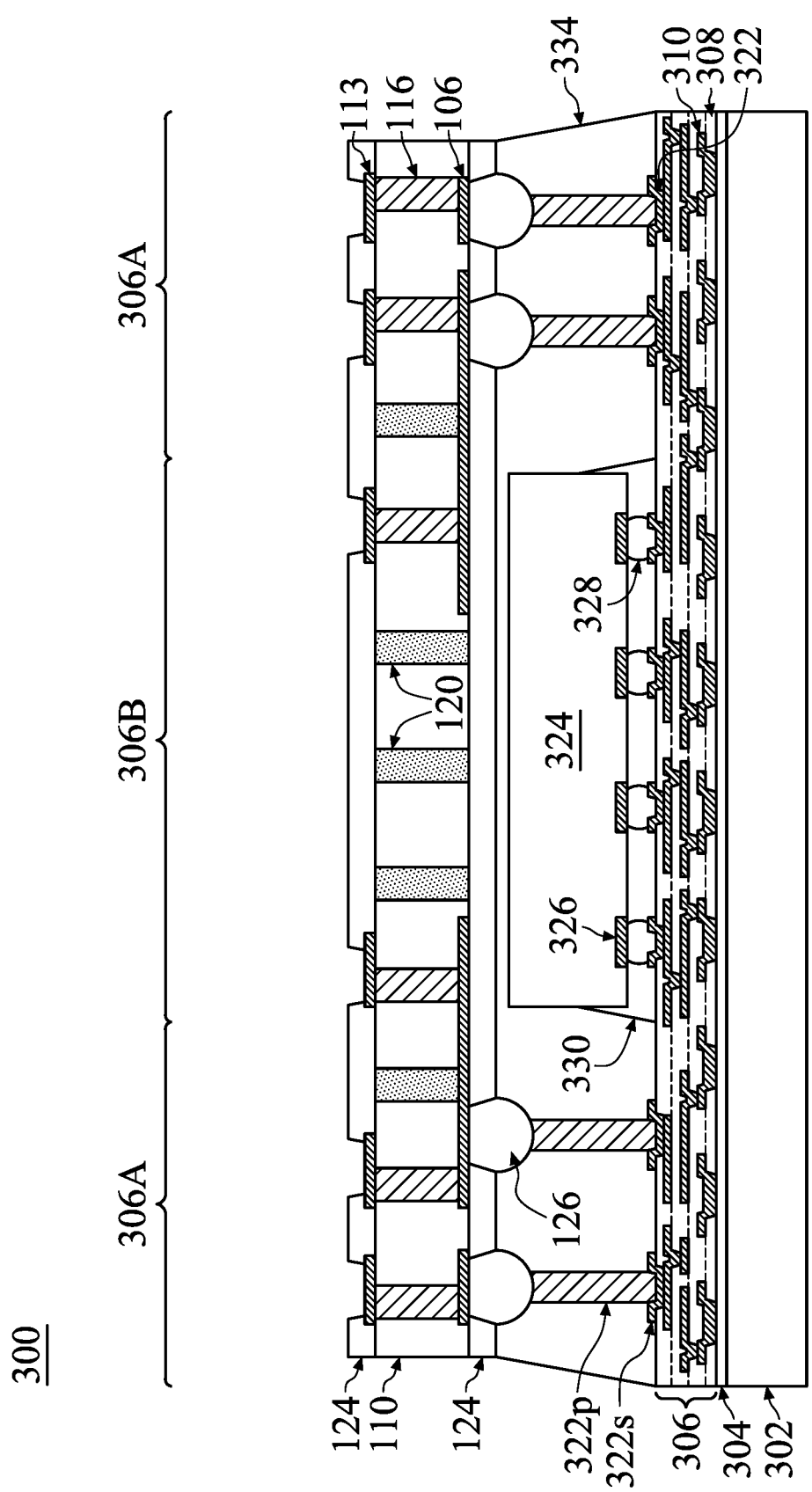

In FIG. 38, after the interposer substrate 100 is placed, the conductive connectors 126 are reflowed to form joints between corresponding conductive pillars 322p and conductive lines 106, physically and electrically connecting the interposer substrate 100 to the first redistribution structure 306. An encapsulant 334 is formed on the various components. The encapsulant 334 may be a molding compound, epoxy, or the like, and may be applied by compression molding, transfer molding, or the like. The encapsulant 334 may be formed over the first redistribution structure 306 such that the integrated circuit die 324 is buried or covered and the space between the interposer substrate 100 and redistribution structure 306 is filled. The encapsulant 334 is then cured. In some embodiments, the encapsulant 334 is also formed between the first redistribution structure 306 and the integrated circuit die 324, for example, in embodiments where the underfill 330 is omitted.

Figure 39:
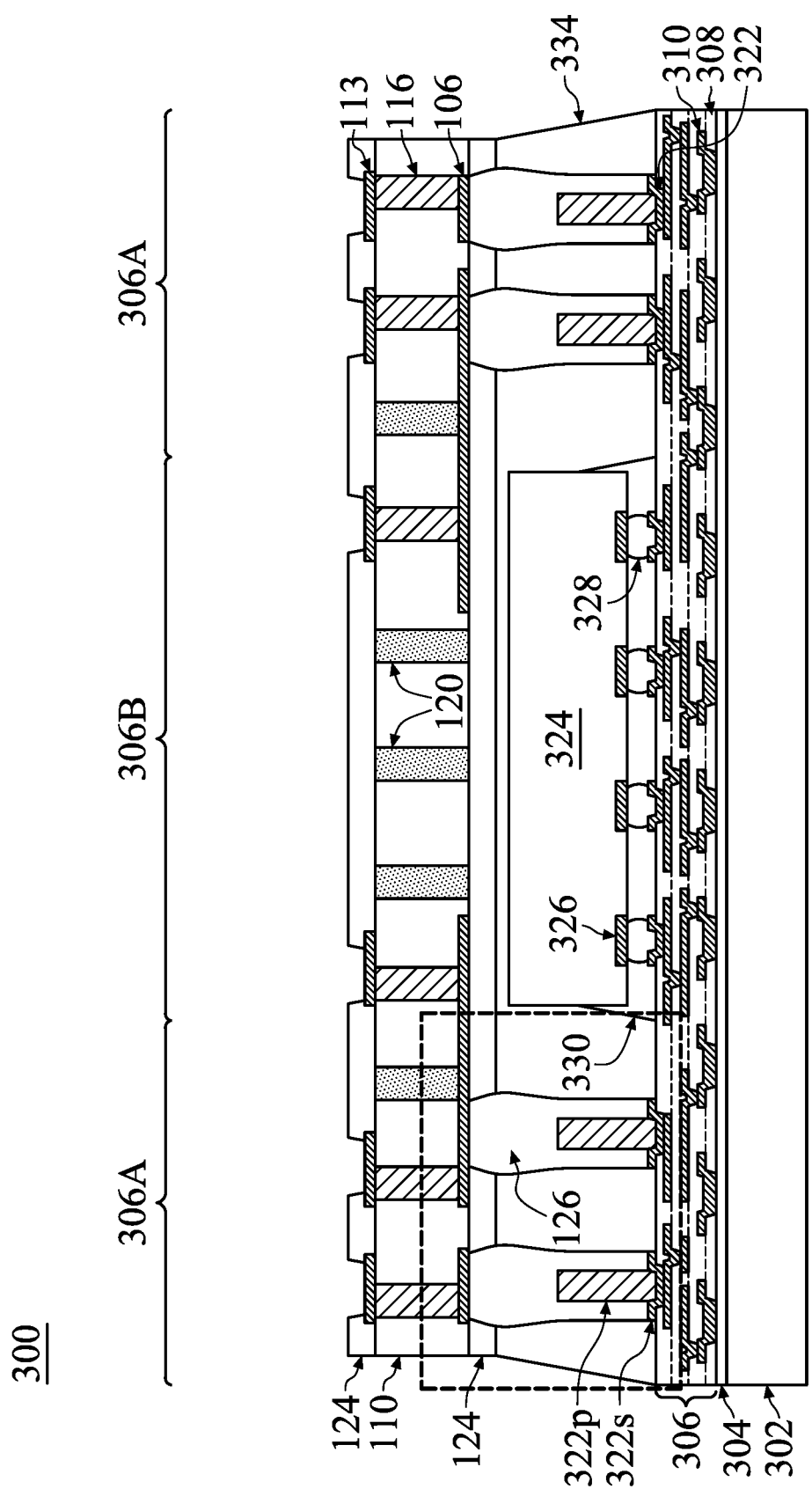

In some embodiments, such as illustrated in FIG. 39, the conductive connectors 126 may be reflowed to form around the conductive pillars 322p. After the integrated circuit die 324 is placed, the conductive connectors 126 are reflowed to form joints between corresponding conductive pillars 322p and conductive lines 106, physically and electrically connecting the interposer substrate 100 to the first redistribution structure 306. In such embodiments, the conductive connectors 126 may be formed with an amount of material such that the material extends down the entire length of the conductive pillar 322p and contacts the shoulder 322s portion of the UBMs 322, thereby embedding the conductive pillar 322p in the material of the conductive connectors 126. The shoulder 322s portion of the UBMs 322 may also be referred to as a "step." The box drawn in dashed lines is enlarged in FIG. 40.

Figure 40:
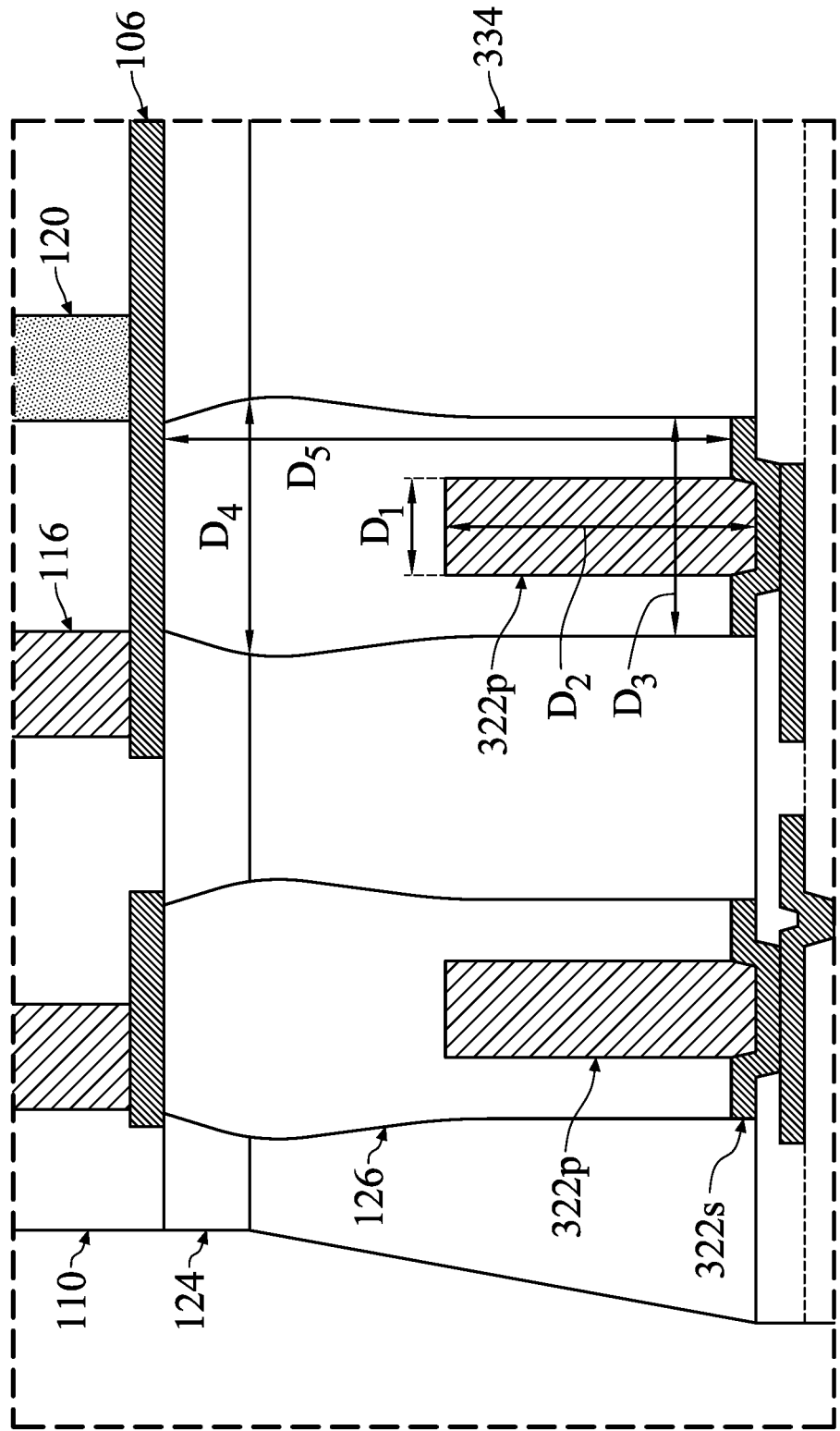

In FIG. 40, an enlarged view of the connections of FIG. 39 is provided, in accordance with some embodiments. As shown in FIG. 39, after reflow, the material of conductive connector 126 extends down the conductive pillar 322p, covering the top and sidewalls of conductive pillar 322p. The material of conductive connector 126 extends to the shoulder 322s of UBM 322 which surrounds the conductive pillar 322p. The material of conductive connector 126 is formed within the lateral extents of the UBMs 322. As the material of conductive connector 126 is reflowed, the conductive pillar 322p acts as a template for the material to flow around, forming a substantially uniform layer of the material on the sidewalls of the conductive pillar 322p. The shoulder 322s or step of the UBMs 322 acts as a template to define the limit of the outer width of the reflowed conductive connector 126. The conductive pillar 322p has a width $D_1$ which may be between about 80 μm and about 230 μm, and a height $D_2$ which may be between about 10 μm and about 150 μm. The conductive connector 126 may have a width $D_3$ surrounding the conductive pillar 322p between about 100 μm and about 250 μm, where $D_3$ is greater than $D_1$. In some embodiments, the width $D_4$ above the conductive pillar 322p may be equal to the width $D_3$ surrounding the conductive pillar 322p, producing a ratio $D_4/D_3$ equal to 1. In some embodiments, $D_4$ may be less than or larger than $D_3$ where the ratio of $D_4/D_3$ is between about 0.8 and about 1.4. The height $D_5$ of the conductive connector 126 after reflow corresponds to the space between the substrate core 110 of interposer substrate 100 and redistribution structure 306 and may be between about 80 μm and about 180 μm. It should be understood that these dimensions are examples and other dimensions may be used as appropriate.

Because the conductive pillar 322p is encapsulated by the material of the conductive connector 126, a strong joint is formed which can better withstand warpage stresses induced by CTE mismatch between differently formed structures, such as the interposer substrate 100 and redistribution structure 306. Withstanding warpage stresses reduces joint failure and reduces warpage. The process of forming the joint between conductive pillar 322p and conductive connector 126 also has the advantage of providing a reduced risk of bridging to other connectors because the conductive pillar 322p and shoulder 322s act as templates to control the reflow. The process enables good self-alignment despite also enabling fine-pitch joints. The robust joint provides high joint rate and joint reliability. Also, the process provides for controlled joint standoff using conductive pillars 322p.

Figure 41:
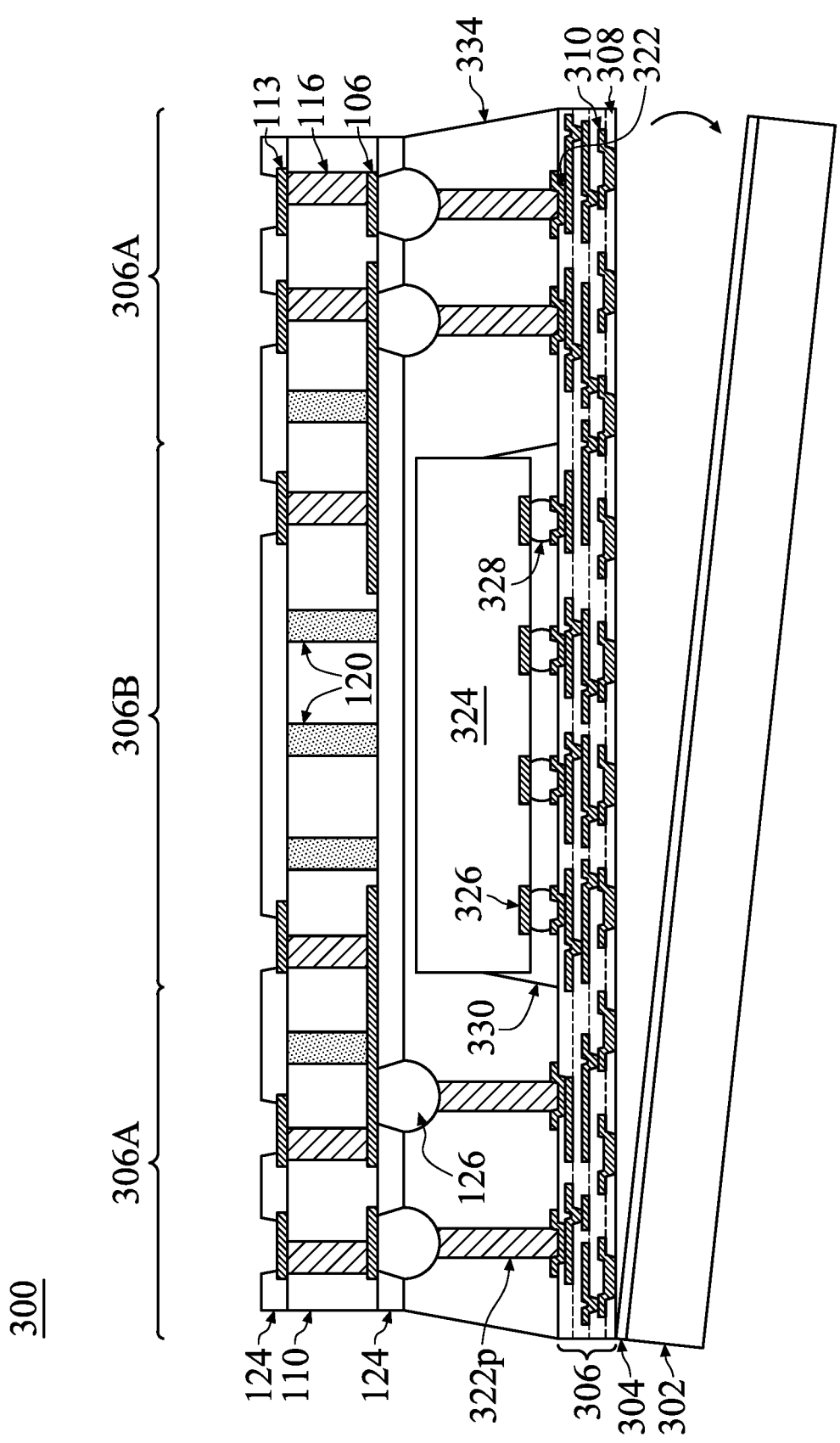

In FIG. 41, the carrier substrate 302 is removed. The carrier substrate 302 may be detached (or "de-bonded") from the redistribution structure 306. In some embodiments, the de-bonding includes projecting a light such as a laser light or an UV light on the release layer 304 so that the release layer 304 decomposes under the heat of the light and the carrier substrate 302 can be removed. The structure is then flipped over and placed on a tape. The de-bonding exposes the metallization patterns 310 of the redistribution structure 306.

Figure 42:
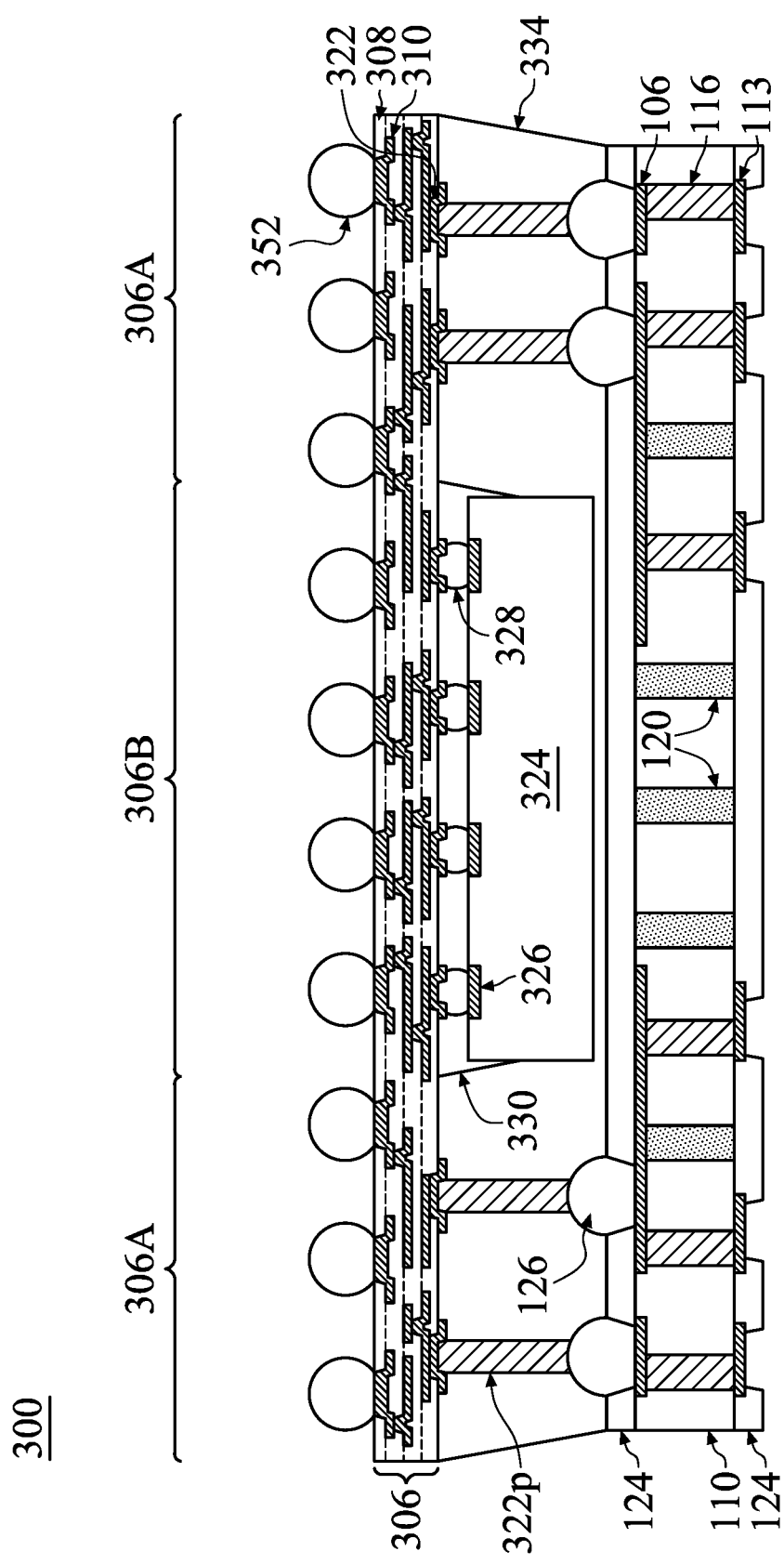

In FIG. 42, conductive connectors 352 are formed over the redistribution structure 306. The conductive connectors 352 contact the exposed portions of the metallization patterns 310. In some embodiments, a passivation layer may be used over the metallization patterns 310 and patterned to expose a portion of the metallization patterns 310 prior to forming the conductive connectors 352. In some embodiments, UBMs may be formed over the exposed portions of the metallization patterns 310. In such embodiments, the UBMs may be formed using processes and materials similar to UBMs 322. The conductive connectors 352 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 352 may include a conductive material such as solder, copper, aluminum, gold, nickel, silver, palladium, tin, the like, or a combination thereof. In some embodiments, the conductive connectors 352 are solder connectors that are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 352 comprise metal pillars (such as a copper pillar) formed by a printing, electro plating, electroless plating, chemical vapor deposition (CVD), physical vapor deposition (PVD), and so forth. The metal pillars may be solder free and have substantially vertical sidewalls. After forming the conductive connectors 352, the structure may be flipped over and placed on a tape or secured by the conductive connectors 352. In some embodiments, package 300 may be singulated directly into dies on a tape after forming the conductive connectors 352 (not shown).

Figure 43:
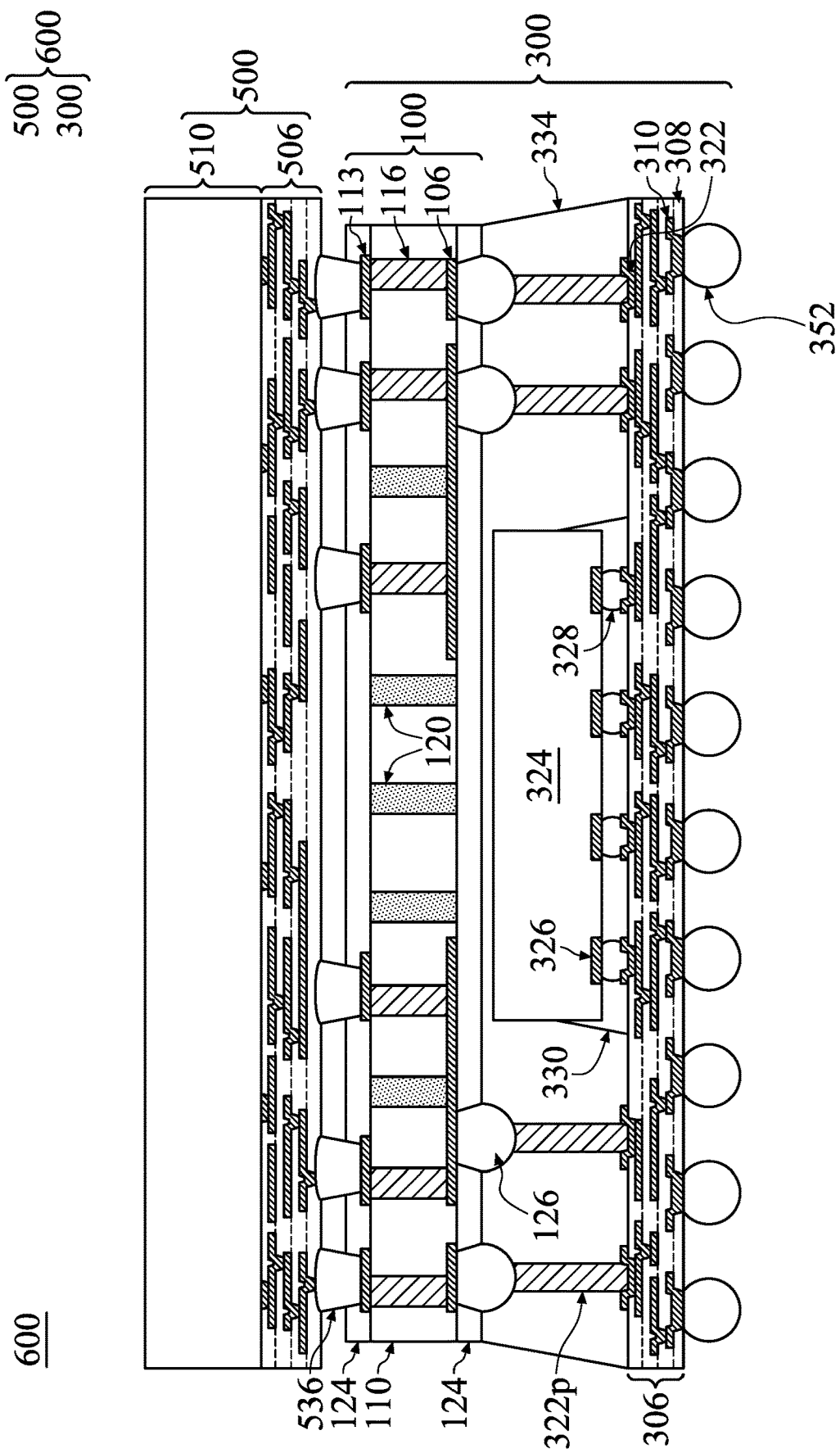

In FIG. 43, device 500 may be mounted to interposer substrate 100 to form 3D package 600. Device 500 may include integrated circuit dies or another interposer. Device 500 may include an optional redistribution structure 506 and a device substrate 510. Redistribution structure 506 may be formed using processes and materials similar to those discussed above with respect to redistribution structure 306. Device substrate 510 may include integrated circuit dies including antennas, memory dies, RF dies, passive devices, or combinations thereof, and the like. The integrated circuit dies may include a semiconductor substrate, with devices such as transistors, diodes, capacitors, resistors, etc., formed in and/or on the semiconductor substrate. The devices may be interconnected by interconnect structures formed by, for example, metallization patterns in one or more dielectric layers on the semiconductor substrate to form an integrated circuit. Device 500 may include conductive connectors 536 formed on redistribution structure 506. The conductive connectors 536 may be formed from a conductive material such as solder, copper, aluminum, gold, nickel, silver, palladium, tin, the like, or a combination thereof. Device 500 may be mounted to interposer substrate 100 by coupling the conductive connectors 536 to exposed portions of the conductive lines 113 through the solder resist layer 124. In some embodiments, the conductive connectors 536 are reflowed to attach the device 500 to the conductive lines 113.

Figure 44:
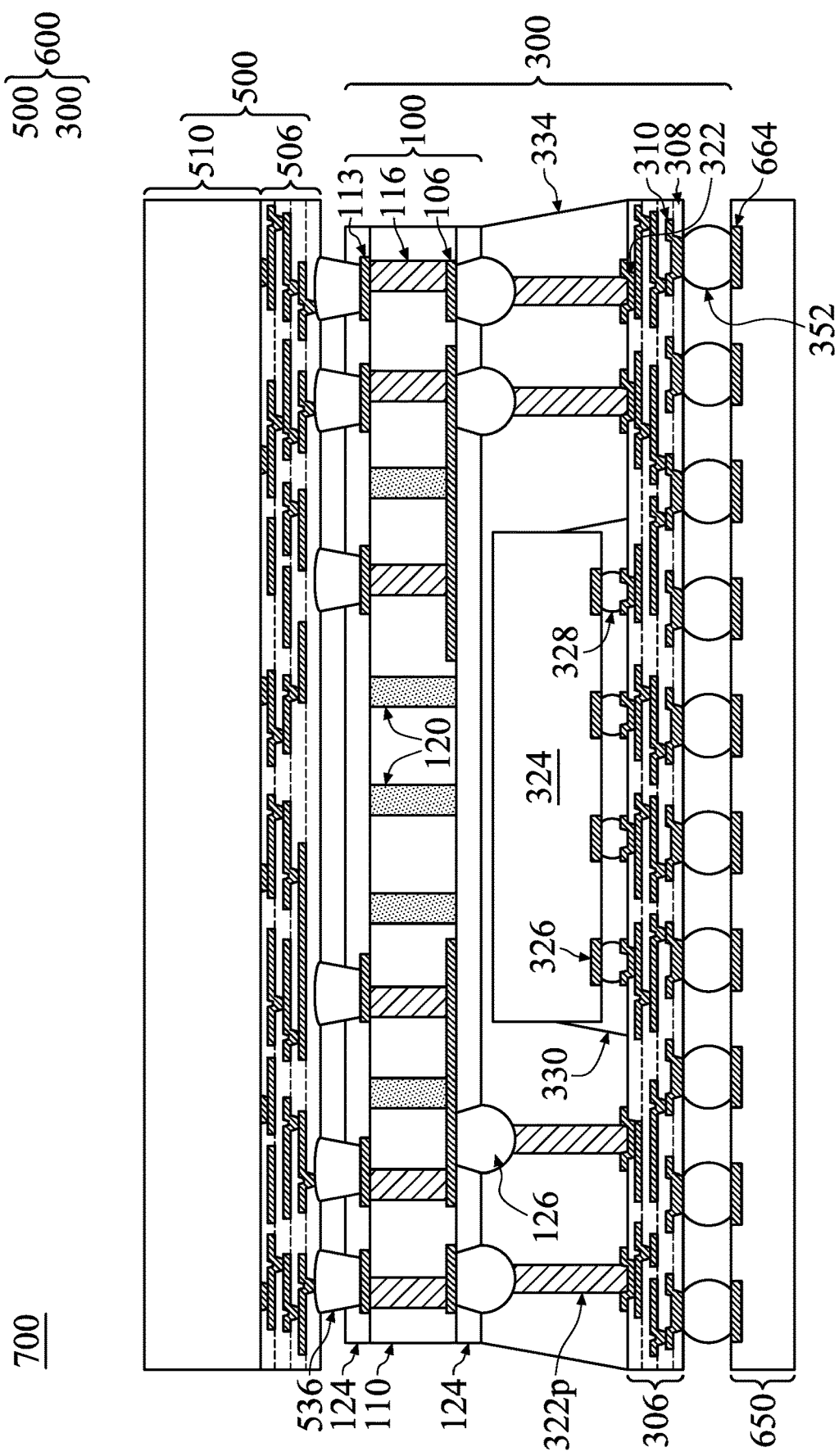

In FIG. 44, package 600 (see, e.g., FIG. 43) may be mounted to a package substrate 650 using conductive connectors 352 to form 3D package 700. The package substrate 650 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 650 may be a silicon-on-insulator (SOI) substrate. Generally, an SOI substrate includes a layer of a semiconductor material such as epitaxial silicon, germanium, silicon germanium, SOI, silicon-germanium-on-insulator (SGOI), or combinations thereof. The package substrate 650 is, in one alternative embodiment, based on an insulating core such as a fiberglass reinforced resin core. One example core material is fiberglass resin such as FR4. Alternatives for the core material include bismaleimide-triazine (BT) resin, or alternatively, other PCB materials or films. Build-up films such as Ajinomoto Build-up film (ABF), multi-layer core (MLC) substrate, or other laminates may be used for package substrate 650.

The package substrate 650 may include active and passive devices (not shown). As one of ordinary skill in the art will recognize, a wide variety of devices such as transistors, capacitors, resistors, combinations of these, and the like may be used to generate the structural and functional requirements of the design for the package substrate 650. The devices may be formed using any suitable methods.

The package substrate 650 may also include metallization layers and vias (not shown) and bond pads 664 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 650 is substantially free of active and passive devices.

In some embodiments, the conductive connectors 352 are reflowed to attach the package 600 (FIG. 43) to the bond pads 664 of package substrate 650. The conductive connectors 352 electrically and/or physically couple the package substrate 650, including metallization layers in the package substrate 650, to the redistribution structure 306 of the package 300. In some embodiments, passive devices (e.g., surface mount devices (SMDs), not illustrated) may be attached to package 300 (e.g., bonded to the surface of redistribution structure 306) prior to mounting on the package substrate 650. In such embodiments, the passive devices may be bonded to a same surface of the package 300 as the conductive connectors 352.

In some embodiments, an underfill (not shown) may be formed between the package 300 and the package substrate 650 and surrounding the conductive connectors 352. The underfill may be formed by a capillary flow process after the package 600 (FIG. 43) is attached or may be formed by a suitable deposition method before the package 600 is attached.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 45:
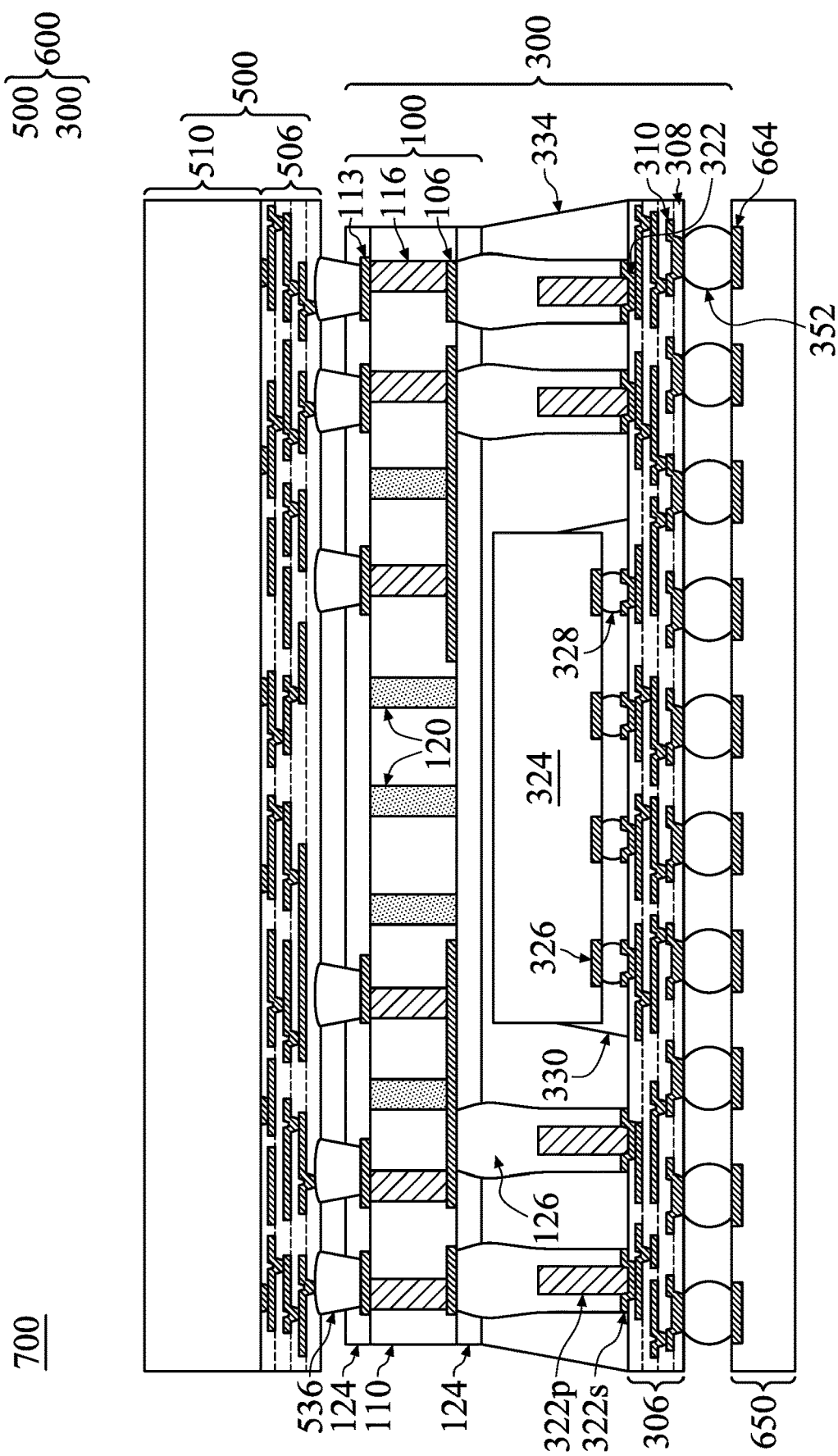

FIG. 45 illustrates a package 700 which is similar to package 700 of FIG. 44, except that the package 300 is formed as discussed above with respect to FIG. 39, that is, having conductive connectors 126 which extend down conductive pillar 322p and contacting shoulder 322s.

Figure 46:
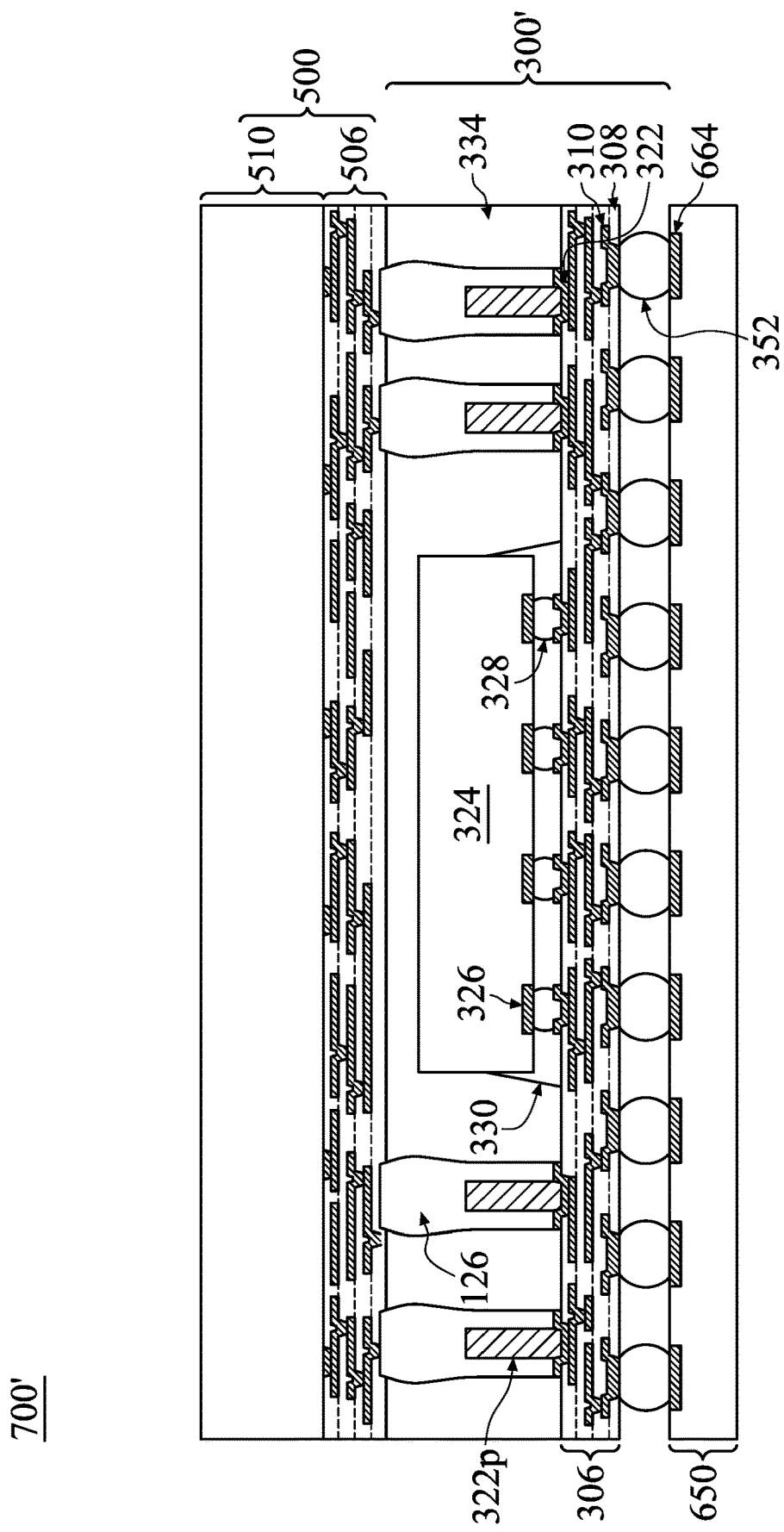
FIGS. 46 through 47 illustrate views of a package which includes a fan-out bottom package and a second device attached together without an interposer, but using connectors which surround a metal pillar, in accordance with some embodiments.
Figure 47:
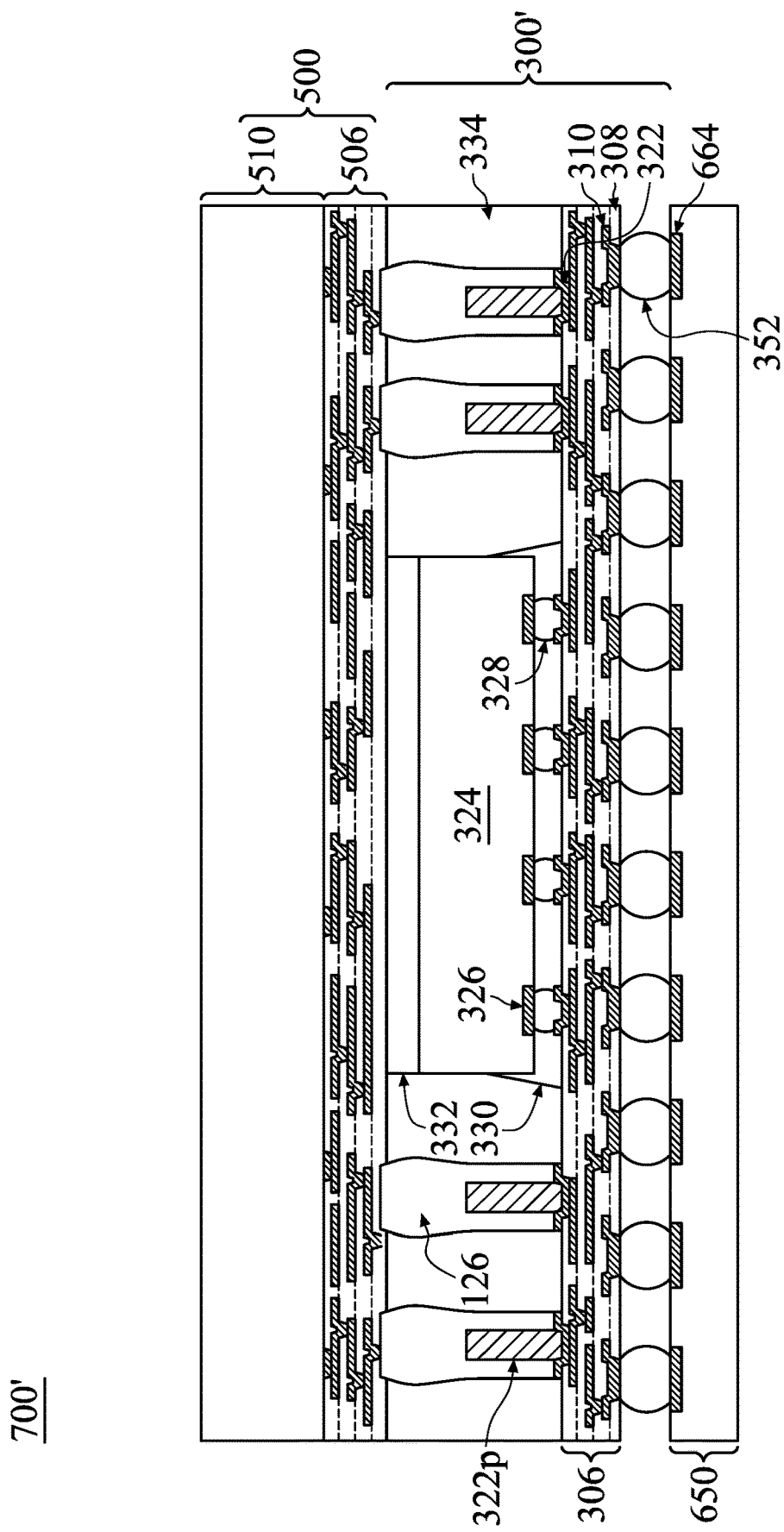

FIGS. 46 through 47 illustrate views of a package which includes a fan-out bottom package and a second device attached together without an interposer, but using connectors which surround a metal pillar, in accordance with some embodiments. FIG. 46 illustrates a package 700' which is similar to package 700 of FIG. 45, except that the interposer substrate 100 is not included. As discussed above, one of the purposes of interposer substrate 100 may be to provide support to reduce warpage and reduce the chance of failing joints between packages. The conductive connectors 126, such as discussed above with respect to FIGS. 39 and 40 provide a strong connection such that, in some embodiments, the interposer substrate 100 may be omitted. In such embodiments, device 500 may be mounted to conductive pillars 322p in a manner similar to the mounting of interposer substrate 100 to conductive pillars 322p discussed above with respect to FIGS. 39 and 40.

FIG. 47 illustrates a package 700' which is similar to package 700' of FIG. 46, except that an adhesive layer 332 may be used between the device 500 and the integrated circuit die 324. Adhesive layer 332 may be any suitable adhesive, epoxy, underfill, die attach film (DAF), thermal interface material, or the like. The adhesive layer 332 may be applied to a back-side of the integrated circuit dies 324 or may be applied to a die attach area of the device 500, for each integrated circuit die 324. For example, the adhesive layer 332 may be applied to the back-side of the integrated circuit dies 324 before singulating to separate the integrated circuit dies 324, or may be applied to the front-side of the device 500 before singulating to separate the device 500. In some embodiments, the adhesive layer 332 may be added in a separate process to either the integrated circuit dies 324 or device 500 just prior to bonding the device 500 to the conductive pillars 322p.

Figure 48:
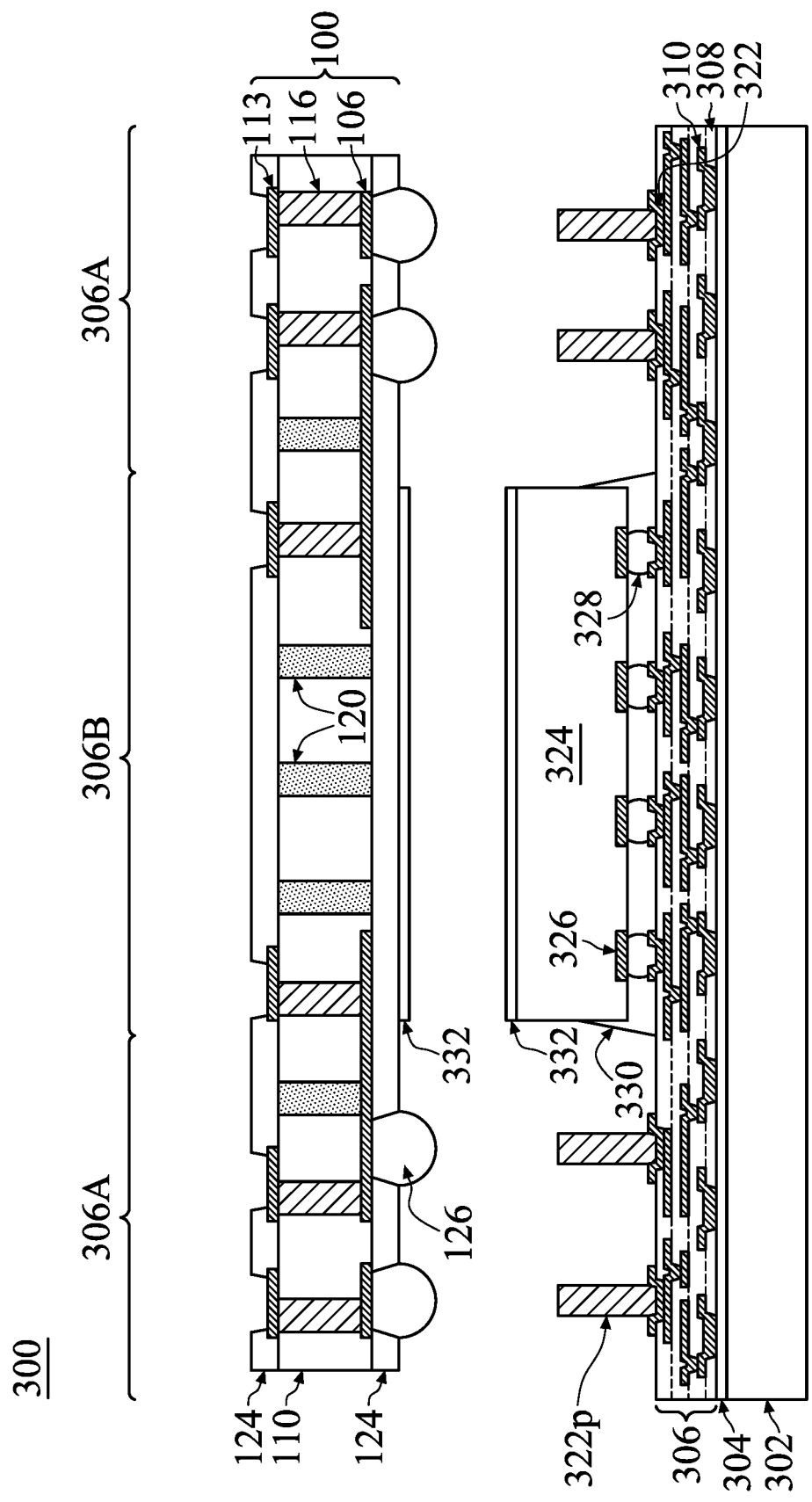
FIGS. 48 through 50 illustrate various intermediate steps in a process of forming a package structure including a fan-out bottom package and an interposer with an adhesive formed there between, in accordance with some embodiments.
Figure 49:
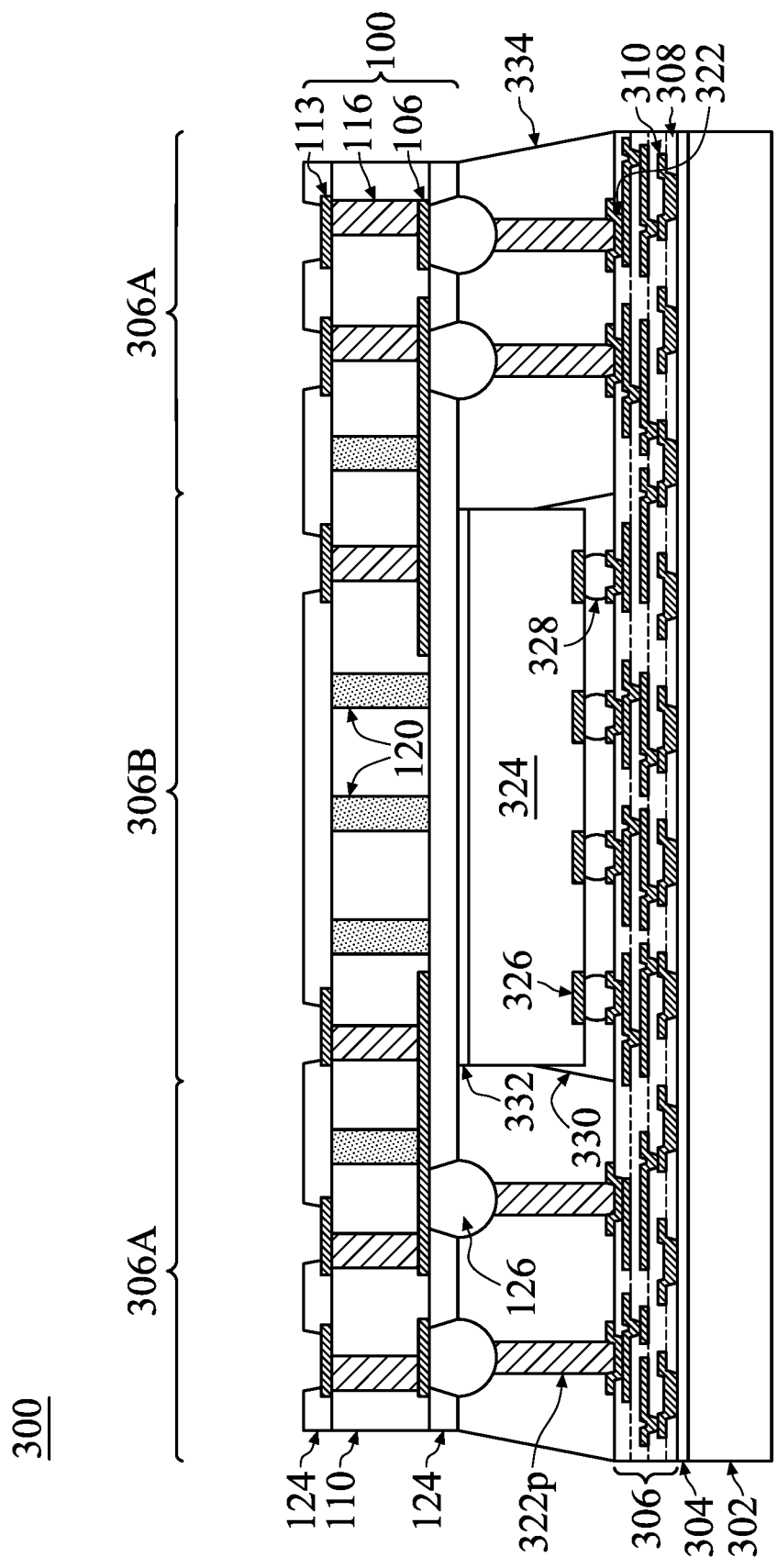
Figure 50:
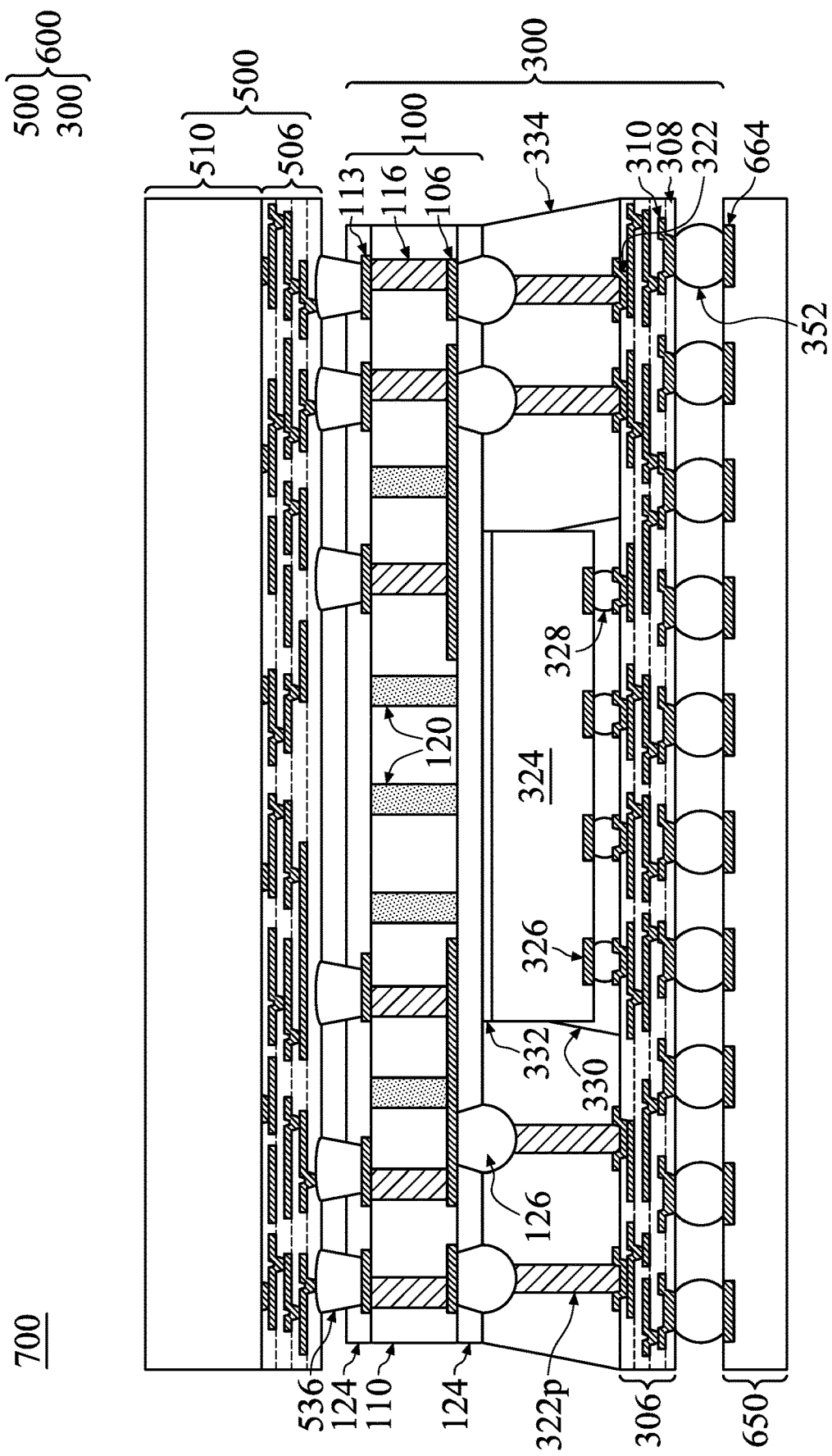

FIGS. 48 through 79 illustrate embodiments which are variations on the previously discussed embodiments, incorporating different and/or additional features. FIGS. 48 through 50 illustrate various intermediate steps in a process of forming a package structure including a fan-out bottom package and an interposer with an adhesive formed therebetween, in accordance with some embodiments. FIG. 48 illustrates the embodiment as discussed above with respect to FIG. 37. In FIG. 48, prior to joining the interposer substrate 100 to the conductive pillars 322p, an adhesive layer 332 may be disposed on the interposer substrate 100 and/or the integrated circuit dies 324. Adhesive layer 332 may be any suitable adhesive, epoxy, underfill, die attach film (DAF), thermal interface material, or the like. The adhesive layer 332 may be applied to a back-side of the integrated circuit dies 324 or may be applied to a die attach area of the interposer substrate 100, for each integrated circuit die 324. For example, the adhesive layer 332 may be applied to the back-side of the integrated circuit dies 324 before singulating to separate the integrated circuit dies 324, or may be applied to the front-side of the interposer substrate 100 before singulating to separate the interposer substrate 100.

In FIG. 48, the interposer substrate 100 is aligned to the conductive pillars 322p, in accordance with some embodiments. The interposer substrate 100 may be aligned and placed using, e.g., a pick-and-place tool. The interposer substrate 100 is placed on the redistribution structure 306 such that the conductive connectors 126 are aligned with the UBMs 322 and/or conductive pillars 322p in the first region 306A.

In FIG. 49, after the interposer substrate 100 is placed, the conductive connectors 126 are reflowed to form joints between corresponding conductive pillars 322p and conductive lines 106, physically and electrically connecting the interposer substrate 100 to the first redistribution structure 306. An encapsulant 334 may be formed, such as discussed above with respect to FIG. 38.

In FIG. 50, the carrier substrate 302 is removed, such as discussed above with respect to FIG. 41. Conductive connectors 352 are formed over the redistribution structure 306, such as discussed above with respect to FIG. 42. A device 500 may be mounted to interposer substrate 100, such as discussed above with respect to FIG. 43 to form package 600. Package 600 may be mounted to a package substrate 650, such as discussed above with respect to FIG. 44.

Figure 51:
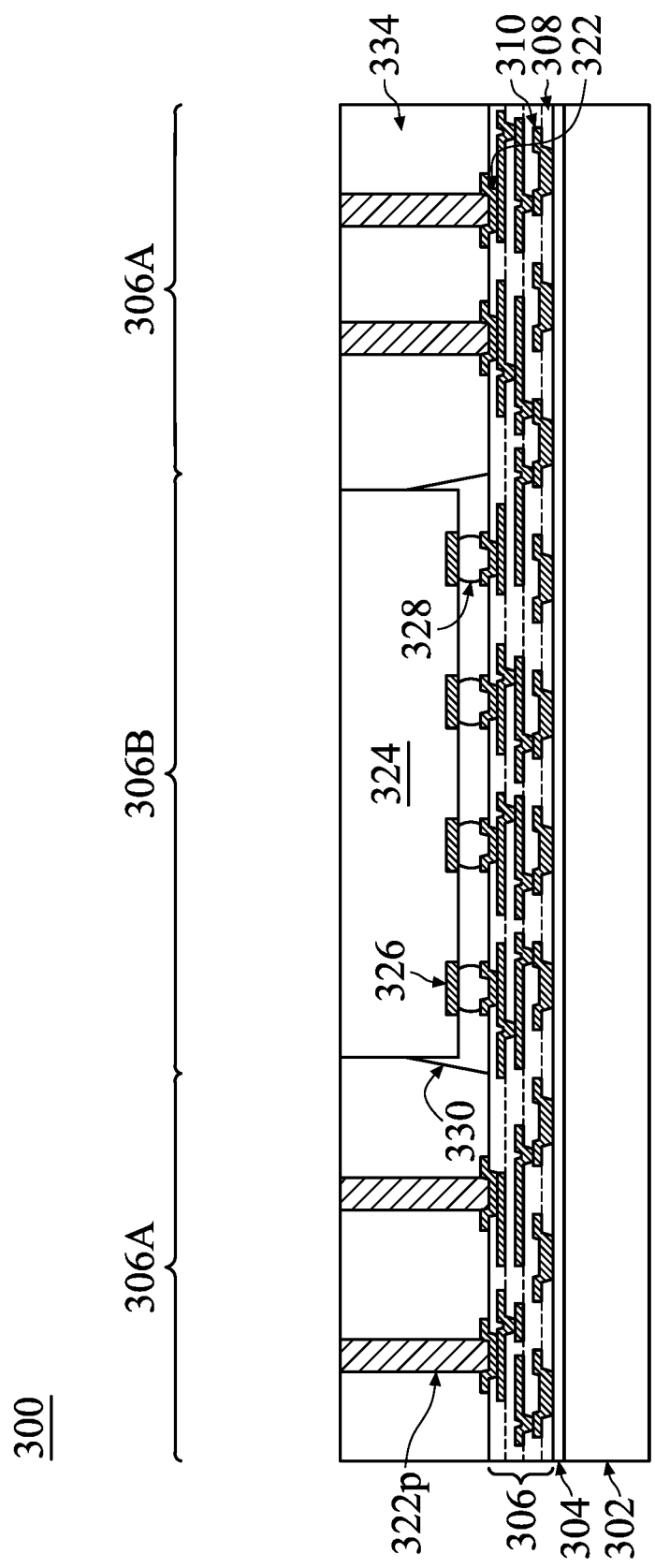
FIGS. 51 through 54 illustrate various intermediate steps in a process of forming a package structure including a fan-out bottom package which has a molding compound previously formed thereon and an interposer, in accordance with some embodiments.

FIG. 51 illustrates an embodiment as discussed above with respect to FIG. 36. Following mounting the integrated circuit dies 324, an encapsulant 334 may be formed over the redistribution structure 306 to laterally surround the integrated circuit dies 324 and conductive pillars 322p. In some embodiments, the encapsulant 334 may also extend over the top surfaces of the integrated circuit dies 324 and/or conductive pillars 322p. An upper portion of the encapsulant 334 may then be removed by a removal process to level the top surfaces of the conductive pillars 322p to each other. In some embodiments, the top surfaces of the conductive pillars 322p may also be leveled by a removal process with the top surface of the integrated circuit dies 324. The removal process may be, for example, a CMP and/or etchback process. The encapsulant 334 may be formed using processes and materials similar to those discussed above with respect to FIG. 38.

Figure 52:
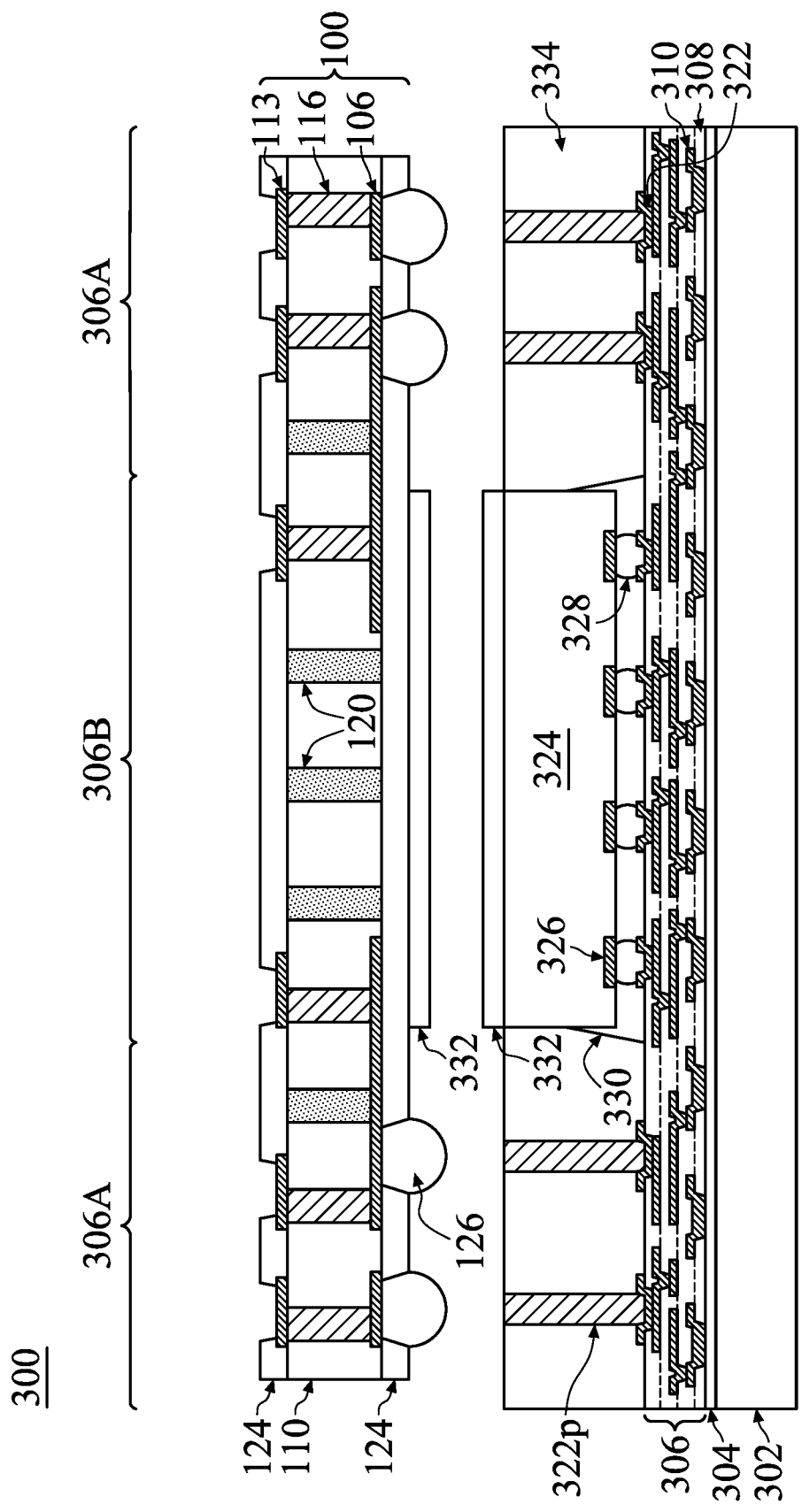

In FIG. 52, prior to joining the interposer substrate 100 to the conductive pillars 322p, an adhesive layer 332 may be disposed on the interposer substrate 100 and/or the integrated circuit dies 324. The adhesive layer 332 may be similar to the adhesive layer 332 of FIG. 48. The interposer substrate 100 is aligned to the conductive pillars 322p. The interposer substrate 100 may be aligned and placed using, e.g., a pick-and-place tool. The interposer substrate 100 is placed on the encapsulant 334 such that the conductive connectors 126 are aligned with the conductive pillars 322p in the first region 306A.

Figure 53:
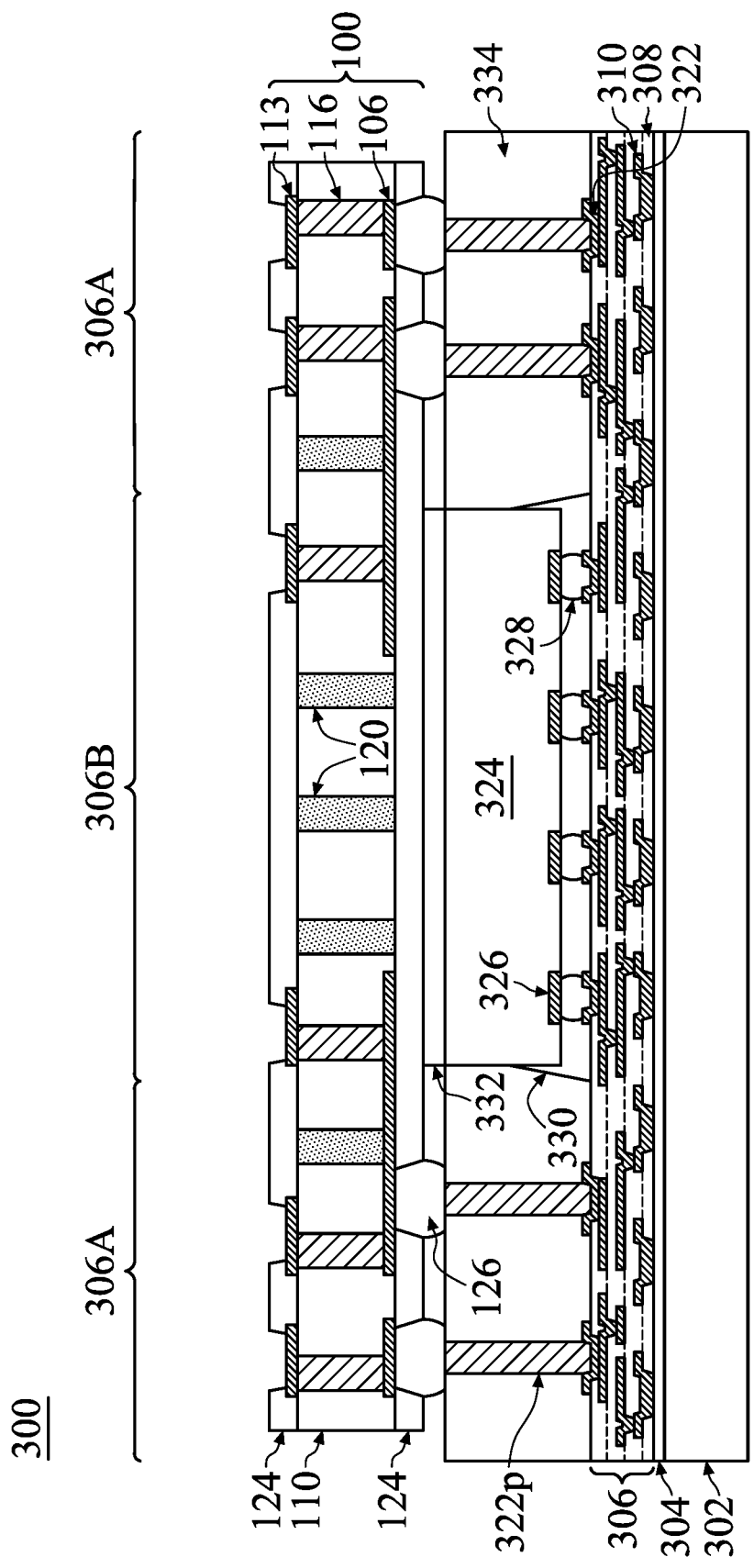

In FIG. 53, after the interposer substrate 100 is placed, the conductive connectors 126 are reflowed to form joints between corresponding conductive pillars 322p and conductive lines 106, physically and electrically connecting the interposer substrate 100 to the first redistribution structure 306. The adhesive layer 332 may be interposed between the interposer substrate 100 and integrated circuit dies 324 such that it contacts both the interposer substrate 100 and the integrated circuit dies 324.

Figure 54:
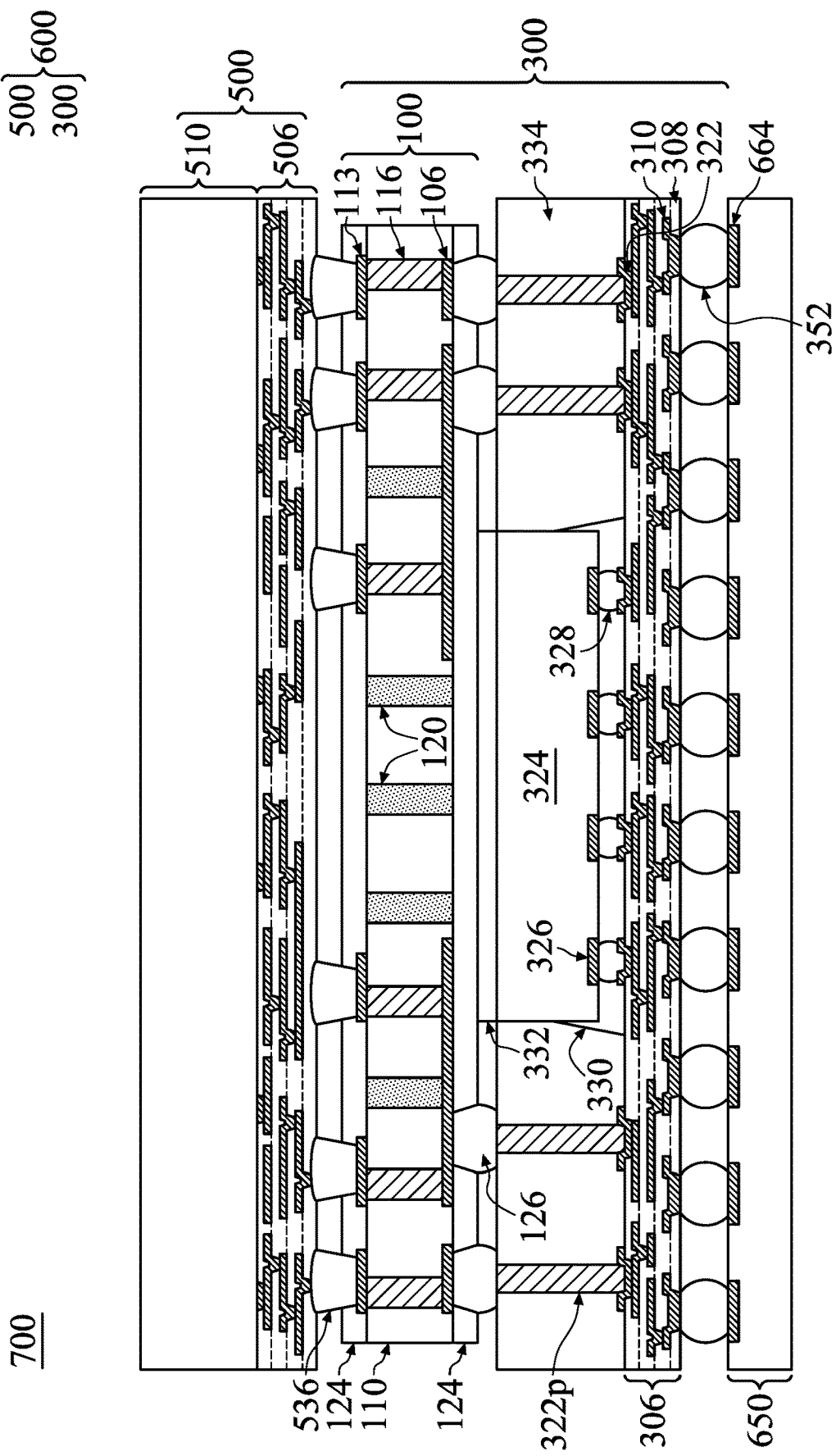

In FIG. 54, the carrier substrate 302 is removed, such as discussed above with respect to FIG. 41. Conductive connectors 352 are formed over the redistribution structure 306, such as discussed above with respect to FIG. 42. A device 500 may be mounted to interposer substrate 100, such as discussed above with respect to FIG. 43 to form package 600. Package 600 may be mounted to a package substrate 650, such as discussed above with respect to FIG. 44.

Figure 55:
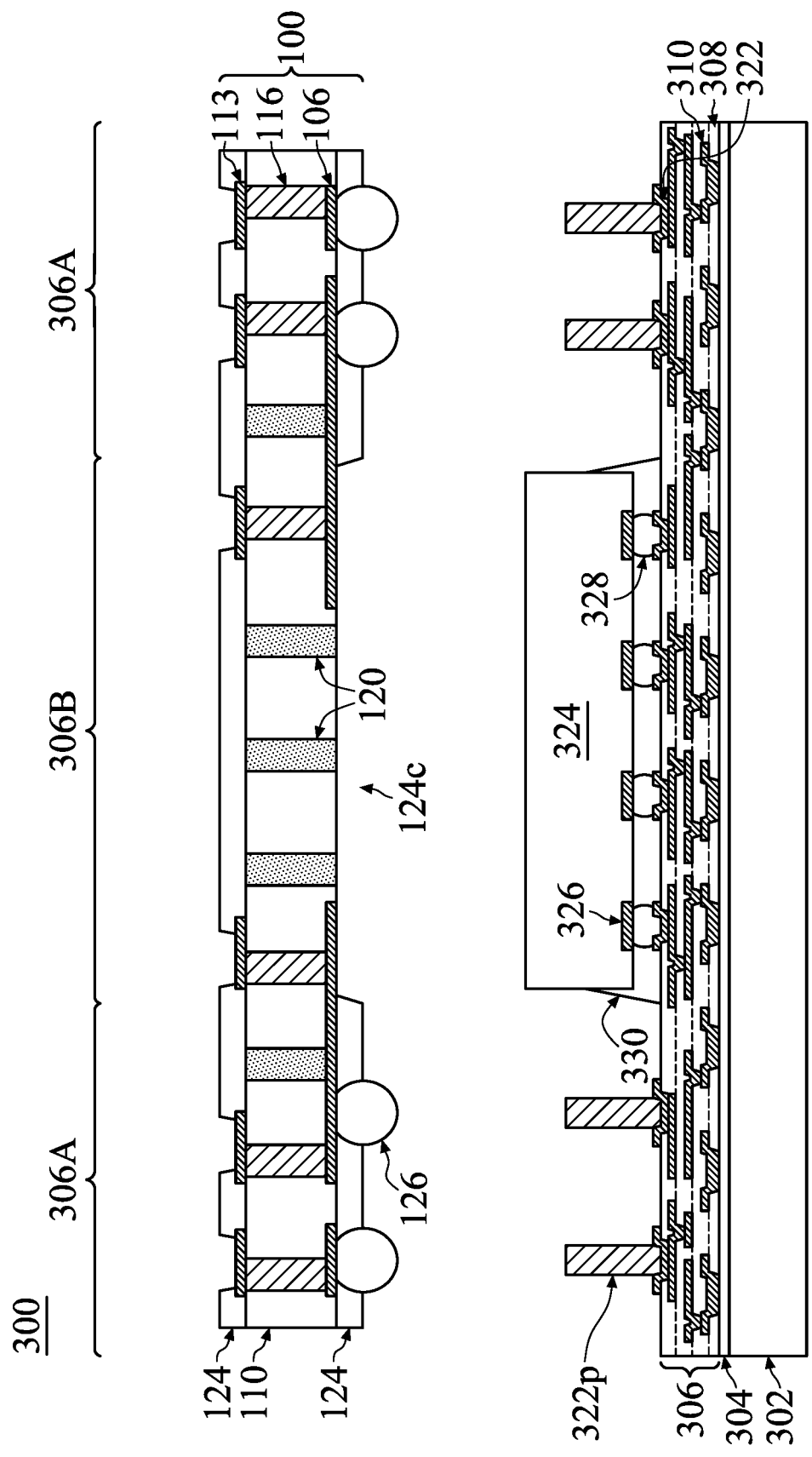
FIGS. 55 through 70 illustrate various intermediate steps in a process of forming a package structure including a fan-out bottom package and an interposer having a cavity or through hole formed therein, in accordance with some embodiments.

FIGS. 55 through 70 illustrate various intermediate steps in a process of forming a package structure including a fan-out bottom package and an interposer having a cavity or through hole formed therein, in accordance with some embodiments. In FIG. 55, interposer substrate 100 is provided which has a cavity 124c formed in the solder resist layer 124. Cavity 124c may be formed in a manner similar to the formation of cavity 130 discussed above with respect to FIG. 11. Cavity 124c may be formed such that it is aligned with integrated circuit dies 324 so that the reinforcing structures 120 and/or reinforcing structures 122 are closer to the integrated circuit dies 324 once the interposer substrate 100 is mounted to the conductive pillars 322p and/or UBMs 322. In some embodiments, the cavity 124c may be sized and positioned to allow the integrated circuit dies 324 to recess into the cavity 124c upon mounting. This can help reduce the overall height of the completed package as well as provide better heat dissipation from the integrated circuit dies 324 to the reinforcing structures 120 and/or reinforcing structures 122.

The interposer substrate 100 is aligned to the conductive pillars 322p, in accordance with some embodiments. The interposer substrate 100 may be aligned and placed using, e.g., a pick-and-place tool. The interposer substrate 100 is placed on the redistribution structure 306 such that the conductive connectors 126 are aligned with the UBMs 322 and/or conductive pillars 322p in the first region 306A.

Figure 56:
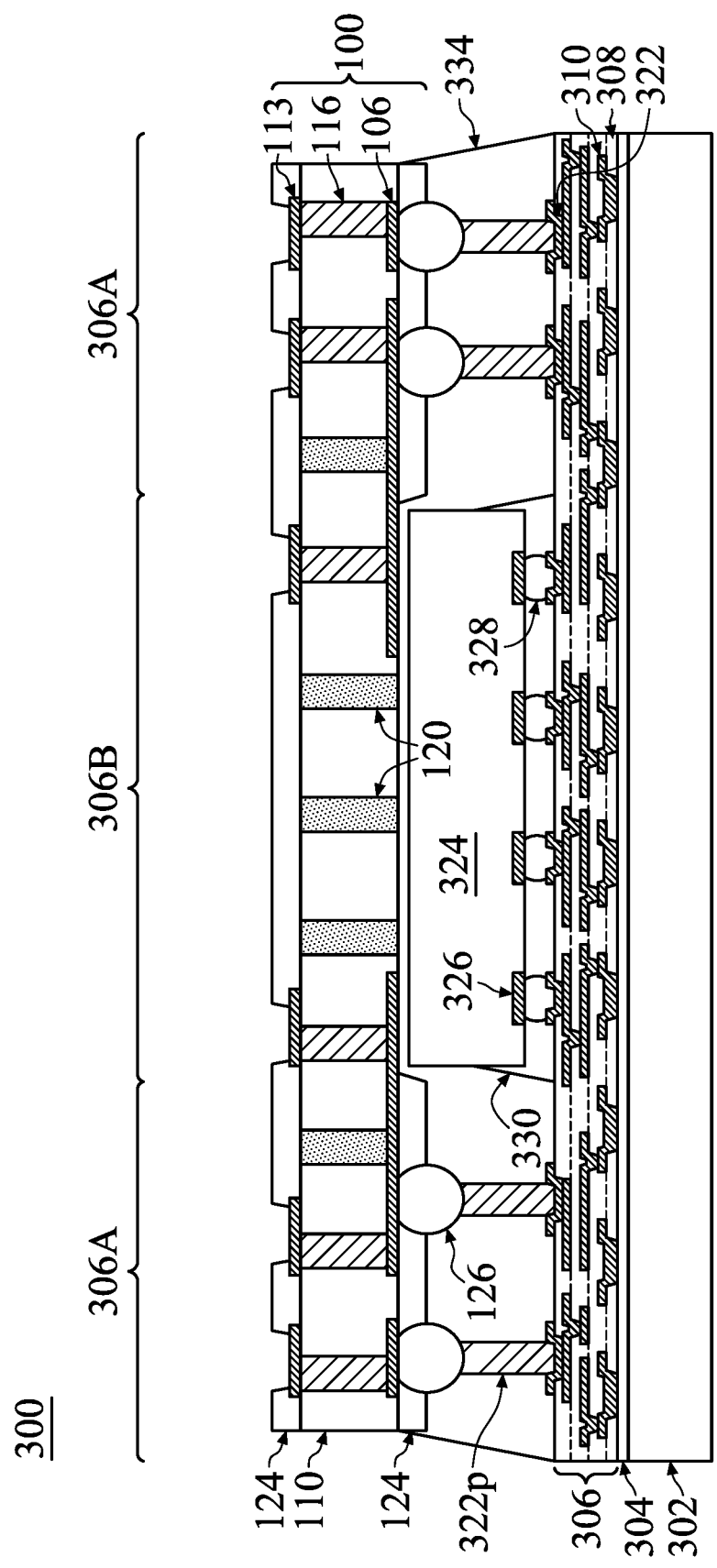

In FIG. 56, after the interposer substrate 100 is placed, the conductive connectors 126 are reflowed to form joints between corresponding conductive pillars 322p and conductive lines 106, physically and electrically connecting the interposer substrate 100 to the first redistribution structure 306. An encapsulant 334 may be formed, such as discussed above with respect to FIG. 38. In some embodiments, the encapsulant 334 may flow to a space between the integrated circuit dies 324 and interposer substrate 100 such that the encapsulant 334 is disposed between the top surface of the integrated circuit dies 324 and the bottom of the substrate core 110 of the interposer substrate 100.

Figure 57:
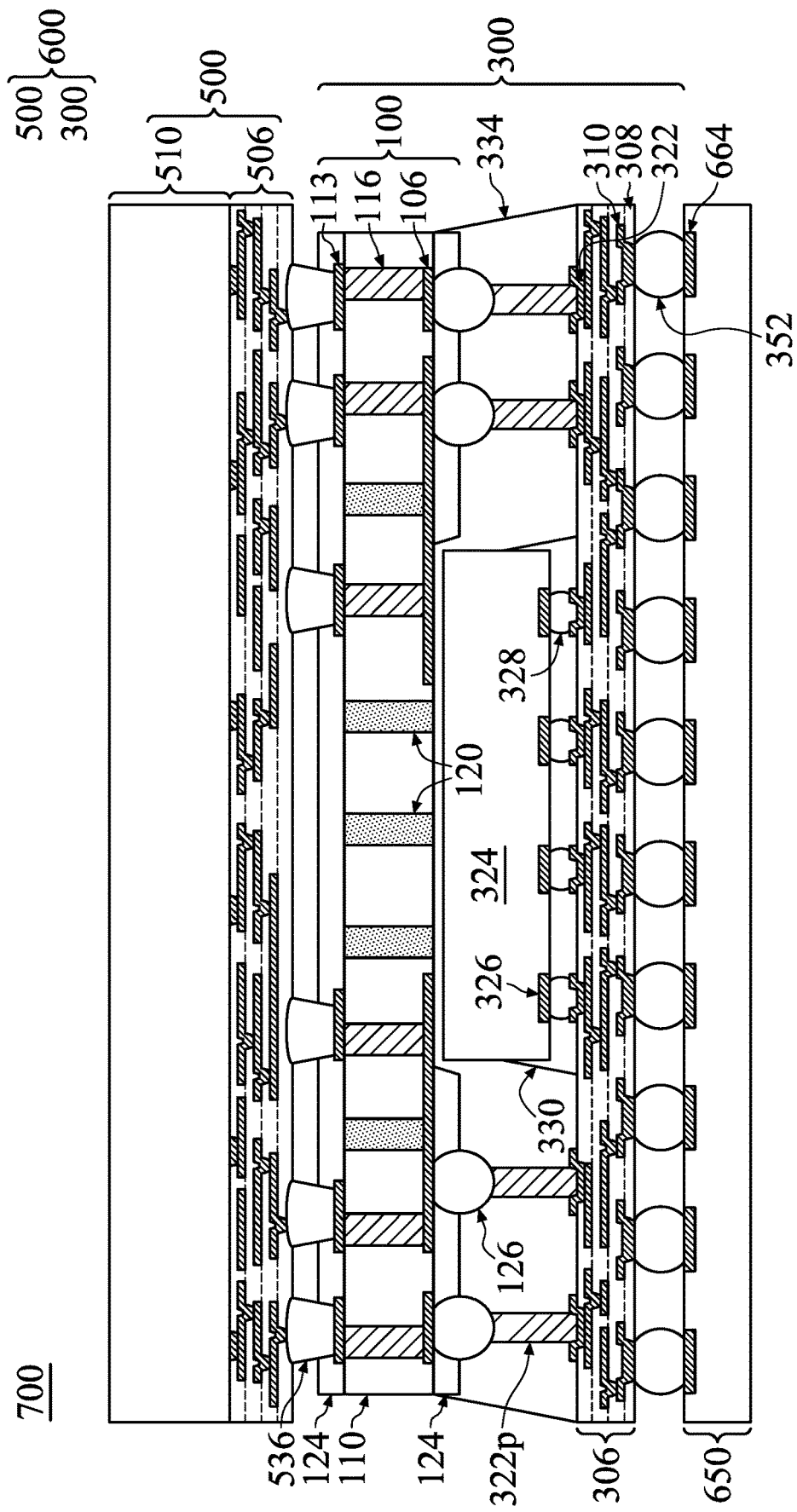

In FIG. 57, the carrier substrate 302 is removed, such as discussed above with respect to FIG. 41. Conductive connectors 352 are formed over the redistribution structure 306, such as discussed above with respect to FIG. 42. A device 500 may be mounted to interposer substrate 100, such as discussed above with respect to FIG. 43 to form package 600. Package 600 may be mounted to a package substrate 650, such as discussed above with respect to FIG. 44.

Figure 58:
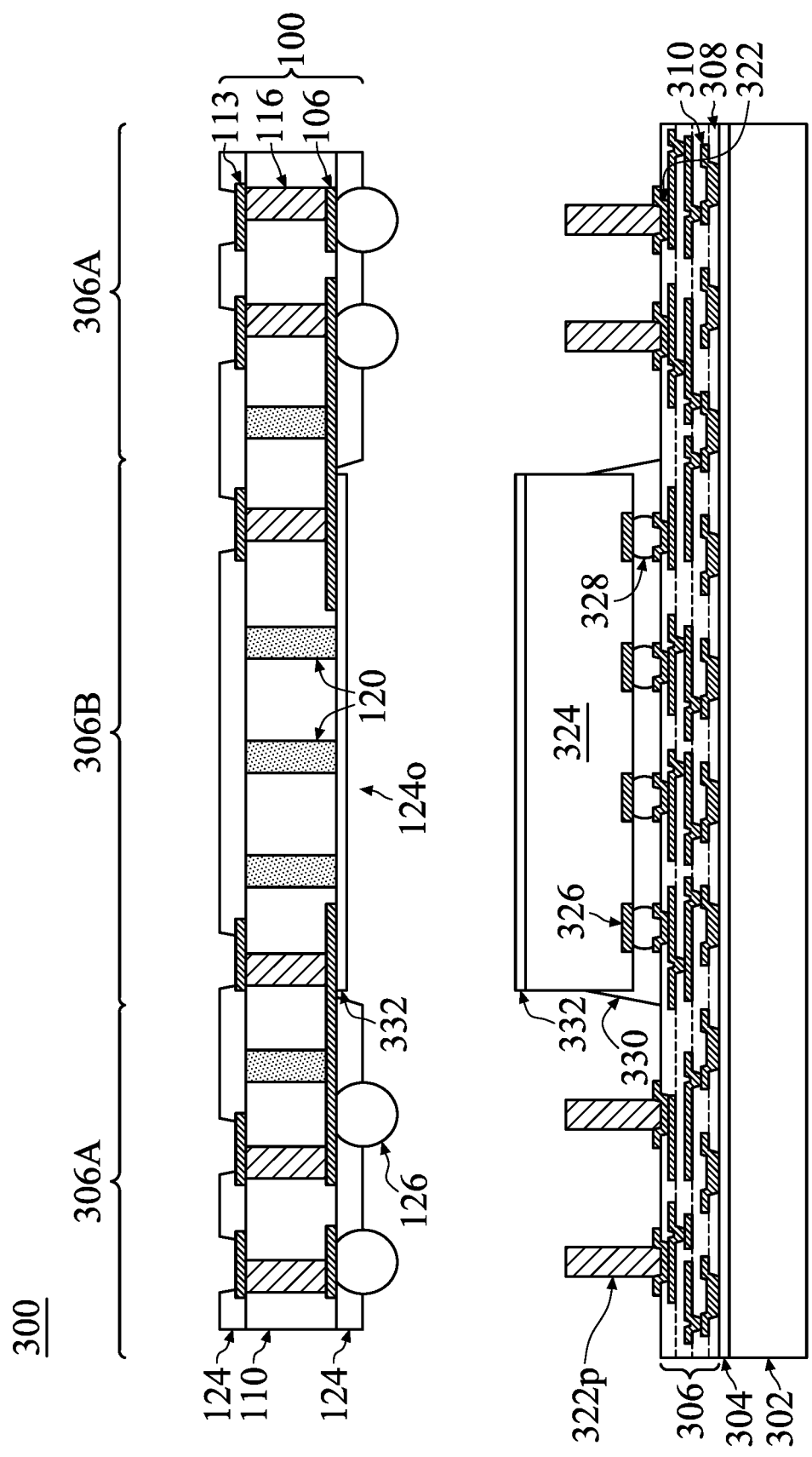

In FIG. 58, interposer substrate 100 is provided which has an opening 124o formed in the solder resist layer 124, such as discussed above with respect to FIG. 55. Prior to joining the interposer substrate 100 to the conductive pillars 322p, an adhesive layer 332 may be disposed on the interposer substrate 100 and/or the integrated circuit dies 324. The adhesive layer 332 may be similar to the adhesive layer 332 of FIG. 48. The interposer substrate 100 is aligned to the conductive pillars 322p. The interposer substrate 100 may be aligned and placed using, e.g., a pick-and-place tool. The interposer substrate 100 is placed on the redistribution structure 306 such that the conductive connectors 126 are aligned with the conductive pillars 322p in the first region 306A.

Figure 59:
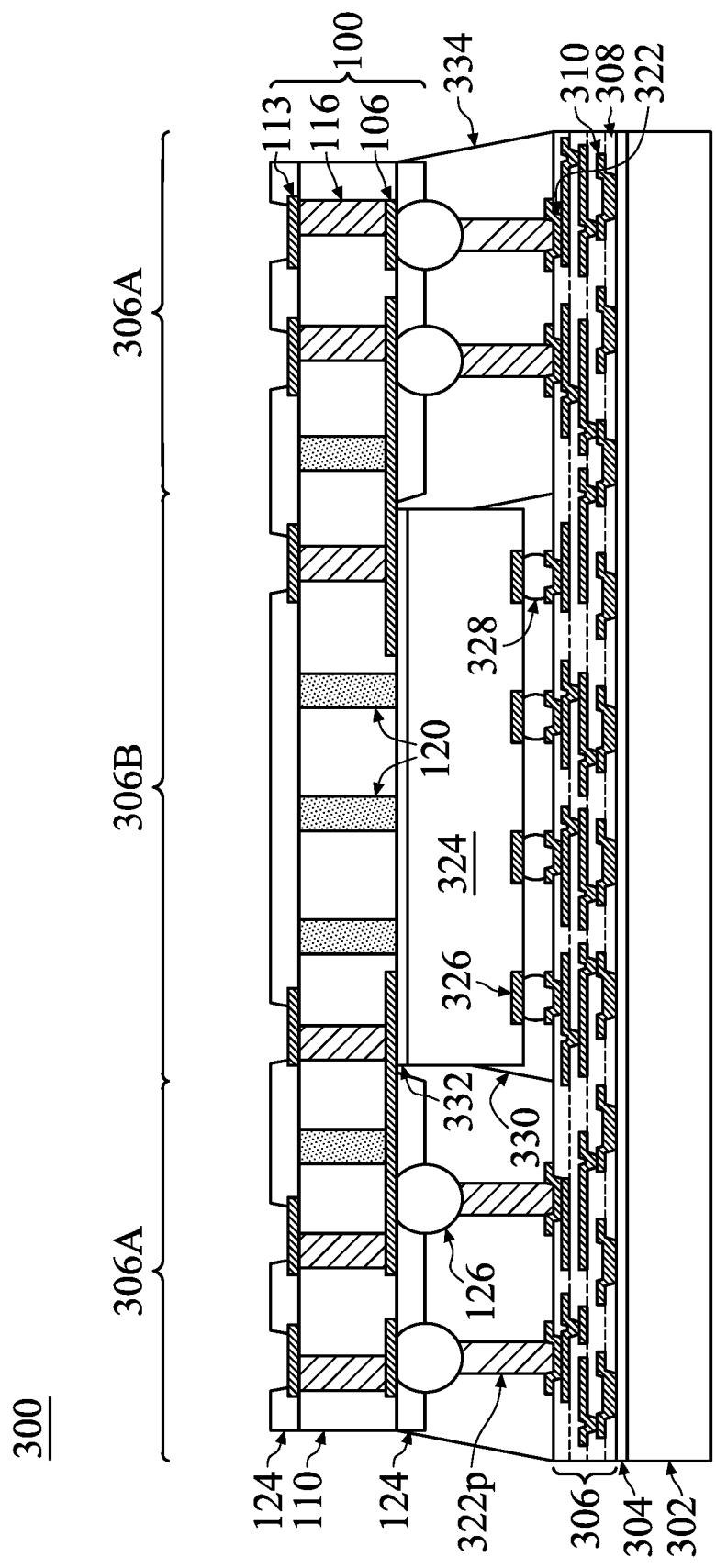

In FIG. 59, after the interposer substrate 100 is placed, the conductive connectors 126 are reflowed to form joints between corresponding conductive pillars 322p and conductive lines 106, physically and electrically connecting the interposer substrate 100 to the first redistribution structure 306. The adhesive layer 332 may be interposed between the interposer substrate 100 and integrated circuit dies 324 such that it contacts both the interposer substrate 100 and the integrated circuit dies 324.

Figure 60:
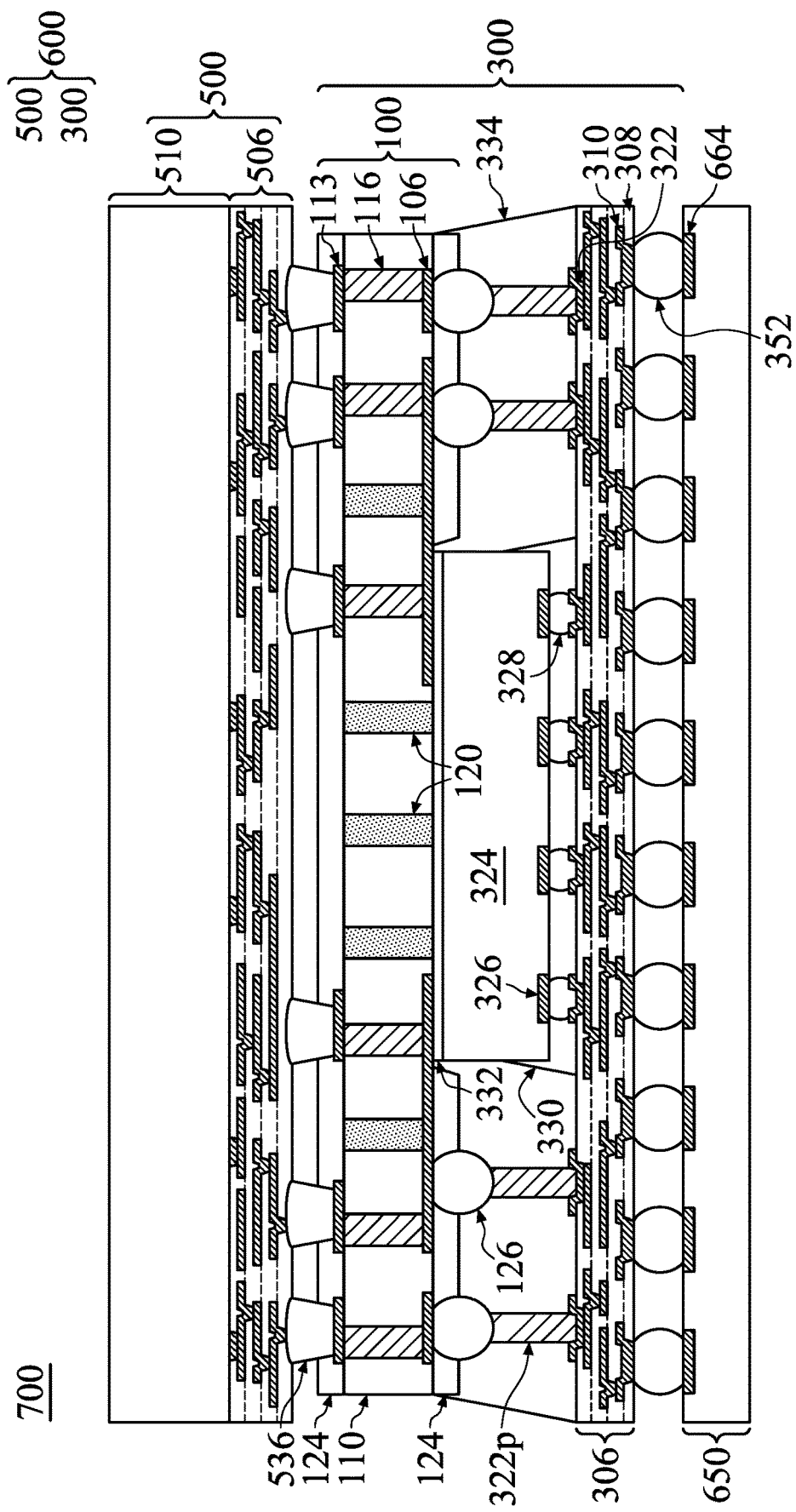

In FIG. 60, the carrier substrate 302 is removed, such as discussed above with respect to FIG. 41. Conductive connectors 352 are formed over the redistribution structure 306, such as discussed above with respect to FIG. 42. A device 500 may be mounted to interposer substrate 100, such as discussed above with respect to FIG. 43 to form package 600. Package 600 may be mounted to a package substrate 650, such as discussed above with respect to FIG. 44.

Figure 61:
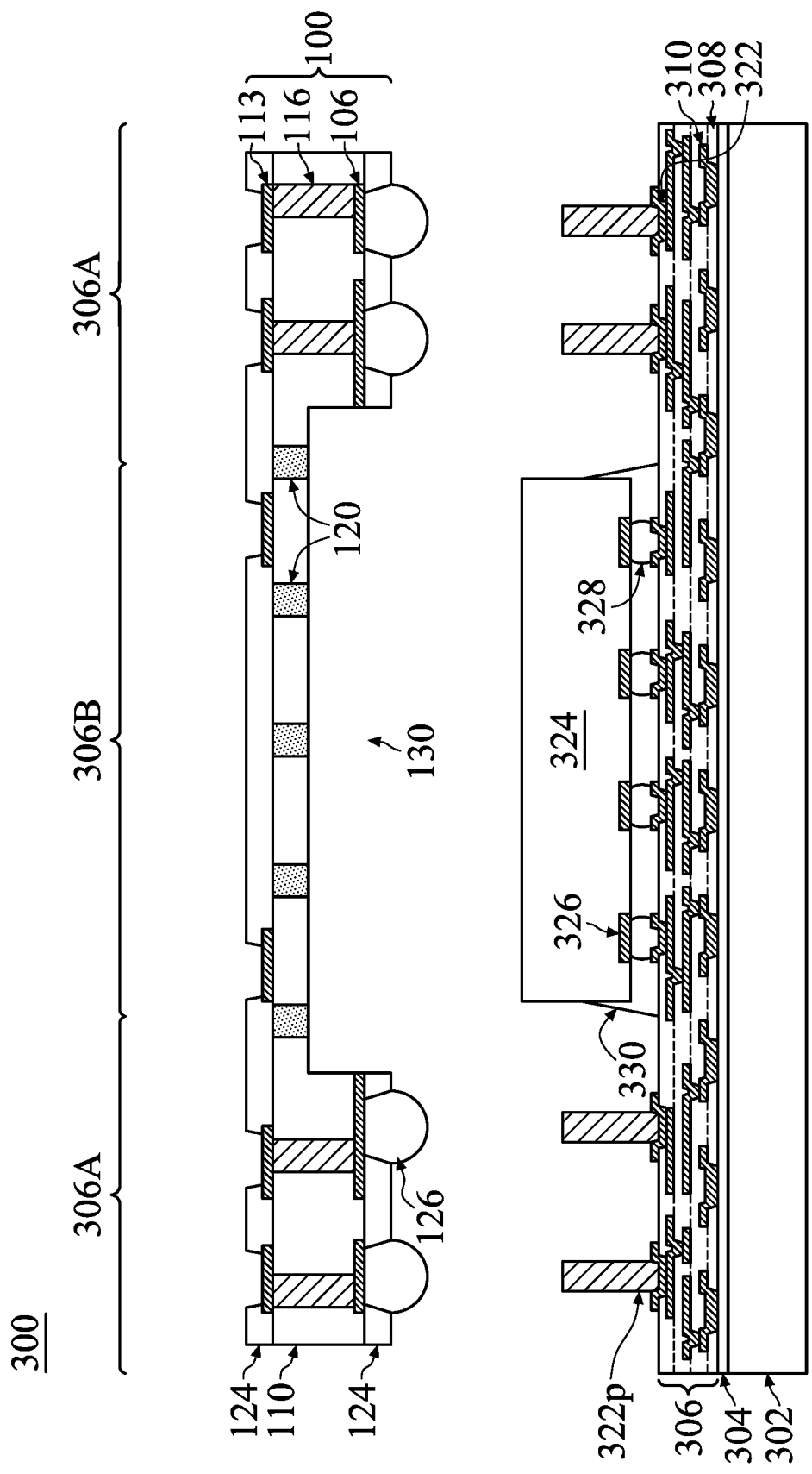

In FIG. 61, interposer substrate 100 is provided which has a cavity 130 (see FIG. 11) formed in the substrate core 110. Cavity 130 may be formed such that it is aligned with integrated circuit dies 324 so that the integrated circuit dies 324 are at least partially disposed within the cavity 130 once the interposer substrate 100 is mounted to the conductive pillars 322p and/or UBMs 322. This can help reduce the overall height of the completed package. The reinforcing structures 120 and/or reinforcing structures 122 can also provide support and heat dissipation of the integrated circuit dies 324.

The interposer substrate 100 is aligned to the conductive pillars 322p, in accordance with some embodiments. The interposer substrate 100 may be aligned and placed using, e.g., a pick-and-place tool. The interposer substrate 100 is placed on the redistribution structure 306 such that the conductive connectors 126 are aligned with the conductive pillars 322p in the first region 306A.

Figure 62:
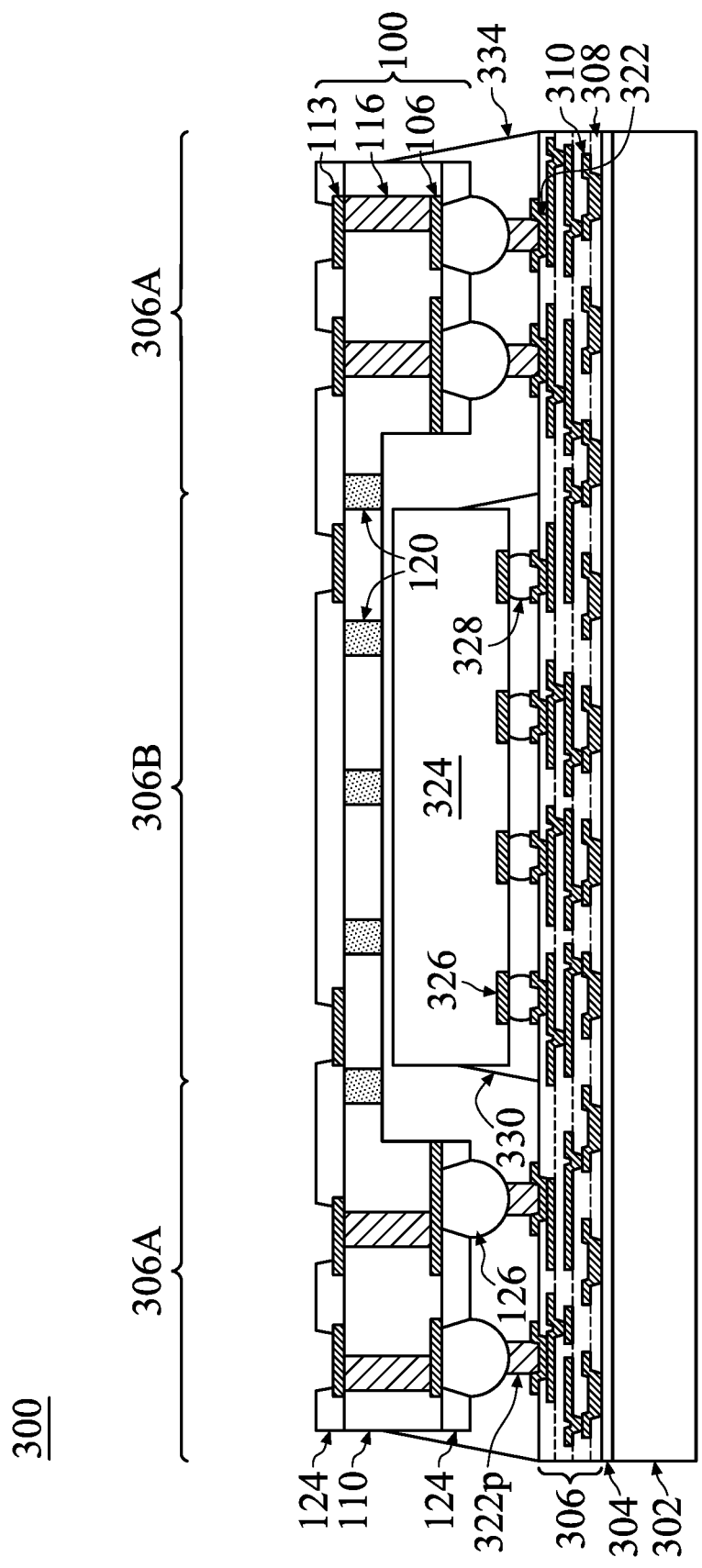

In FIG. 62, after the interposer substrate 100 is placed, the conductive connectors 126 are reflowed to form joints between corresponding conductive pillars 322p and conductive lines 106, physically and electrically connecting the interposer substrate 100 to the first redistribution structure 306. An encapsulant 334 may be formed, such as discussed above with respect to FIG. 38. In some embodiments, the encapsulant 334 may flow to a space between the integrated circuit dies 324 and interposer substrate 100 such that the encapsulant 334 is disposed between the top surface of the integrated circuit dies 324 and the bottom of the substrate core 110 of the interposer substrate 100 in the cavity 130.

In some embodiments, following joining the interposer substrate 100 to the conductive pillars 322p, the integrated circuit dies 324 may be disposed at least partially in the cavity 130 (see FIG. 61).

Figure 63:
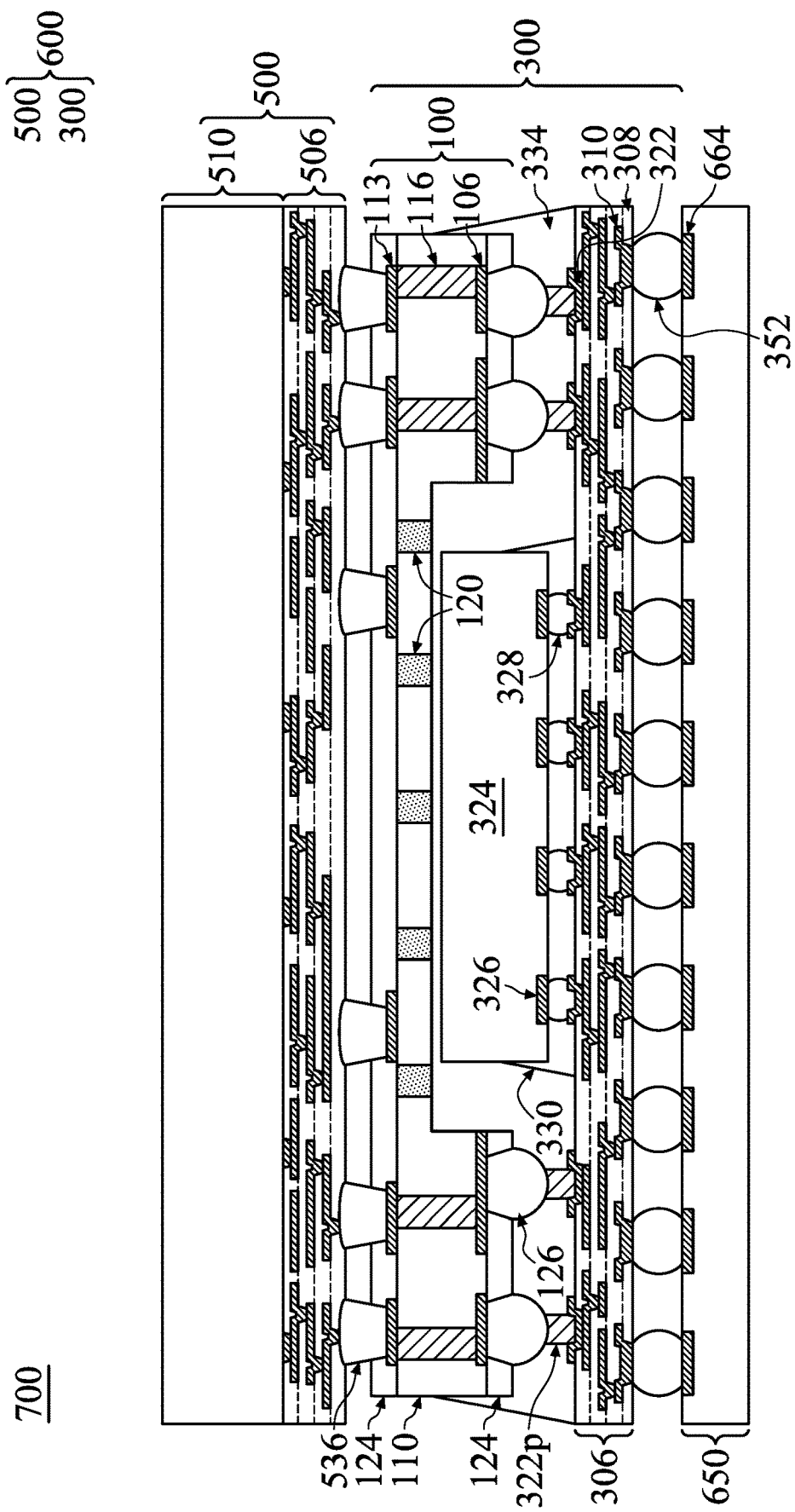

In FIG. 63, the carrier substrate 302 is removed, such as discussed above with respect to FIG. 41. Conductive connectors 352 are formed over the redistribution structure 306, such as discussed above with respect to FIG. 42. A device 500 may be mounted to interposer substrate 100, such as discussed above with respect to FIG. 43 to form package 600. Package 600 may be mounted to a package substrate 650, such as discussed above with respect to FIG. 44.

Figure 64:
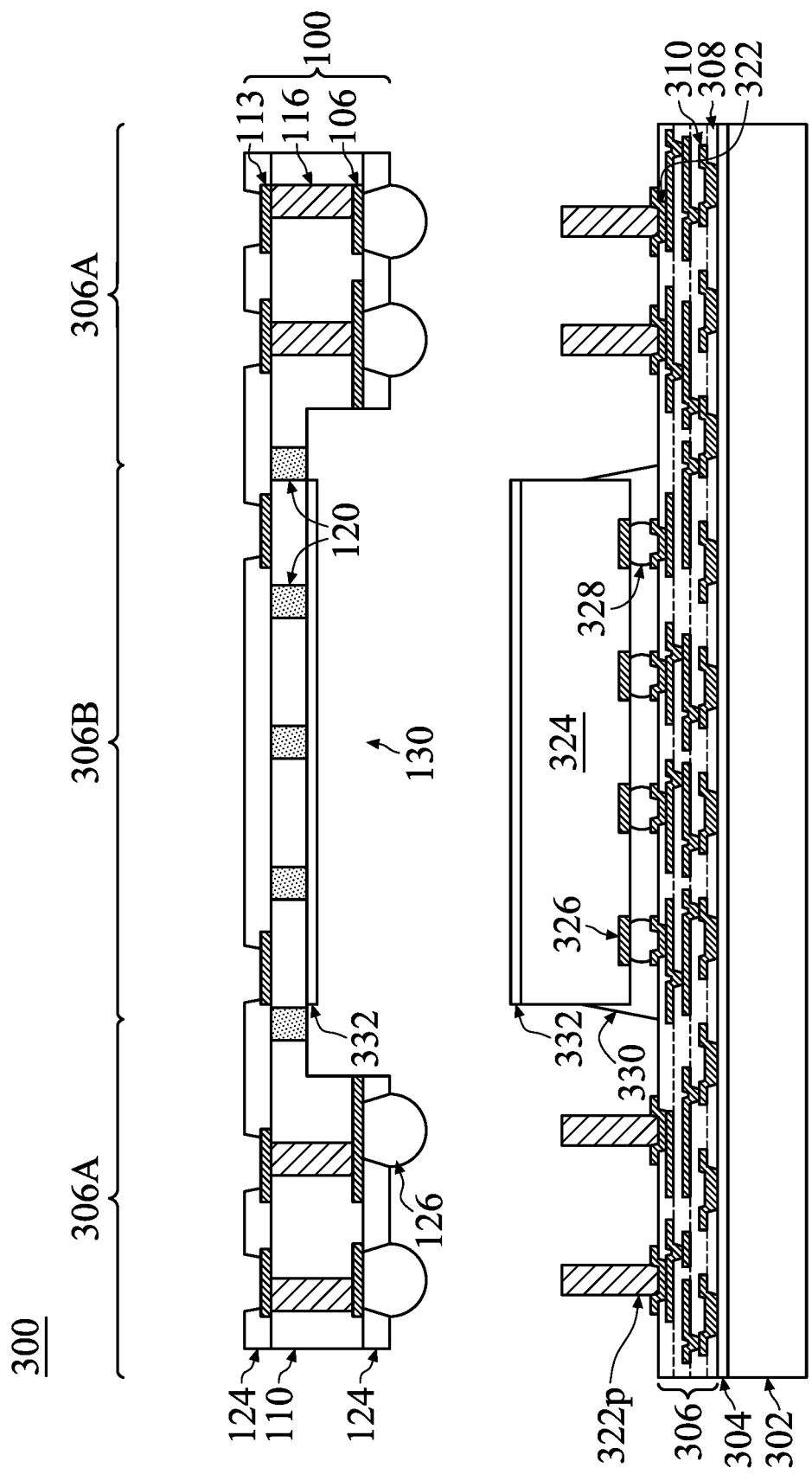

In FIG. 64, interposer substrate 100 is provided which has a cavity 130 formed therein, such as discussed above with respect to FIG. 61. Prior to joining the interposer substrate 100 to the conductive pillars 322p, an adhesive layer 332 may be disposed on the interposer substrate 100 and/or the integrated circuit dies 324. The adhesive layer 332 may be similar to the adhesive layer 332 of FIG. 48. The interposer substrate 100 is aligned to the conductive pillars 322p. The interposer substrate 100 may be aligned and placed using, e.g., a pick-and-place tool. The interposer substrate 100 is placed on the redistribution structure 306 such that the conductive connectors 126 are aligned with the conductive pillars 322p in the first region 306A.

Figure 65:
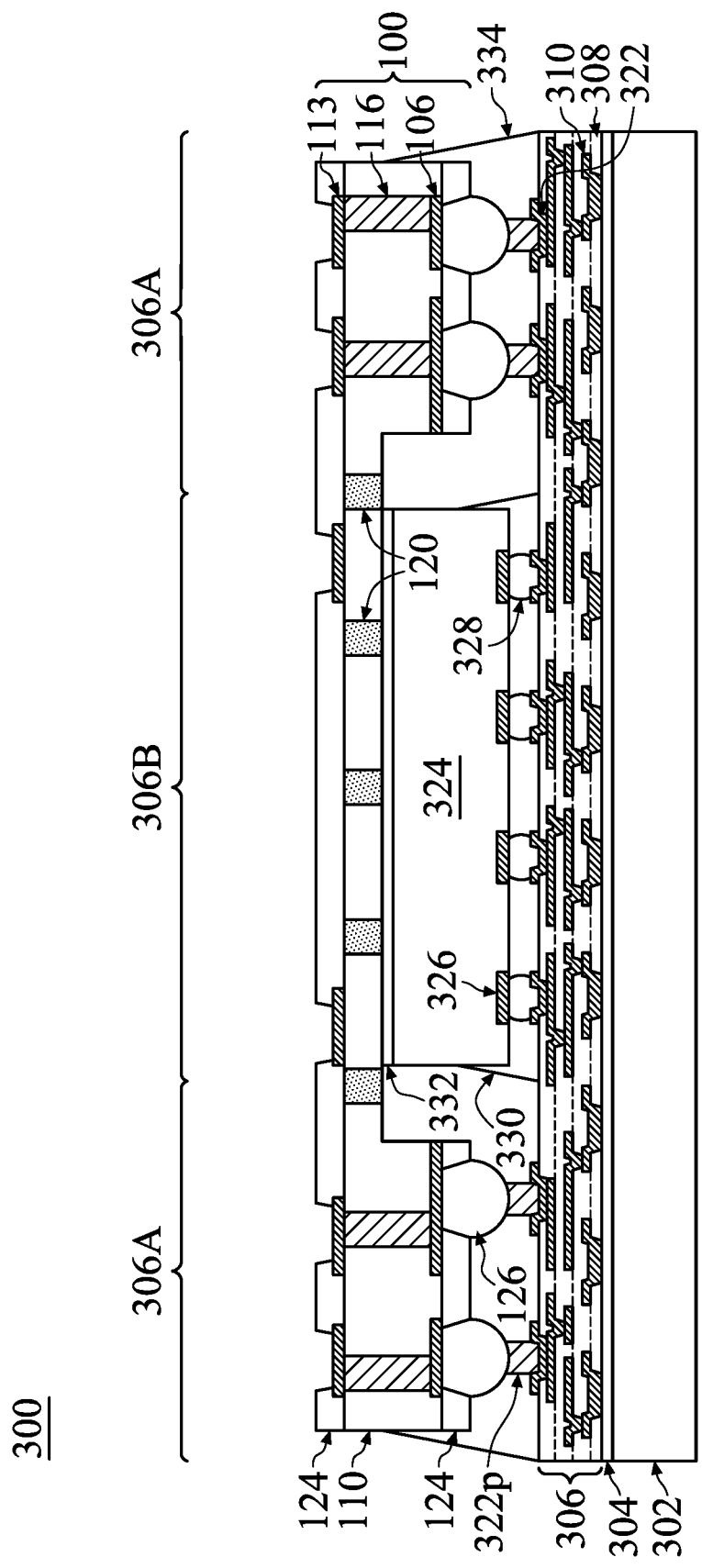

In FIG. 65, after the interposer substrate 100 is placed, the conductive connectors 126 are reflowed to form joints between corresponding conductive pillars 322p and conductive lines 106, physically and electrically connecting the interposer substrate 100 to the first redistribution structure 306. The adhesive layer 332 may be interposed between the interposer substrate 100 and integrated circuit dies 324 such that it contacts both the interposer substrate 100 and the integrated circuit dies 324.

In some embodiments, following joining the interposer substrate 100 to the conductive pillars 322p, the integrated circuit dies 324 may be disposed at least partially in the cavity 130 (see FIG. 64).

Figure 66:
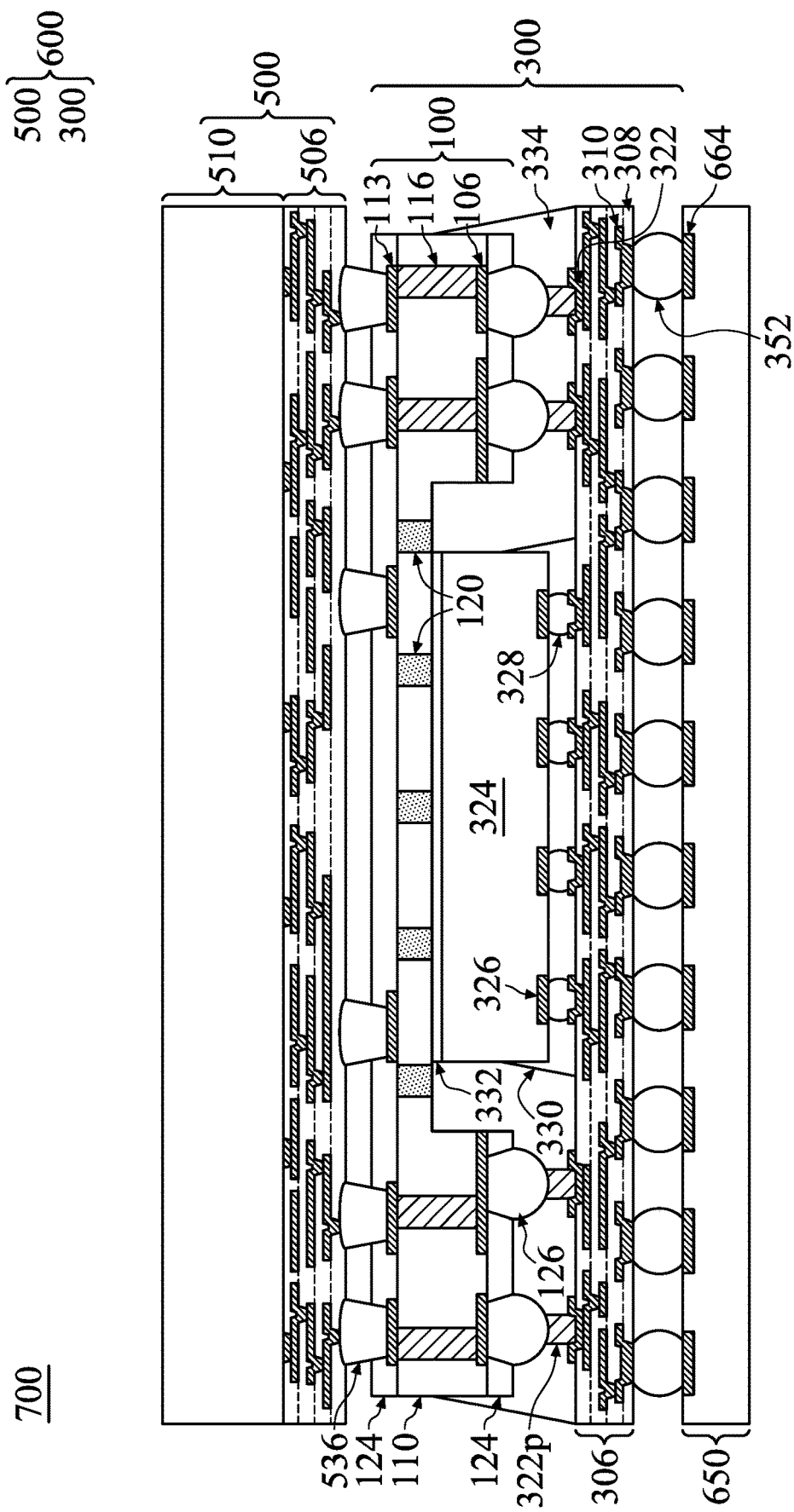

In FIG. 66, the carrier substrate 302 is removed, such as discussed above with respect to FIG. 41. Conductive connectors 352 are formed over the redistribution structure 306, such as discussed above with respect to FIG. 42. A device 500 may be mounted to interposer substrate 100, such as discussed above with respect to FIG. 43 to form package 600. Package 600 may be mounted to a package substrate 650, such as discussed above with respect to FIG. 44 to form package 700.

Figure 67:
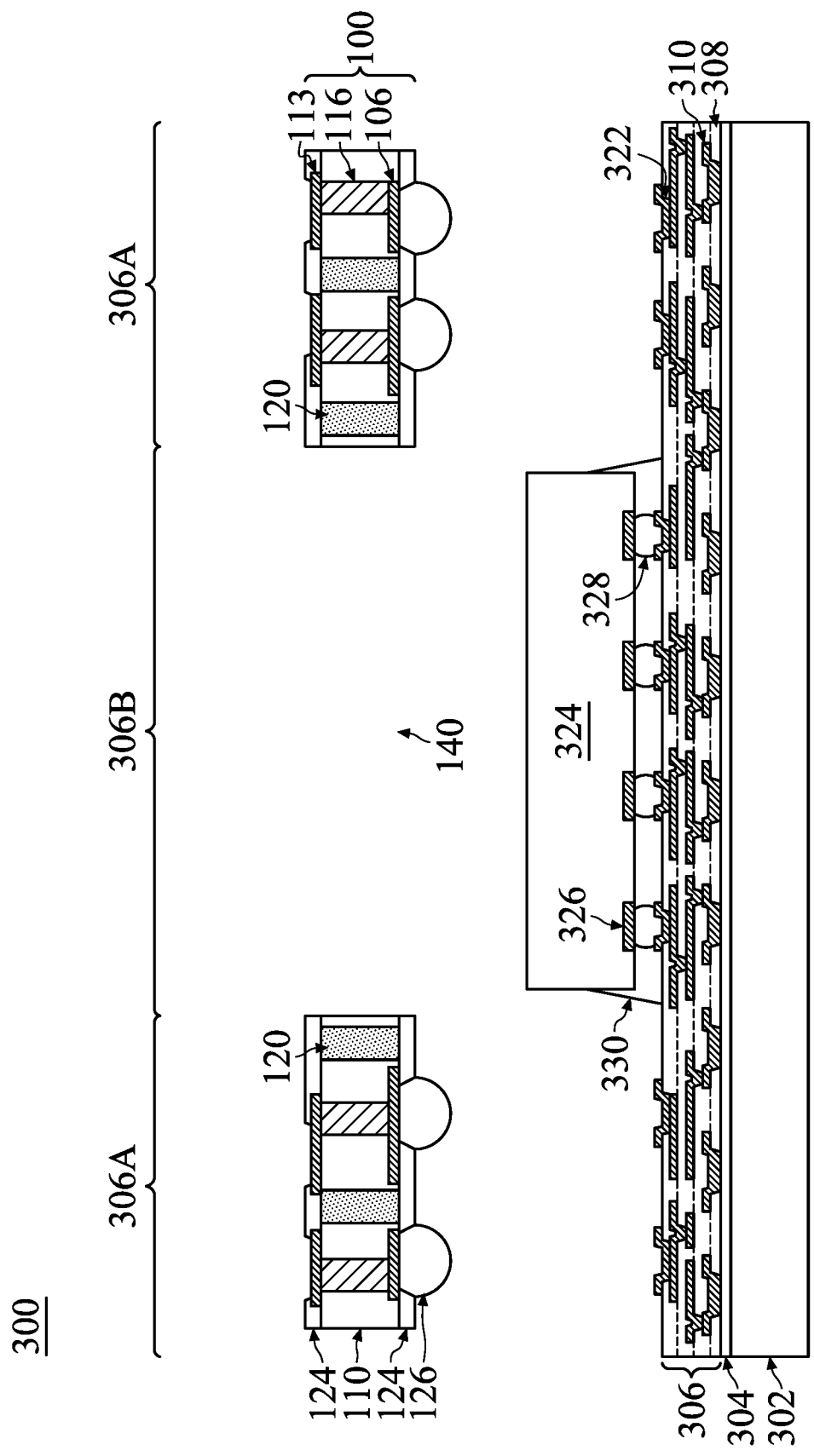

In FIG. 67, interposer substrate 100 is provided which has a through hole 140 (see FIG. 12) formed in the substrate core 110. Through hole 140 may be formed such that it is aligned with integrated circuit dies 324 so that the integrated circuit dies 324 are at least partially disposed within the through hole 140 once the interposer substrate 100 is mounted to the conductive pillars 322p and/or UBMs 322. In some embodiments, the integrated circuit dies 324 may be mounted in the through hole 140 such that the top surface of the integrated circuit dies 324 is level with or below the level of the top surface of the interposer substrate 100. This can reduce the overall height of the completed package. Reinforcing structures 120 and/or reinforcing structures 122 may be disposed in the periphery portion of the interposer substrate 100.

The interposer substrate 100 is aligned to the conductive pillars 322p or UBMs 322, in accordance with some embodiments. The interposer substrate 100 may be aligned and placed using, e.g., a pick-and-place tool. The interposer substrate 100 is placed on the redistribution structure 306 such that the conductive connectors 126 are aligned with the conductive pillars 322p or UBMs 322 in the first region 306A.

Figure 68:
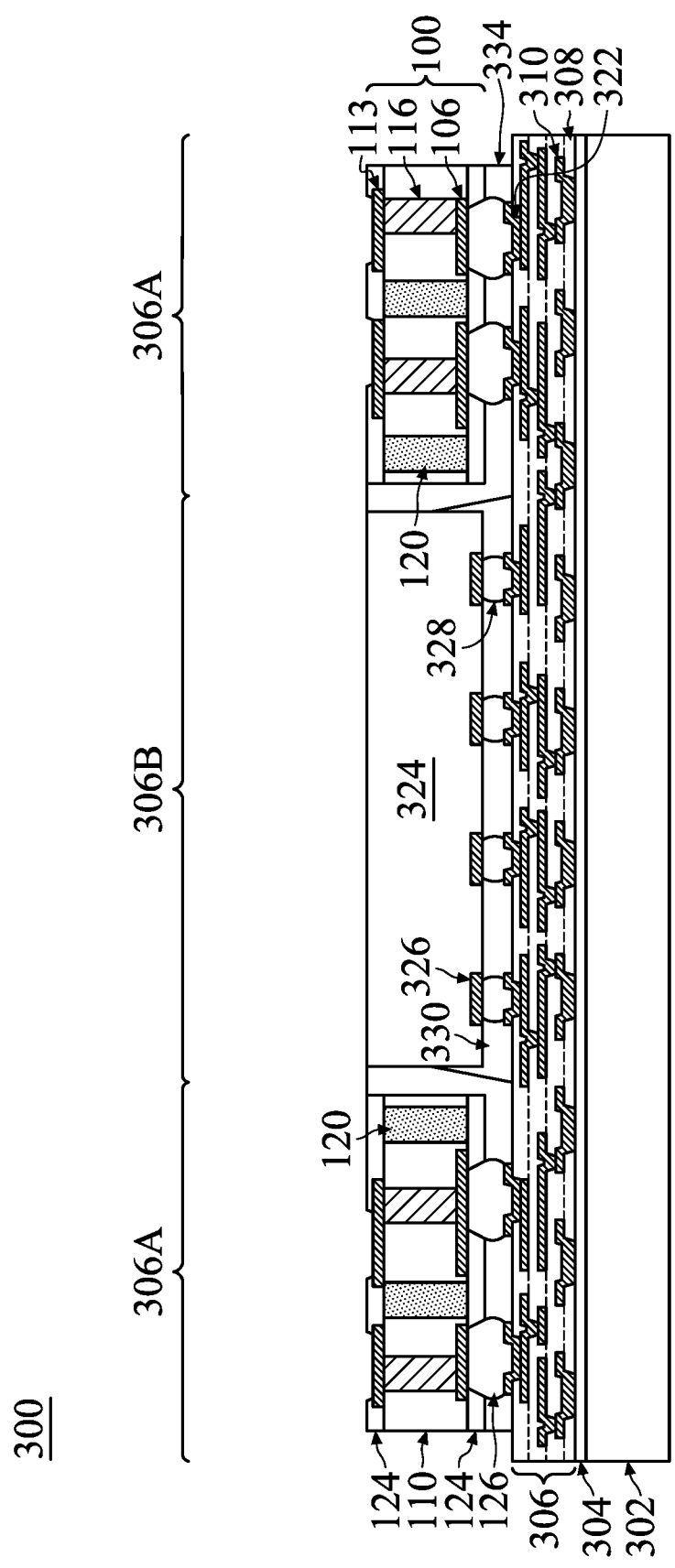

In FIG. 68, after the interposer substrate 100 is placed, the conductive connectors 126 are reflowed to form joints between corresponding conductive pillars 322p or UBMs 322 and conductive lines 106, physically and electrically connecting the interposer substrate 100 to the first redistribution structure 306. An encapsulant 334 may be formed, such as discussed above with respect to FIG. 38. In some embodiments, the encapsulant 334 may flow around the integrated circuit dies 324 and interposer substrate 100 such that the encapsulant 334 is interposed between the sides of the integrated circuit dies 324 and the sidewalls of the through hole 140 of interposer substrate 100. The encapsulant 334 may also flow over the top surface of the interposer. The encapsulant 334 may be leveled to have a top surface which is level with the top surface of the interposer substrate 100 and/or integrated circuit dies 324 using a removal process, such as a CMP and/or etch back process.

In some embodiments, following joining the interposer substrate 100 to the conductive pillars 322p or UBMs 322, the integrated circuit dies 324 may be disposed at least partially in the through hole 140 (see FIG. 67).

Figure 69:
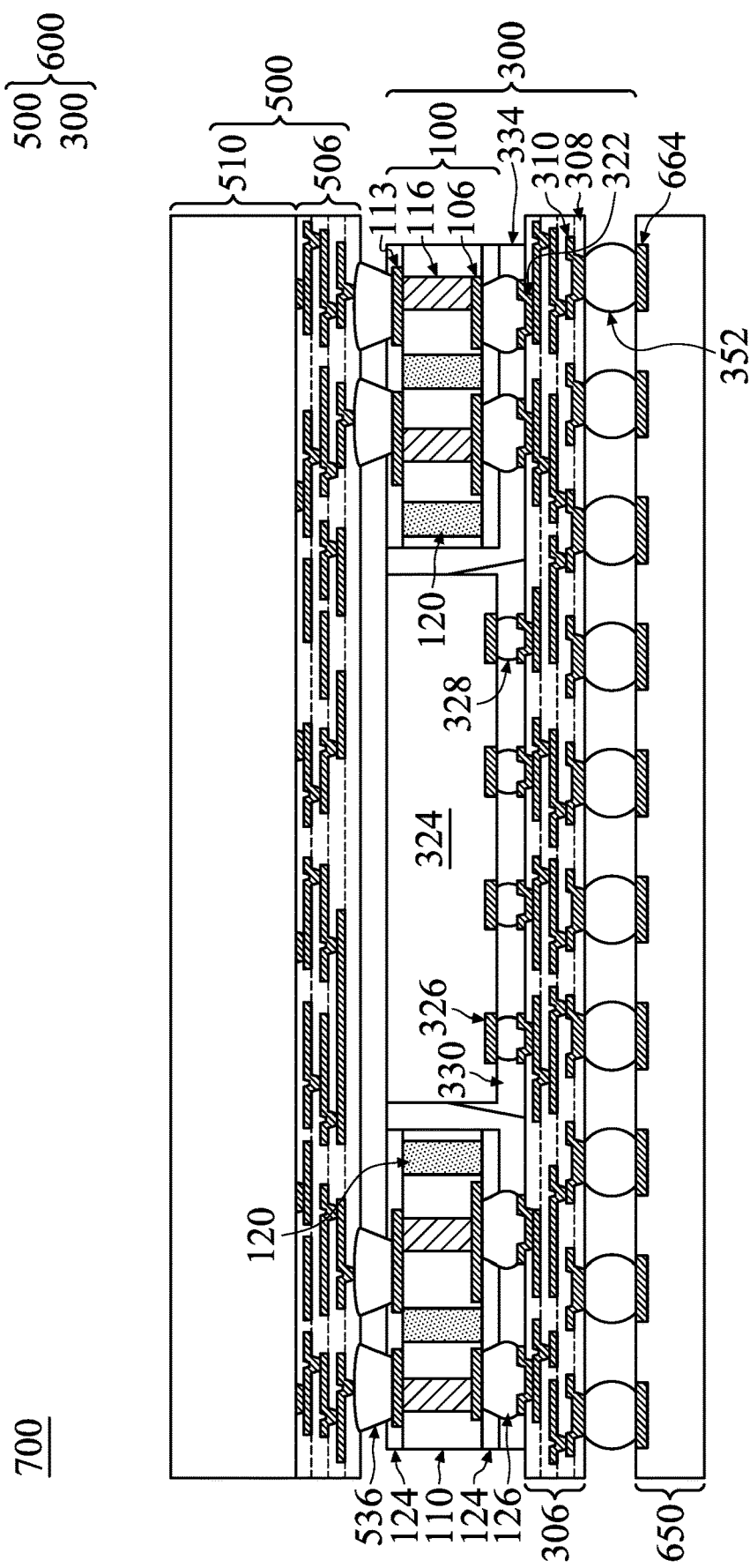

In FIG. 69, the carrier substrate 302 is removed, such as discussed above with respect to FIG. 41. Conductive connectors 352 are formed over the redistribution structure 306, such as discussed above with respect to FIG. 42. A device 500 may be mounted to interposer substrate 100, such as discussed above with respect to FIG. 43 to form package 600. Package 600 may be mounted to a package substrate 650, such as discussed above with respect to FIG. 44 to form package 700.

Figure 70:
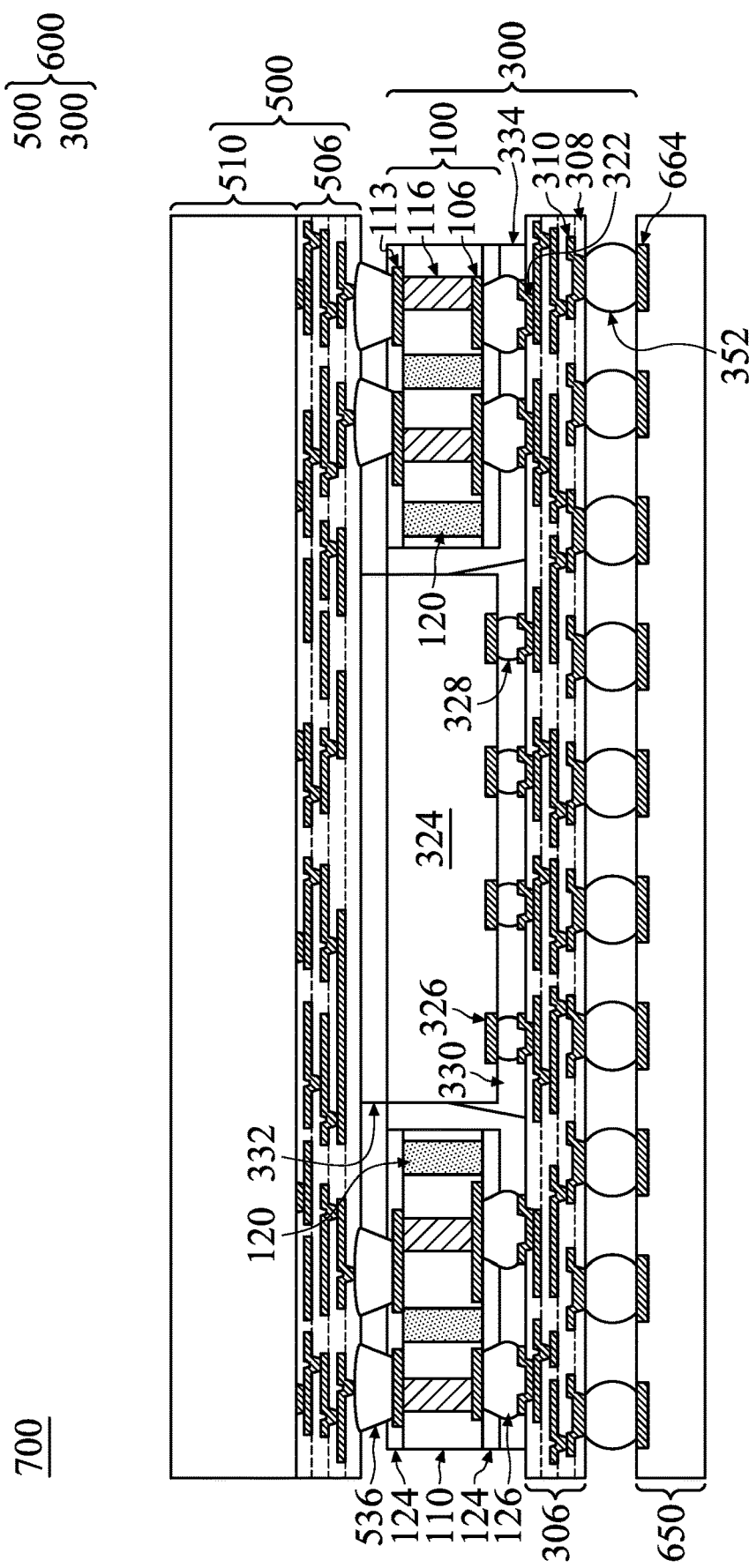

In FIG. 70, prior to joining the interposer substrate 100 to the conductive pillars 322p, an adhesive layer 332 may be disposed on the device 500 and/or the integrated circuit dies 324. The adhesive layer 332 may be similar to the adhesive layer 332 of FIG. 47. The adhesive layer 332 can help provide better stability and reduce warpage due to CTE mismatch. The adhesive layer 332 can also be a thermal compound to help dissipate heat from the integrated circuit dies 324. The interposer substrate 100 is aligned to the conductive pillars 322p or UBMs 322 in the first region 306A. The interposer substrate 100 may be aligned and placed using, e.g., a pick-and-place tool. The interposer substrate 100 is placed on the redistribution structure 306 such that the conductive connectors 126 are aligned with the conductive pillars 322p or UBMs 322 in the first region 306A.

Figure 71:
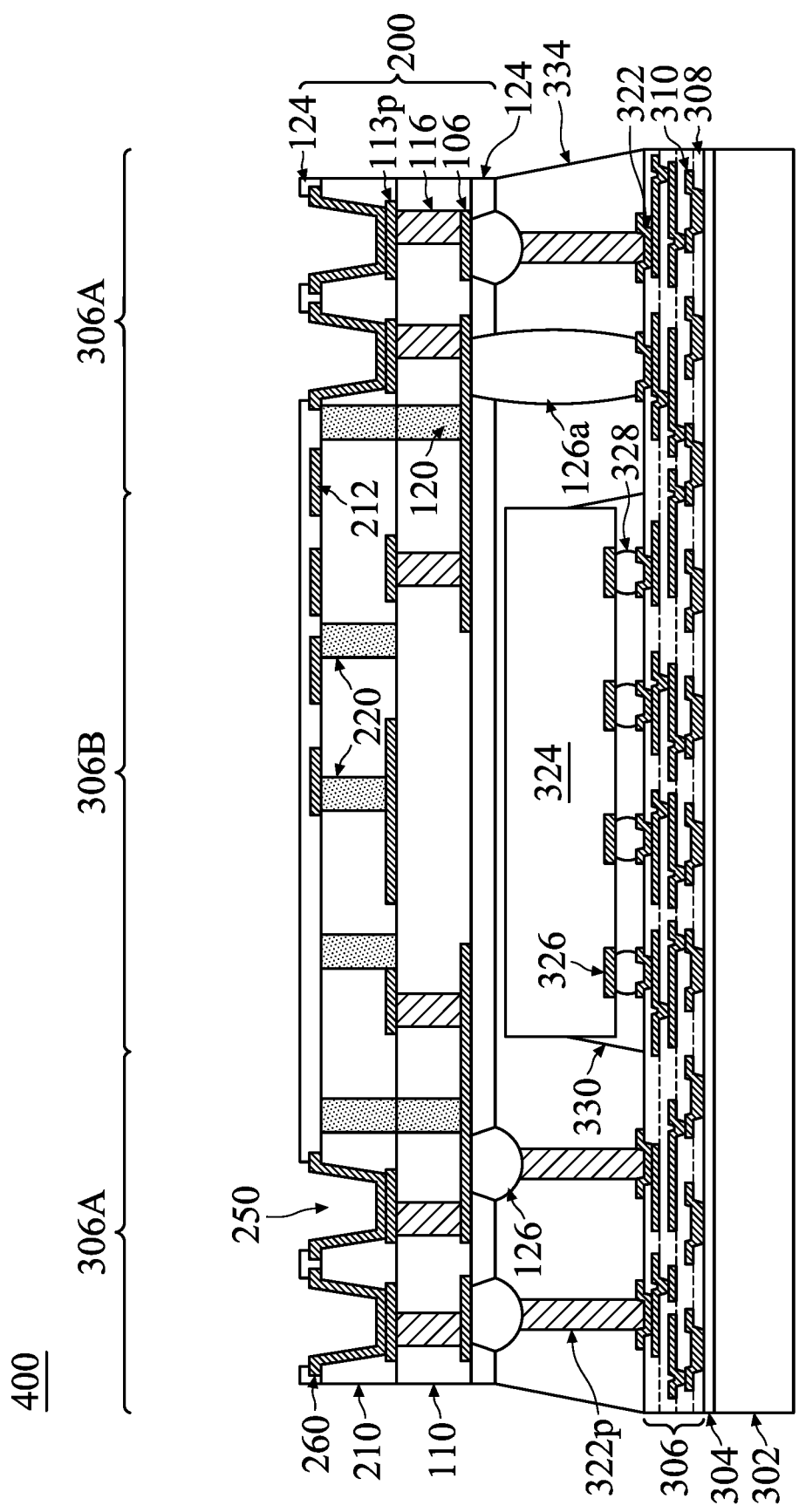
FIGS. 71 through 79 illustrate various intermediate steps in a process of forming a package structure including a fan-out bottom package and an interposer having an upper core layer which has a recessed bond pad formed therein, in accordance with some embodiments.

FIGS. 71 through 79 illustrate various embodiments similar to those discussed above with respect to FIGS. 44 through 70, except that interposer substrate 200 is used. As discussed above, interposer substrate 200 has at least two core substrate layers with recessed bond pads formed therein, e.g., substrate core 110 and substrate core 210 as illustrated in FIG. 71. FIG. 71 also illustrates that interposer substrate 200 has recesses 250 formed through the top substrate core 210, the recesses 250 exposing an underlying recessed bond pad 113p. Interposer substrate 200 is also illustrated as having a metal liner 260 lining the recesses 250, such as discussed above with respect to FIG. 21. It should be understood that the metal liner 260 is optional, even though it is depicted in the Figures discussed below. Reinforcing structures 120 and reinforcing structures 220 are illustrated, for example in FIG. 71 as being formed in the interposer substrate 200. As discussed above with respect to FIGS. 17 through 25, any of reinforcing structures 120, 122, and/or 220 may optionally be omitted. It should be understood that although reinforcing structures 120 and 220 are illustrated for context, embodiments are included which do not include reinforcing structures 120, 122, and/or 220.

Recesses 250 in interposer substrate 200 reduce overall package height when an additional device or package is bonded to the recessed bond pads 113p. The deep recesses also provides for good alignment for bonding an additional device or package. The interposer substrate 200, even without the optional reinforcing structures 120, 122, or 220, still provides some structural support and helps to reduce warpage.

In FIG. 71, interposer substrate 200 aligned to the conductive pillars 322p, in accordance with some embodiments. The interposer substrate 200 may be aligned and placed using, e.g., a pick-and-place tool. The interposer substrate 200 is placed on the redistribution structure 306 such that the conductive connectors 126 are aligned with the conductive pillars 322p in the first region 306A.

After the interposer substrate 200 is placed, the conductive connectors 126 are reflowed to form joints between corresponding conductive pillars 322p and/or UBMs 322 and conductive lines 106, physically and electrically connecting the interposer substrate 200 to the first redistribution structure 306. In some embodiments, the conductive connectors 126 may extend, as illustrated in FIG. 71 with conductive connector 126a, from the interposer substrate 200 to the UBM 322. An encapsulant 334 may be formed, such as discussed above with respect to FIG. 38.

Figure 72:
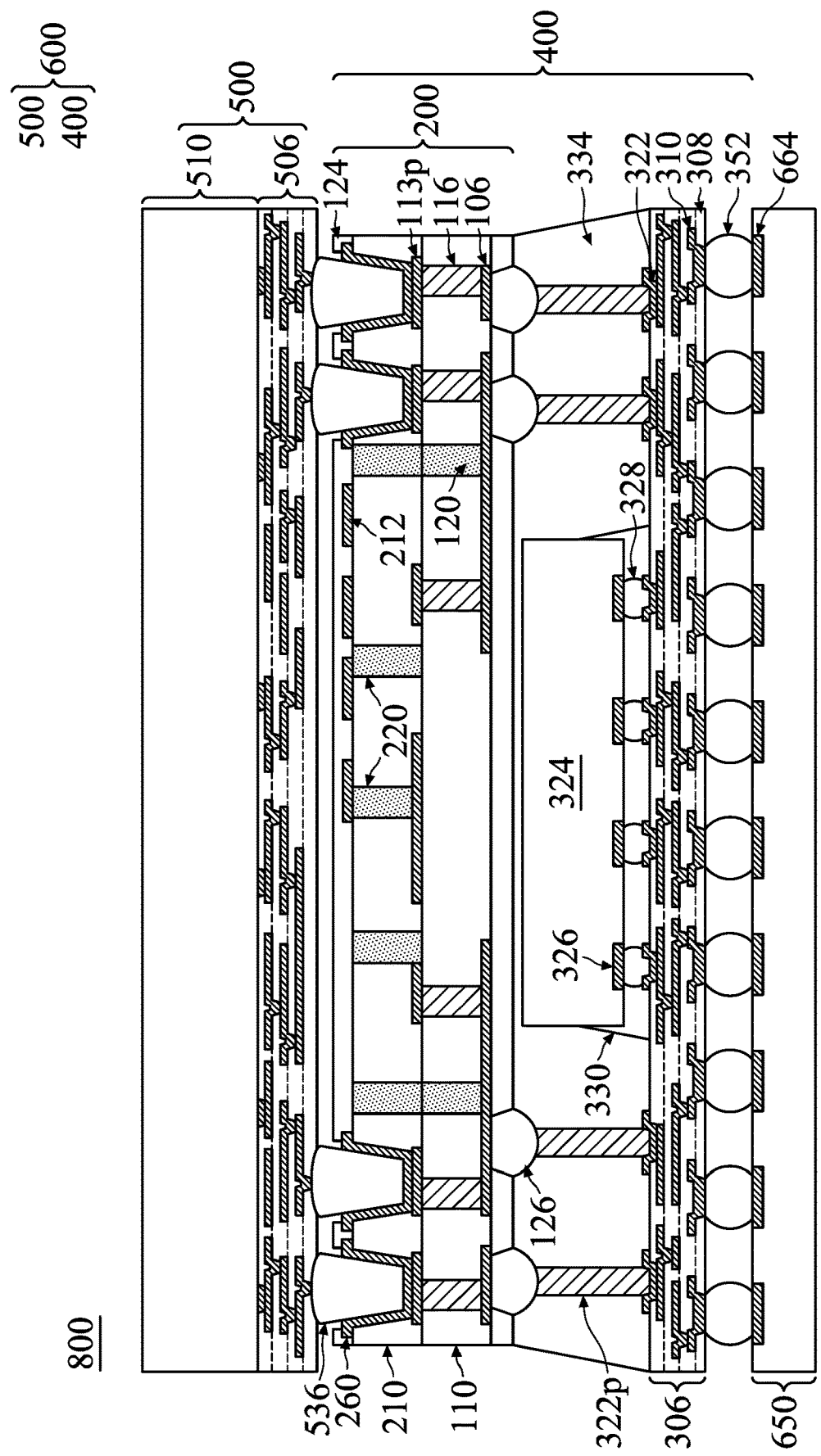

In FIG. 72, the carrier substrate 302 is removed, such as discussed above with respect to FIG. 41. Conductive connectors 352 are formed over the redistribution structure 306, such as discussed above with respect to FIG. 42. A device 500 may be mounted to interposer substrate 200, such as discussed above with respect to FIG. 43 to form package 600. Package 600 may be mounted to a package substrate 650, such as discussed above with respect to FIG. 44 to form package 800.

Figure 73:
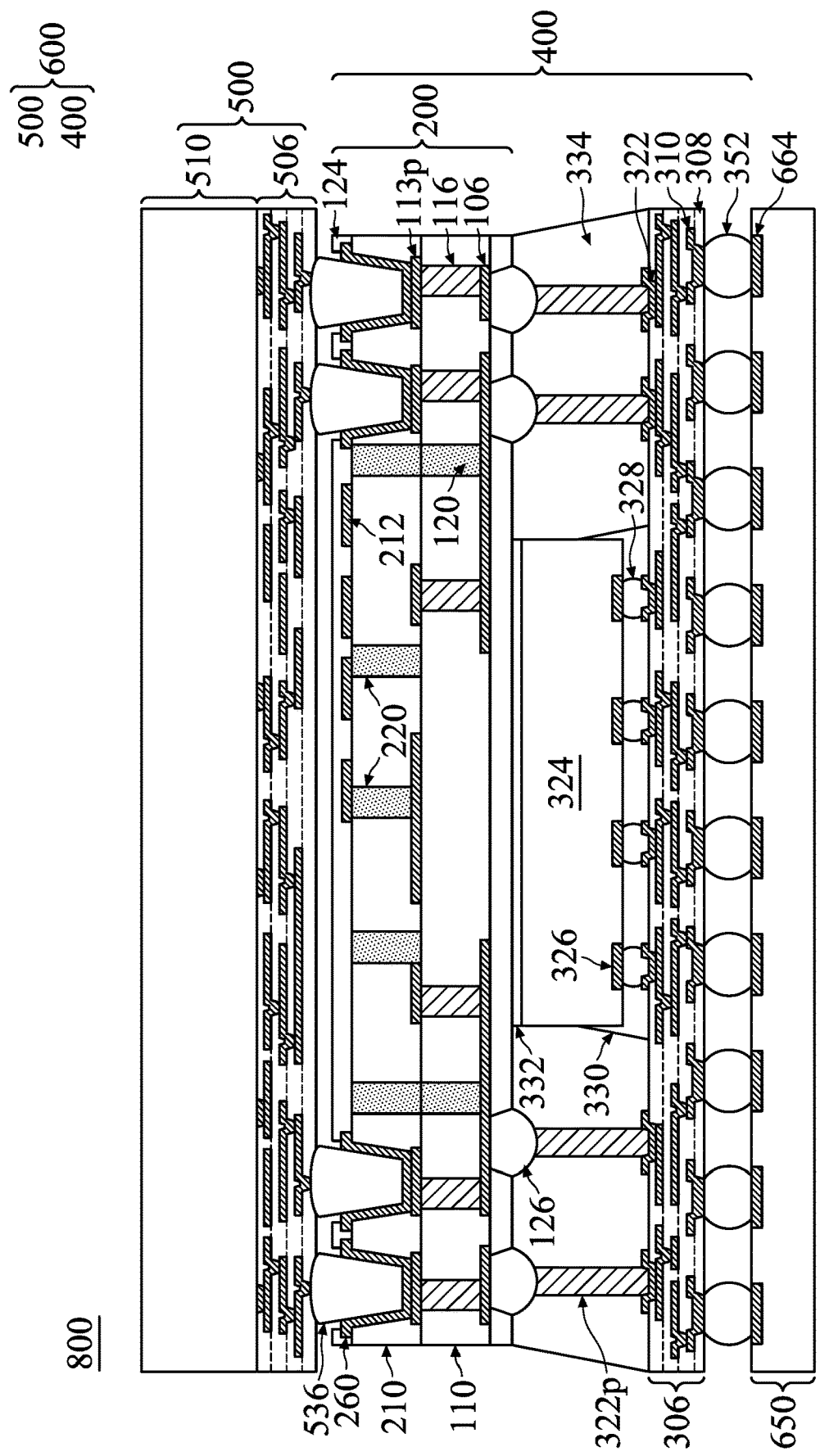

In FIG. 73, prior to joining the interposer substrate 200 to the conductive pillars 322p, an adhesive layer 332 may be disposed on the device 500 and/or the integrated circuit dies 324. The adhesive layer 332 may be similar to the adhesive layer 332 of FIG. 47.

Figure 74:
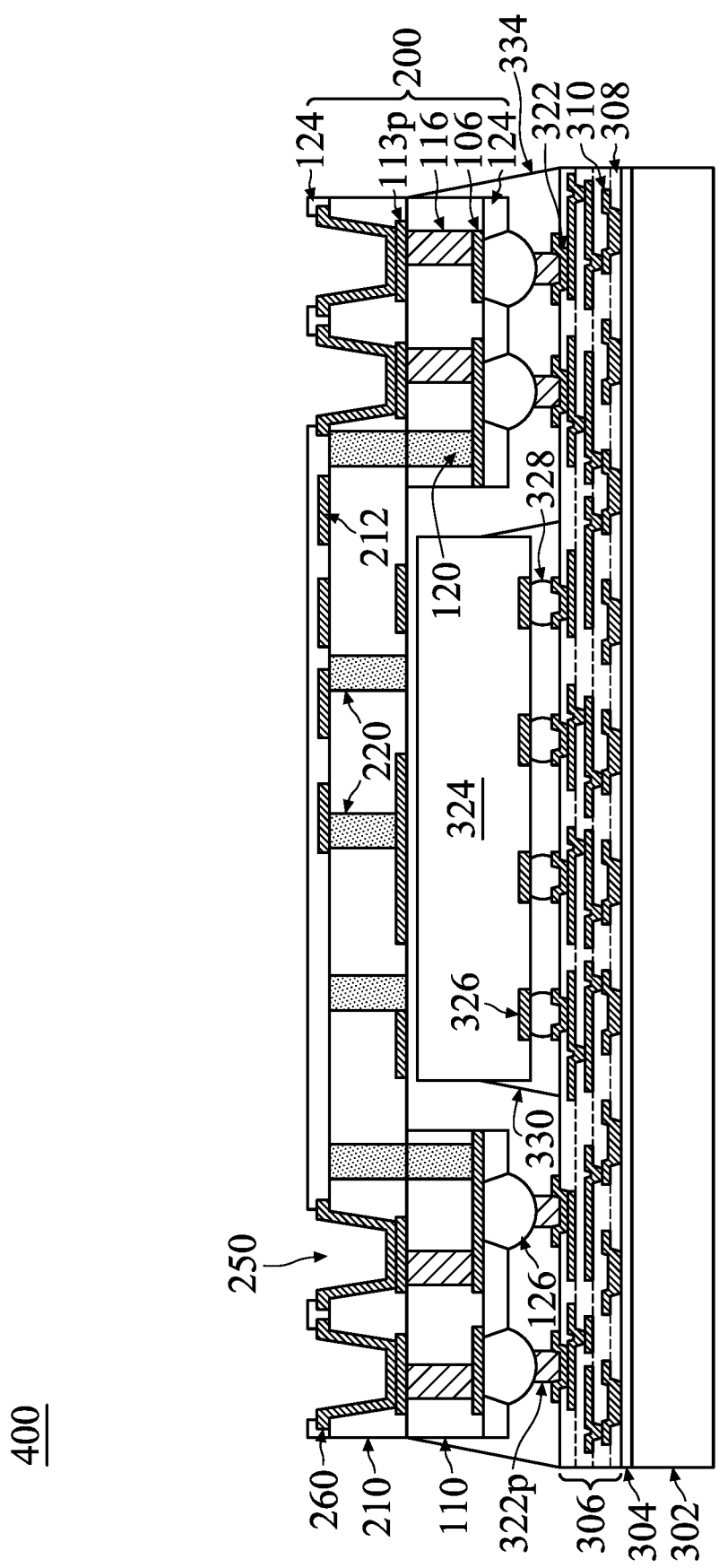

In FIG. 74, interposer substrate 200 is provided which has a cavity 230 formed therein (see FIGS. 27 through 29). Cavity 230 may be formed such that it is aligned with integrated circuit dies 324 so that the integrated circuit dies 324 are at least partially disposed within the cavity 230 once the interposer substrate 200 is mounted to the conductive pillars 322p. This can help reduce the overall height of the completed package. The height of cavity 230 can vary as discussed above with respect to FIGS. 22 through 24 and FIGS. 27 through 29. The reinforcing structures 120 and/or reinforcing structures 122 and/or reinforcing structures 220 can also provide support and heat dissipation of the integrated circuit dies 324.

The interposer substrate 200 is aligned to the conductive pillars 322p, in accordance with some embodiments. The interposer substrate 200 may be aligned and placed using, e.g., a pick-and-place tool. The interposer substrate 200 is placed on the redistribution structure 306 such that the conductive connectors 126 are aligned with the conductive pillars 322p in the first region 306A.

After the interposer substrate 200 is placed, the conductive connectors 126 are reflowed to form joints between corresponding conductive pillars 322p and conductive lines 106, physically and electrically connecting the interposer substrate 200 to the first redistribution structure 306. An encapsulant 334 may be formed, such as discussed above with respect to FIG. 38. In some embodiments, the encapsulant 334 may flow to a space between the integrated circuit dies 324 and interposer substrate 200 such that the encapsulant 334 is disposed between the top surfaces of the integrated circuit dies 324 and the bottom of the substrate core 110 of the interposer substrate 200 in the cavity 230.

In some embodiments, following joining the interposer substrate 200 to the conductive pillars 322p, the integrated circuit dies 324 may be disposed at least partially in the cavity 230.

Figure 75:
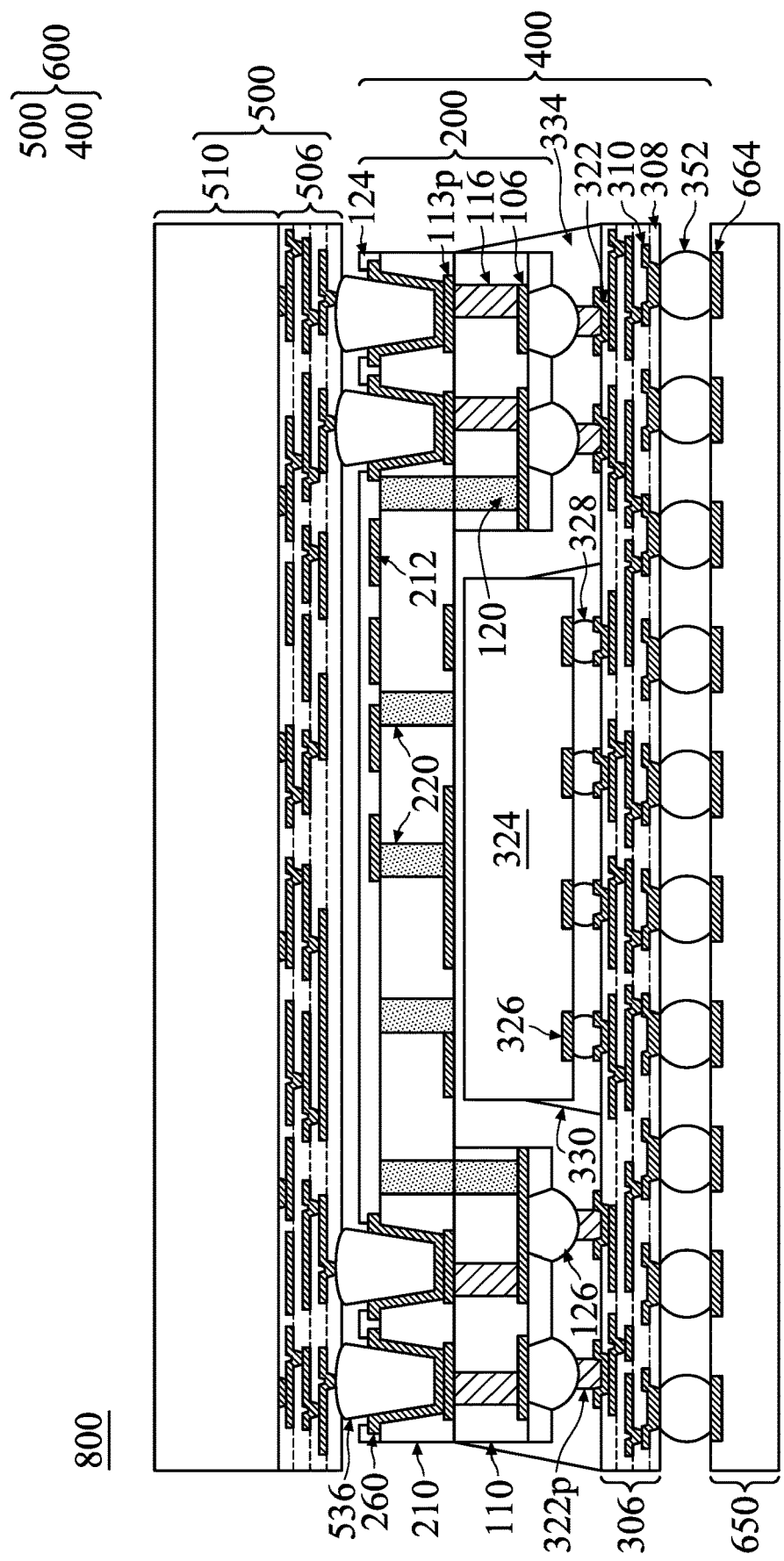

In FIG. 75, the carrier substrate 302 is removed, such as discussed above with respect to FIG. 41. Conductive connectors 352 are formed over the redistribution structure 306, such as discussed above with respect to FIG. 42. A device 500 may be mounted to interposer substrate 200, such as discussed above with respect to FIG. 43 to form package 600. Because the interposer substrate 200 has recessed bond pads 113p, the device 500 is securely attached using larger conductive connectors 536 than if the bond pads were not recessed. The recessed bond pads 113p can also help reduce the overall package height. Package 600 may be mounted to a package substrate 650, such as discussed above with respect to FIG. 44.

Figure 76:
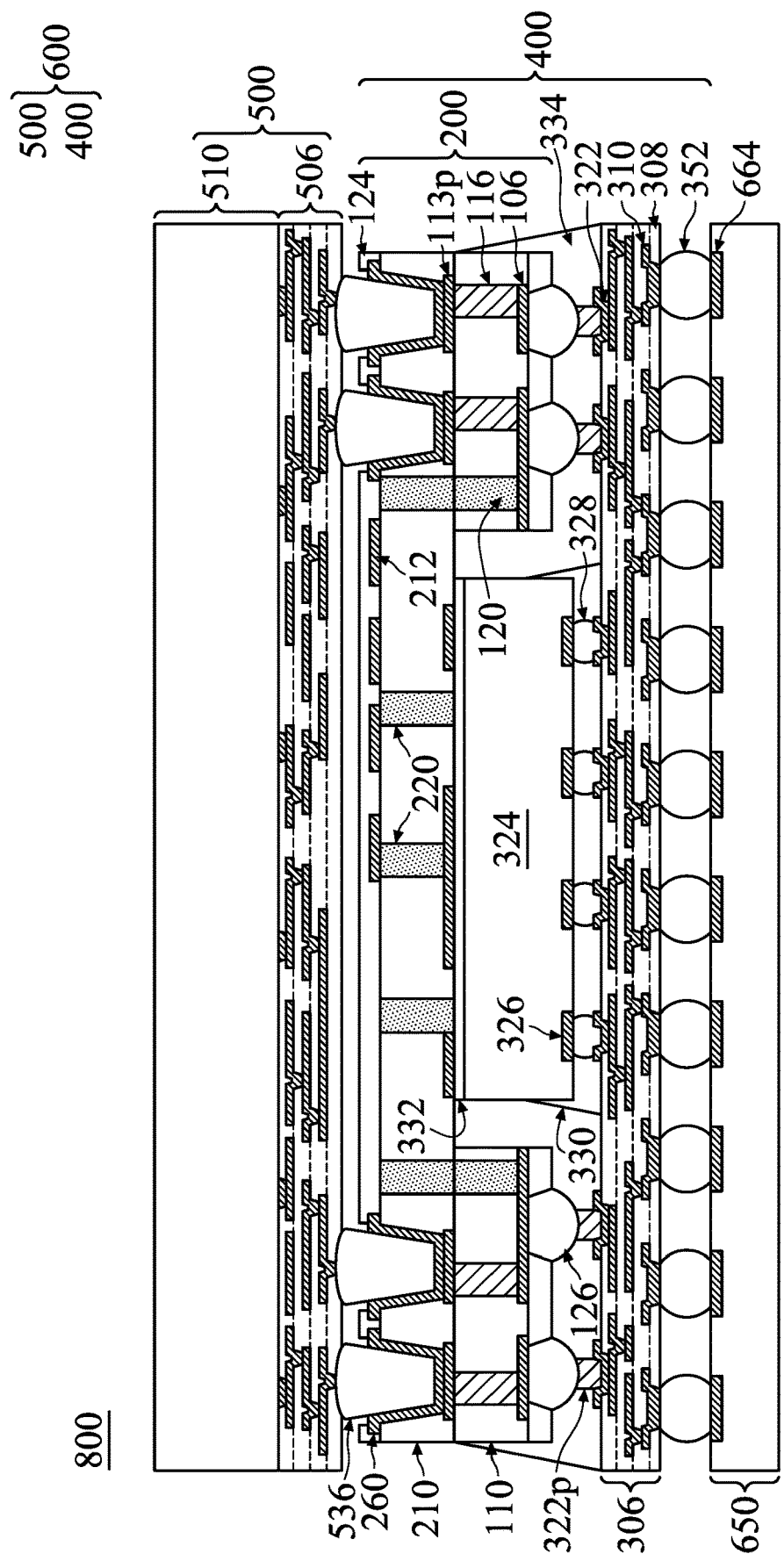

In FIG. 76, prior to joining the interposer substrate 200 to the conductive pillars 322p, an adhesive layer 332 may be disposed on the device 500 and/or the integrated circuit dies 324. The adhesive layer 332 may be similar to the adhesive layer 332 of FIG. 47.

Figure 77:
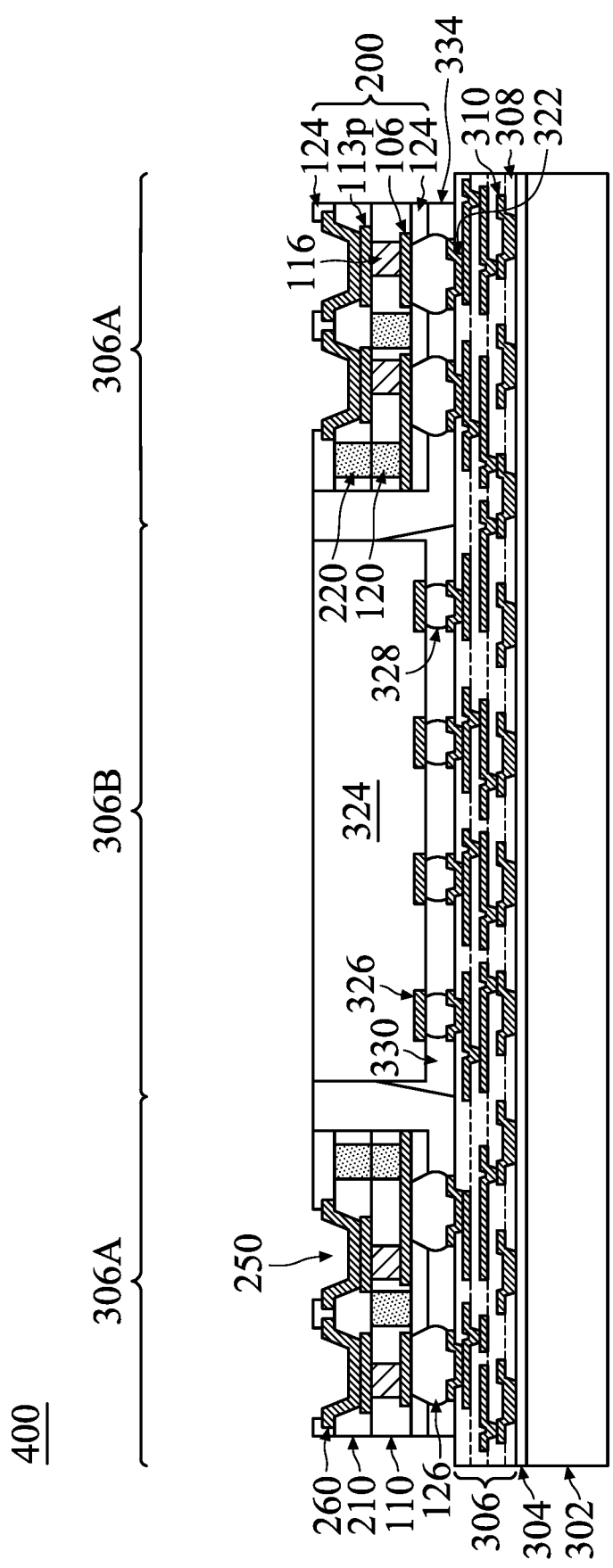

In FIG. 77, interposer substrate 200 is provided which has a through hole 240 formed therein (see, e.g., FIG. 25 or 30). Through hole 240 may be formed such that it is aligned with integrated circuit dies 324 so that the integrated circuit dies 324 are at least partially disposed within the through hole 240 once the interposer substrate 200 is mounted to the conductive pillars 322p and/or UBMs 322. This can help reduce the overall height of the completed package. In some embodiments, the integrated circuit dies 324 may be mounted in the through hole 240 such that the top surface of the integrated circuit dies 324 is level with or below the level of the top surface of the interposer substrate 200. The reinforcing structures 120 and/or reinforcing structures 122 and/or reinforcing structures 220 may be disposed in the periphery portion of the interposer substrate 200 and can provide support and heat dissipation of the integrated circuit dies 324.

The interposer substrate 200 is aligned to the conductive pillars 322p and/or UBMs 322, in accordance with some embodiments. The interposer substrate 200 may be aligned and placed using, e.g., a pick-and-place tool. The interposer substrate 200 is placed on the redistribution structure 306 such that the conductive connectors 126 are aligned with the conductive pillars 322p and/or UBMs 322 in the first region 306A.

After the interposer substrate 200 is placed, the conductive connectors 126 are reflowed to form joints between corresponding conductive pillars 322p and/or UBMs 322 and conductive lines 106, physically and electrically connecting the interposer substrate 200 to the first redistribution structure 306. An encapsulant 334 may be formed, such as discussed above with respect to FIG. 38. In some embodiments, the encapsulant 334 may flow around and over the integrated circuit dies 324 such as described above with respect to FIG. 68.

In some embodiments, following joining the interposer substrate 200 to the conductive pillars 322p and/or UBMs 322, the integrated circuit dies 324 may be disposed at least partially in the through hole 240.

Figure 78:
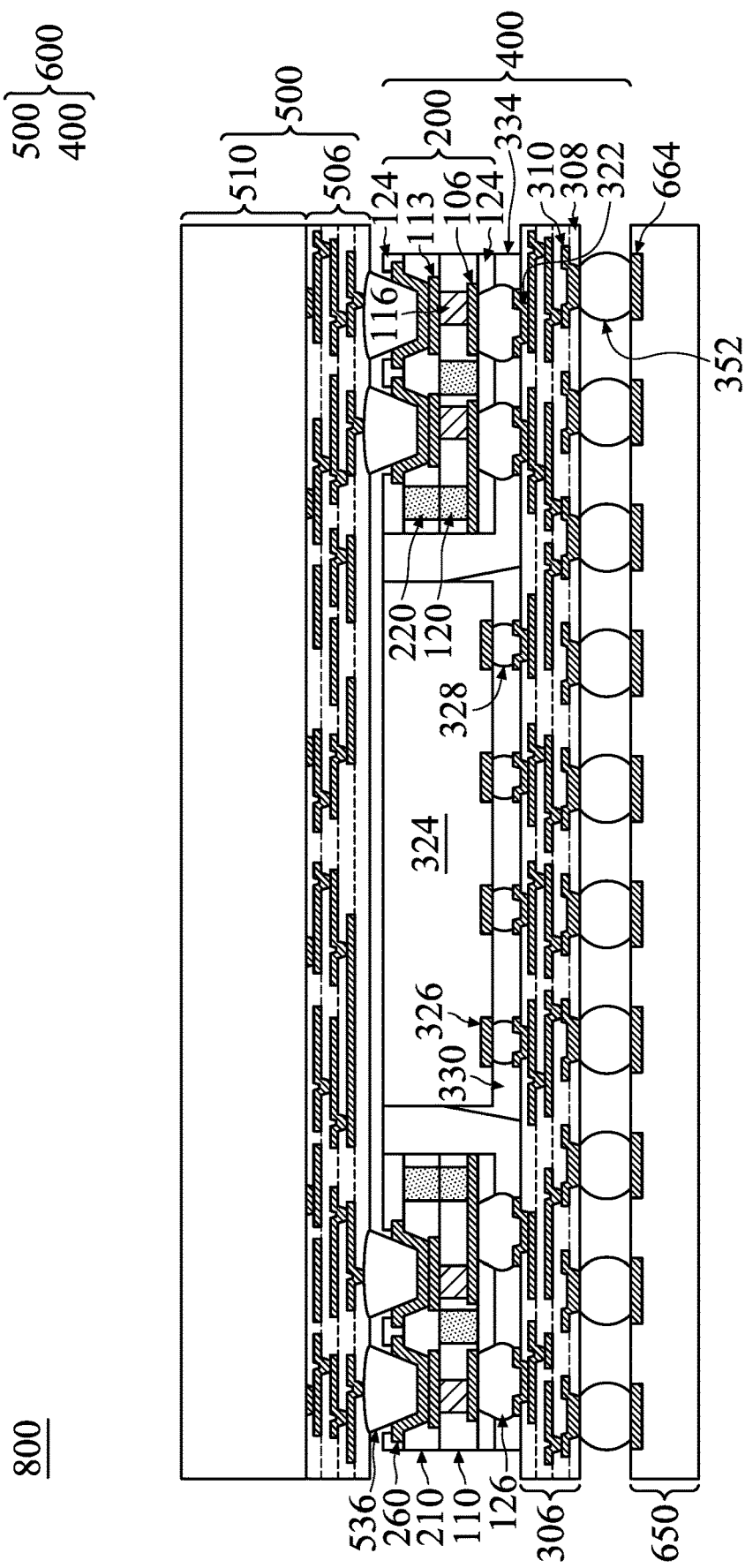

In FIG. 78, the carrier substrate 302 is removed, such as discussed above with respect to FIG. 41. Conductive connectors 352 are formed over the redistribution structure 306, such as discussed above with respect to FIG. 42. A device 500 may be mounted to interposer substrate 200, such as discussed above with respect to FIG. 43 to form package 600. Because the interposer substrate 200 has recessed bond pads 113p, the device 500 is securely attached using larger conductive connectors 536 than if the bond pads were not recessed. The recessed bond pads can also help reduce the overall package height. Package 600 may be mounted to a package substrate 650, such as discussed above with respect to FIG. 44.

Figure 79:
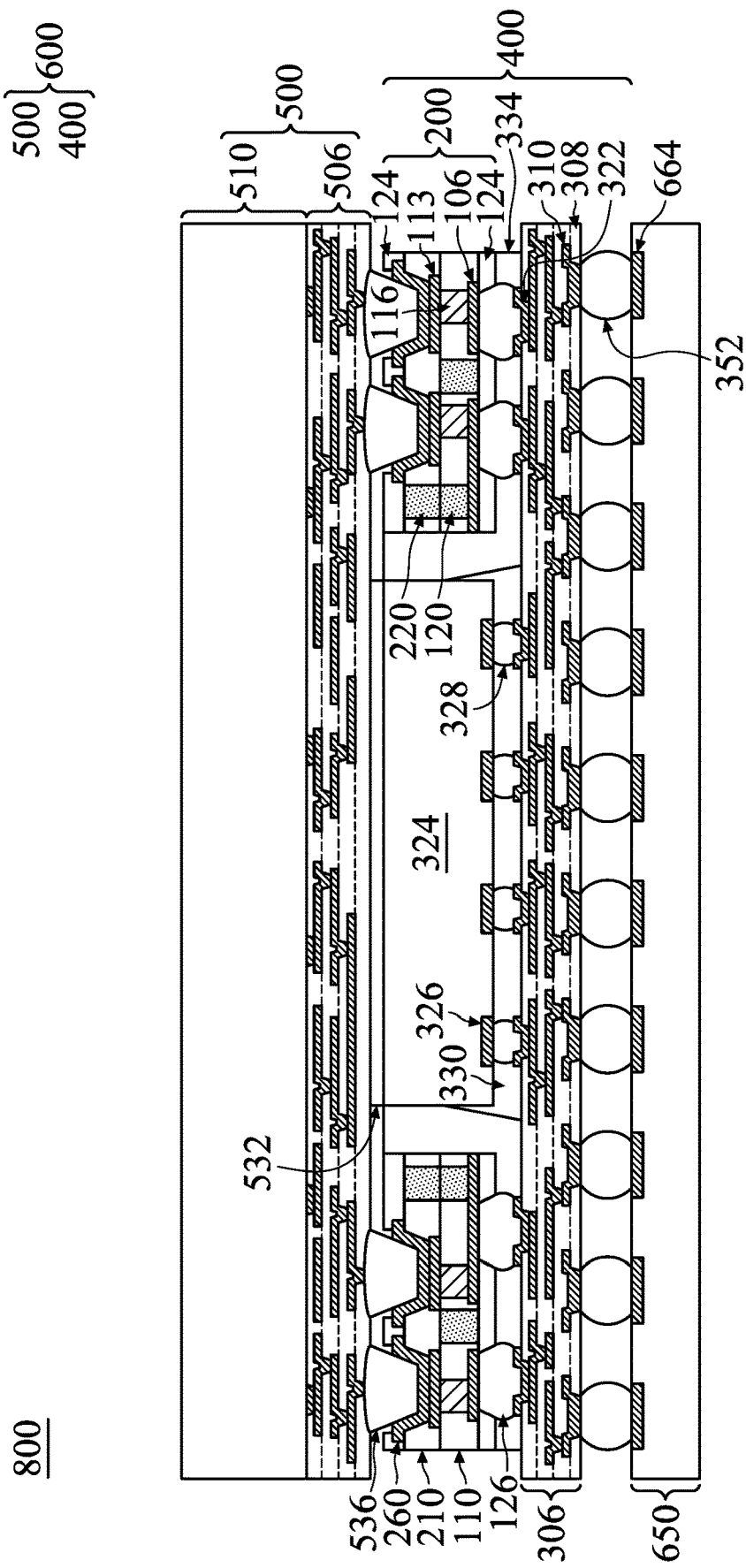

In FIG. 79, prior to joining the interposer substrate 200 to the conductive pillars 322p and/or UBMs 322, an adhesive layer 532 may be disposed on the device 500 and/or the integrated circuit dies 324. The adhesive layer 532 may be similar to the adhesive layer 332 of FIG. 47.

Embodiments provide an interposer bonded to a package device where the interposer includes reinforcing structures 120, irregular reinforcing structures 122, reinforcing structures 220, or combinations thereof. The reinforcing structures provide rigidity, thermal dissipation, help reduce stress, and warpage of the package. An adhesive layer may be used between the interposer and an integrated circuit die to improve adhesion and/or thermal dissipation. In some embodiments, a molding compound may be formed before bonding the interposer to the package device, while in other embodiments a molding compound may be formed after bonding the interposer to the package device.

In some embodiments a cavity or through hole may be formed in the interposer to help reduce the overall height of the package by having the cavity or through hole aligned to an integrated circuit die of the packaged device so that the integrated circuit die is at least partially disposed in the cavity or through hole. Where a cavity is used, an adhesive layer may be used between the interposer and the integrated circuit die. Where a through hole is used, an adhesive layer may be used between the integrated circuit die and an overlying device which is bonded to a top of the interposer.

In some embodiments, the interposer may have at least a second core substrate layer so that a recess bond pad can be formed between two core substrate layers. The recessed bond pad provides a strong interface point for mounting a device on top of the interposer. The recessed bond pad also helps to reduce the overall height of the completed package. An optional adhesive layer may be used between the interposer and the device mounted on top of the interposer. In some embodiments the recessed bond pad may also include a metal liner which lines the opening in the interposer to the recess bond pad. In embodiments having at least a second core layer, the reinforcing structures may be omitted from the interposer.

Each of these embodiments may include a coupling technique for coupling the interposer to the package device that uses a stepped bond pad which embeds a metal pillar in the solder material from the interposer. In some embodiments, the coupling technique using the stepped bond pad may be used to mount a device to the package device directly, without the use of an interposer.

The embodiments provide various ways to increase rigidity and strength of a completed package utilizing a bottom fan-out device package and interposer, including, for example, reinforcing structures, recess bond pads, and stepped bond pads. Some embodiments also use techniques to reduce the overall height of the package to advantageously help save space and provide for more efficient heat dissipation through thinner components.

While efforts have been made to describe the variations on the embodiments, it should be understood that the techniques described in the embodiments discussed herein may be combined to produce variations on these embodiments which combine aspects from one embodiment with aspects from one or more other embodiments. Such combinations should not be considered overly burdensome nor require undue experimentation, and should be regarded as being within the scope of this disclosure.

One embodiment is a method including forming an opening in a core layer of an interposer. A reinforcing structure is formed in the opening, the reinforcing structure extending from a first surface of the interposer to a second surface of the interposer, where the reinforcing structure is electrically isolated from conductive features of the interposer. First connectors are formed on the interposer at the first surface of the interposer. The first connectors of the interposer are bonded to second connectors of a first package device. A molding compound is formed between the interposer and the first package device.

Another embodiment is a method including aligning first connectors of a first package element to second connectors of a second package element, the first connectors including solder materials, each of the second connectors including a metal pillar protruding from a metal step. The first connectors are contacted to the second connectors and the solder materials are reflowed, where the solder materials flow to surround each of the metal pillars and contact each of the metal steps. The portion of the solder materials which surrounds the metal pillars is within the lateral extents of the metal step.

Another embodiment is a structure including a first device package, the first device package including an integrated circuit die having an active side, the active side facing downward. The first device package also includes a redistribution structure coupled to one or more contacts of the integrated circuit die and first contacts disposed at an upper surface of the redistribution structure. The structure also includes an interposer, the interposer including a substrate core layer with one or more metal vias disposed in the substrate core layer and one or more reinforcing structures disposed in the substrate core layer. The one or more reinforcing structures are electrically decoupled. Second contacts are disposed at a lower surface of the interposer, with the first contacts coupled to respective ones of the second contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming an opening in a core layer of an interposer;

forming a reinforcing structure in the opening, the reinforcing structure extending from a first surface of the interposer to a second surface of the interposer, the reinforcing structure electrically floating;
forming first connectors on the interposer at the first surface of the interposer;
bonding the first connectors of the interposer to second connectors of a first package device, wherein the second connectors include a metal pillar extending vertically from a contact, wherein the bonding the first connectors of the interposer to second connectors of the first package device comprises:
aligning the first connectors to the second connectors, and
reflowing a eutectic material to couple the first connectors to the second connectors; and
forming a molding compound between the interposer and the first package device.

2. The method of claim 1, further comprising:
forming an adhesive layer between an integrated circuit die of the first package device and the interposer, the adhesive layer contacting both the integrated circuit die and the interposer.

3. The method of claim 1, further comprising:
forming a cavity in the core layer of the interposer, wherein after bonding the first connectors to the second connectors, an integrated circuit die is at least partially disposed within the cavity.

4. The method of claim 3, wherein the cavity extends completely through the core layer to form a through hole.

5. The method of claim 1, wherein the core layer of the interposer is a first core layer, the method further comprising:
forming a second core layer of the interposer; and
forming a second opening in the second core layer of the interposer, the second opening exposing a recess bond pad disposed between the first core layer and the second core layer.

6. The method of claim 5, further comprising:
forming a metal film in the second opening, the metal film lining sidewalls and a bottom of the second opening.

7. The method of claim 1, wherein the eutectic material laterally encapsulates a first vertical portion of the second connectors and contacts a second horizontal portion of the second connectors, the first vertical portion comprising a metal pillar, the second horizontal portion comprising a step from which the metal pillar protrudes.

8. The method of claim 7, wherein the eutectic material is within lateral extents of the second horizontal portion.

9. A method comprising:
providing a first device package, the first device package comprising:
an integrated circuit die having an active side, the active side facing downward,
a redistribution structure coupled to one or more contacts of the integrated circuit die, and
first contacts disposed at an upper surface of the redistribution structure;
aligning an interposer to the first device package, the interposer comprising:
a substrate core layer,
one or more metal vias disposed in the substrate core layer,
one or more reinforcing structures disposed in the substrate core layer and distinct from the substrate core layer, the one or more reinforcing structures extending from an upper surface of the substrate core layer to a bottom surface of the substrate core layer, the one or more reinforcing structures being electrically floating and having a material composition different from the one or more metal vias, and
second contacts disposed at a lower surface of the interposer; and
bonding the interposer to the first device package, the bonding coupling the first contacts to respective ones of the second contacts.

10. The method of claim 9, wherein bonding the interposer comprises reflowing a solder material around a metal pillar disposed in top of a metal shoulder on each of the second contacts, the solder material encapsulating the metal pillar, a lateral extent of the solder material being within a lateral extent of the metal shoulder.

11. The method of claim 9, wherein the one or more reinforcing structures comprises a metal, a ceramic, a polymer, a graphite containing material, or a silicon containing material.

12. The method of claim 9, wherein the interposer further comprises:
a metallization formed on the substrate core layer, the metallization comprising bond pads;
a second substrate core layer formed over the metallization; and
third contacts formed through the second substrate core layer and coupled to the bond pads.

13. The method of claim 12, wherein the interposer further comprises a metal liner layer surrounding a side and bottom of each of the third contacts, the metal liner layer being interposed between the third contacts and the bond pads.

14. A method comprising:
preparing an interposer, comprising:
forming contact pads at an upper surface of a first core substrate layer,
bonding a second core substrate layer to the first core substrate layer, and
forming first openings through the second core substrate layer to expose the contact pads;
bonding the interposer to a first package by connectors on an underside of the interposer; and
bonding a second package to the interposer by bond connectors extending from the second package through the first openings to electrically contact the contact pads.

15. The method of claim 14, further comprising:
forming a conformal metal liner layer in the first openings, on sidewalls and bottoms of the first openings, the bond connectors contacting the metal liner layer.

16. The method of claim 14, further comprising:
forming third openings in the second core substrate layer; and
forming reinforcing structures in the third openings, the reinforcing structures electrically floating.

17. The method of claim 16, wherein the reinforcing structures comprise a non-conductive material.

18. The method of claim 14, wherein the first core substrate layer has a second opening formed therein, the second opening aligned to a die attached to the first package, wherein the die is at least partially disposed in the second opening after bonding the interposer to the first package.

19. The method of claim 18, wherein the second opening extends completely through the first core substrate layer.

20. The method of claim 18, further comprising:
disposing a thermal adhesive material over the die, the thermal adhesive material interposed between the die and the interposer, the thermal adhesive material contacting both the die and the interposer.

* * * * *